US008472195B2

(12) United States Patent
Nakanishi et al.

(10) Patent No.: US 8,472,195 B2
(45) Date of Patent: Jun. 25, 2013

(54) ELECTRONIC DEVICE

(75) Inventors: Teru Nakanishi, Kawasaki (JP);
Nobuyuki Hayashi, Kawasaki (JP);
Masaru Morita, Kawasaki (JP);
Katsusada Motoyoshi, Kawasaki (JP);
Yasuhiro Yoneda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 227 days.

(21) Appl. No.: 13/103,296

(22) Filed: May 9, 2011

(65) Prior Publication Data

US 2012/0014068 A1    Jan. 19, 2012

(30) Foreign Application Priority Data

Jul. 15, 2010   (JP) ................. 2010-160218
Oct. 13, 2010   (JP) ................. 2010-230143
Feb. 21, 2011   (JP) ................. 2011-035116

(51) Int. Cl.
*H05K 7/20*     (2006.01)
*H01L 23/40*    (2006.01)

(52) U.S. Cl.
USPC ............... 361/717; 361/679.46; 361/679.54; 361/704; 361/719; 165/80.3; 165/104.33; 165/185; 257/706; 257/707; 257/712; 174/16.3; 174/252

(58) Field of Classification Search
USPC ....... 361/679.46–679.54, 690–697, 702–720; 165/80.2, 80.3, 80.4, 104.33, 104.34, 185; 257/706–727; 174/15.1, 16.3, 252
See application file for complete search history.

(56) References Cited

U.S. PATENT DOCUMENTS

| 5,285,351 | A | 2/1994 | Ikeda | |
|---|---|---|---|---|
| 5,436,501 | A | 7/1995 | Ikeda | |
| 6,753,093 | B2 * | 6/2004 | Tanaka et al. | 428/615 |
| 7,482,688 | B2 * | 1/2009 | Glowinke | 257/713 |
| 7,679,647 | B2 * | 3/2010 | Stavely et al. | 348/208.99 |
| 7,790,511 | B2 * | 9/2010 | Chainer | 438/122 |
| 2008/0273308 | A1 * | 11/2008 | Kells et al. | 361/704 |
| 2012/0120608 | A1 * | 5/2012 | Guan | 361/704 |

FOREIGN PATENT DOCUMENTS

| JP | 361241950 A | * | 10/1986 |
|---|---|---|---|
| JP | 404094154 A | * | 3/1992 |
| JP | 5-67712 | | 3/1993 |
| JP | 9-283675 | | 10/1997 |
| JP | 10-70383 | | 3/1998 |
| JP | 02009117647 A | * | 5/2009 |
| JP | 2005245582 A | * | 4/2010 |

* cited by examiner

*Primary Examiner* — Michail V Datskovskiy
(74) *Attorney, Agent, or Firm* — Kratz, Quintos & Hanson, LLP

(57) ABSTRACT

An electronic device includes an electronic component mounted on a substrate; a cooling system for cooling the electronic component; and a fastening structure for fastening the cooling system to the substrate. The fastening structure includes a first magnet provided to one of the substrate and the cooling system, a second magnetic material fixed to the other of the substrate and the cooling system and magnetically coupled with the first magnet, and a magnetic shield that covers a part or all of the first magnet except for a coupling face to be coupled with the second magnetic material.

18 Claims, 43 Drawing Sheets

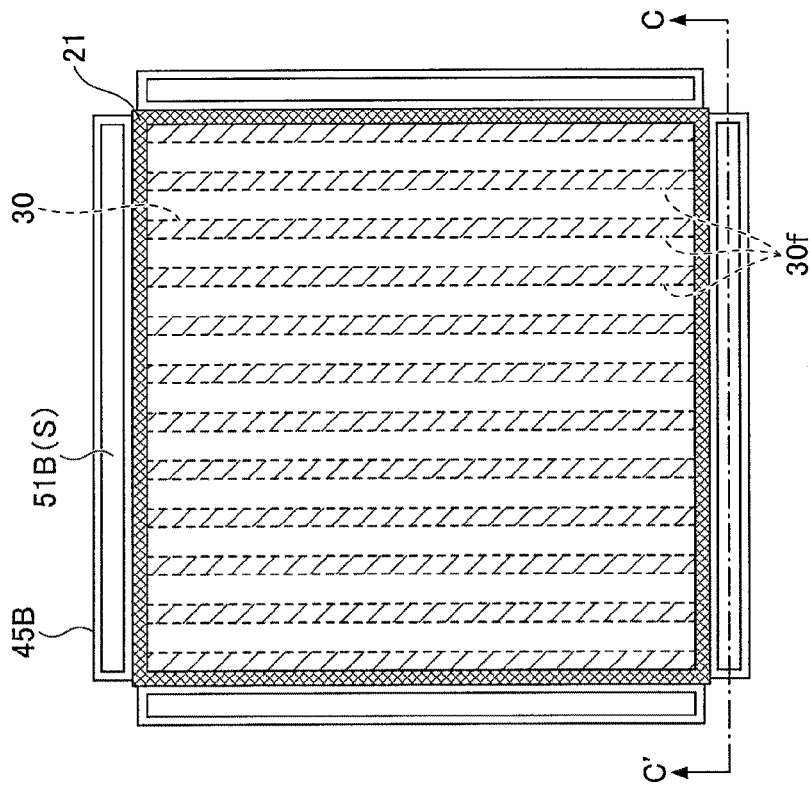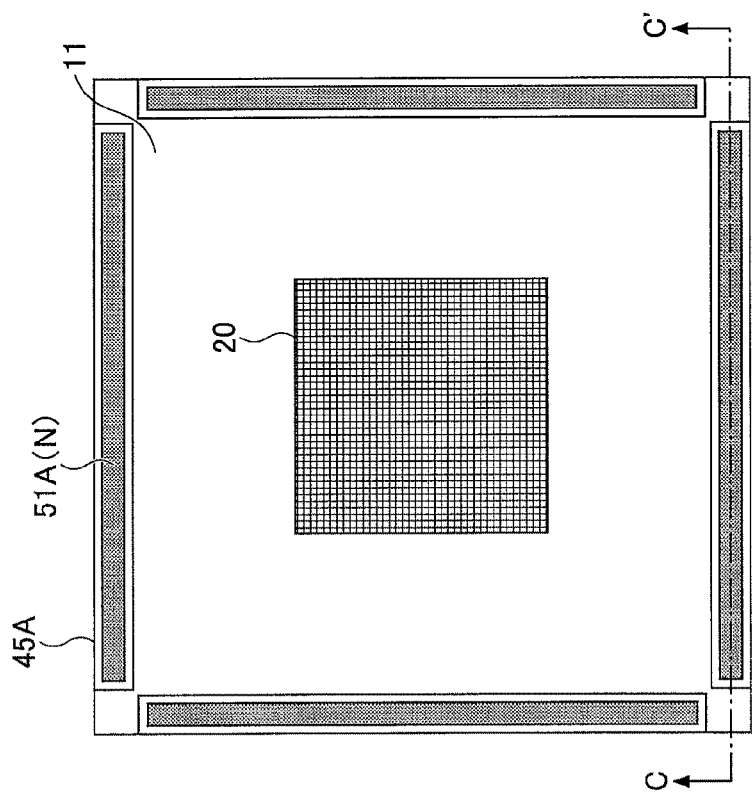

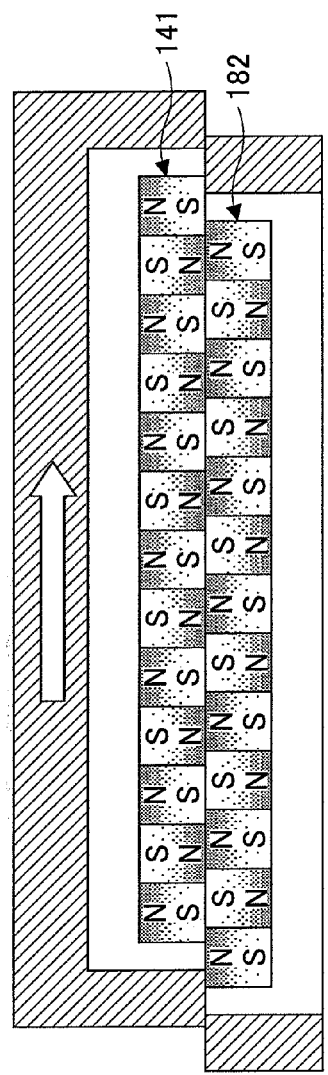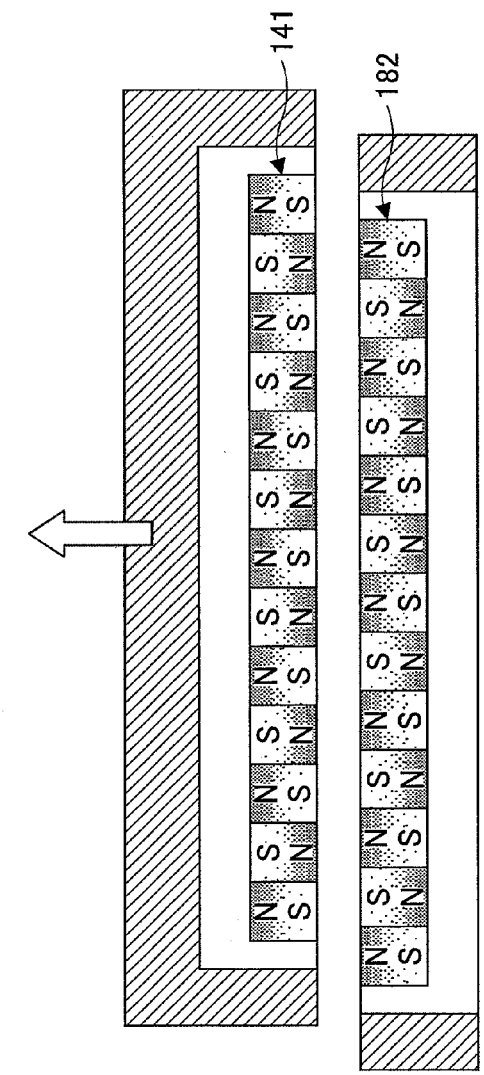
FIG.29A
FIG.29B

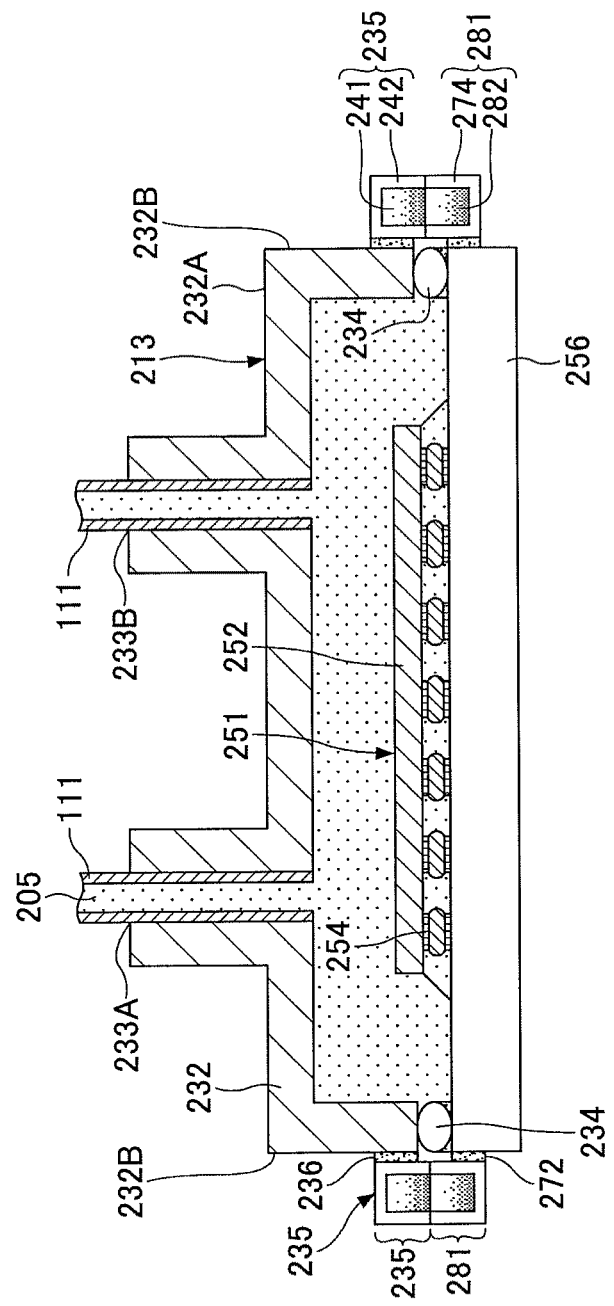

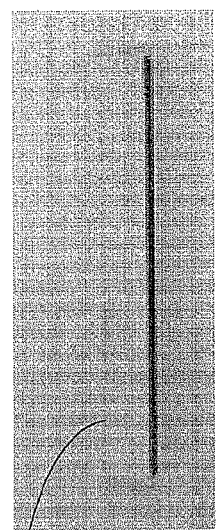
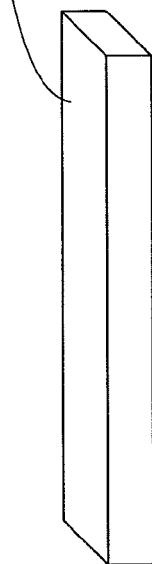FERRITE MAGNET 302
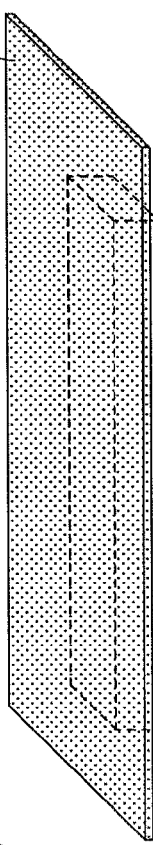SHEET FOR VISUALIZATION OF MAGNETIC FIELD 301
FIG.34A
FIG.34B

ELECTRONIC DEVICE

CROSS REFERENCE TO RELATED APPLICATIONS

This application is based upon and claims the benefit of priorities of prior Japanese Patent Applications No. 2010-160218 filed on Jul. 15, 2010, No. 2010-230143 filed on Oct. 13, 2010, and No. 2011-035116 filed on Feb. 21, 2011, the entire contents of which are incorporated herein by references.

BACKGROUND OF THE INVENTION

1. Field of the Invention

The present invention relates to an electronic device.

2. Description of the Related Art

Servers or personal computers have been achieving remarkable progress toward high-speed high-performance operations. For semiconductor packages which serve as the hearts of computers, LSI chips are growing in size to improve their performances. Especially in servers, the LSI chip size is increasing steadily in response to demand for enhanced performance, and a requirement for heat dissipation during operations is increasing. For this reason, cooling technologies, as well as packaging technologies, have become more important. Thus, an overall structure involving a cooling system in the packaging and mounting structure is having been emphasized.

Examples of heat dissipator include a radiation fin or a heat sink, which is placed in close contact with a heat generator (such as an LSI chip). To tightly fix the heat dissipator to the heat generator, a hole is formed penetrating through both the heat dissipator and a circuit board to fasten them together using a screw.

FIG. 1 illustrates a conventional structure employing screw fastening. A semiconductor package 1020 accommodating an LSI chip 1010 mounted on an interposer 1011 and covered with a cover 1017 is mounted on the circuit board 1001 by flip chip mounting. A heat dissipator 1030 is attached to the top face of the semiconductor package 1020 by thermal grease 1021. The heat dissipator 1030 is fastened to the circuit board 1001 by screws 1025 penetrating through the circuit board 1001 and the heat dissipator 1030. This method cannot achieve uniform fastening due to variations in the number of screws 1025 and the degree of tightening. In addition, through-holes 1002 and 1003 have to be formed in advance in both the circuit board 1001 and the heat dissipator 1030 to receive the screws 1025 for fastening them together. This arrangement causes the entire structure to become large, and is disadvantageous from the viewpoint of making the device compact. Accordingly, a simple structure for achieving the equivalent cooling function is required.

The same problem arises when a heat receiving case (not illustrated) serving as the heat dissipator is fixed to the circuit board 1001 by the screws 1025 in the through-holes 1002 to hold the heat receiving case in close contact with the semiconductor package 1020. In this case, heat from the LSI chip 1010 is transferred to refrigerant via the package cover 1017 and the thermal grease 1021, and cooling efficiency is insufficient.

One method to solve the above-described problems is to embed a magnet in the base of the semiconductor package for mounting an LSI chip and bring a magnetic material provided to the heat dissipator in contact with the magnet by magnetic attractive force. Using a magnet is advantageous because the heat dissipator is attached to the heat source with a relatively simple structure and separated from the heat source in a simple manner.

Meanwhile, a packaging structure with a direct cooling system is also known. For example, a cover is placed over the top face (opposite to a ball-grid array) of the LSI chip and the periphery of the cover is sealed using a sealing material to define an enclosed space over the semiconductor. Liquid refrigerant is ejected from a nozzle into the enclosed space to directly cool the LSI chip.

However, if magnetic attraction is applied as it is to a conventional packaging structure, another problem arises, which problem is explained in conjunction with FIG. 2. In this figure, a cooling fin (or a heat dissipator) 1030 is fixed to the top face of a semiconductor package 1020 via thermal grease 1021. A magnet 1040 is placed on a substrate 1011 on which a semiconductor package 1020 is flip-chip bonded. A magnetic material 1035 provided to the cooling fin 1030 is attracted to the magnet 1040. In this arrangement, magnetic flux lines (magnetic flux) stretch out from the magnet 1040 into the surroundings. If electrical components such as interconnects, connectors or other elements exist near the magnet, these components may be adversely affected. In FIG. 2, the magnetic field from the magnet 104 influences the interconnect 1015 formed in the substrate 1011 and noise is generated in desired signals. Besides, electric current changes due to the magnetic influence and it is likely to cause error operations. The same problem arises when a water-cooled system or a cooling chamber is used as the heat dissipator.

LIST OF PRIOR ART DOCUMENTS

Patent Document 1: JP H10-70383 A
Patent Document 2: JP H09-283675 A
Patent Document 3: JP H05-67712 A

SUMMARY OF THE INVENTION

The embodiments presented below provide an electronic device with a cooling system, which cooling system (or a heat dissipator) is fixed to a semiconductor device with a simple structure, while preventing magnetic influence on nearby electric elements such as interconnects.

In one aspect of the invention, an electronic device includes an electronic component mounted on a substrate, a cooling system for cooling the electronic component, and a fastening structure for fastening the cooling system to the substrate, wherein the fastening structure includes a first magnet provided to one of the substrate and the cooling system, a second magnetic material provided to the other of the substrate and the cooling system and magnetically coupled with the first magnet, and a magnetic shield covering a part or all of the first magnet except for the coupling face to be coupled with the second magnetic material.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 10A is a top view of an interposer with an LSI chip mounted thereon according to the modification of Embodiment 1;

FIG. 10B is a bottom view of a cooling fin attached to the LSI chip in the modification;

FIG. 29A illustrates a direction of force applied to the heat receiving case when removed;

FIG. 29B illustrates a direction of force applied to the heat receiving case when removed;

FIG. 31C illustrates an assembling process of an electronic device according to Embodiment 5;

FIG. 34A illustrates leakage of magnetic flux without a housing of a soft magnetic material;

FIG. 34B illustrates leakage of magnetic flux without a housing of a soft magnetic material;

DETAILED DESCRIPTION OF THE EMBODIMENTS

The embodiments will now be described below in conjunction with attached drawings.

<Embodiment 1>

Figure 1:
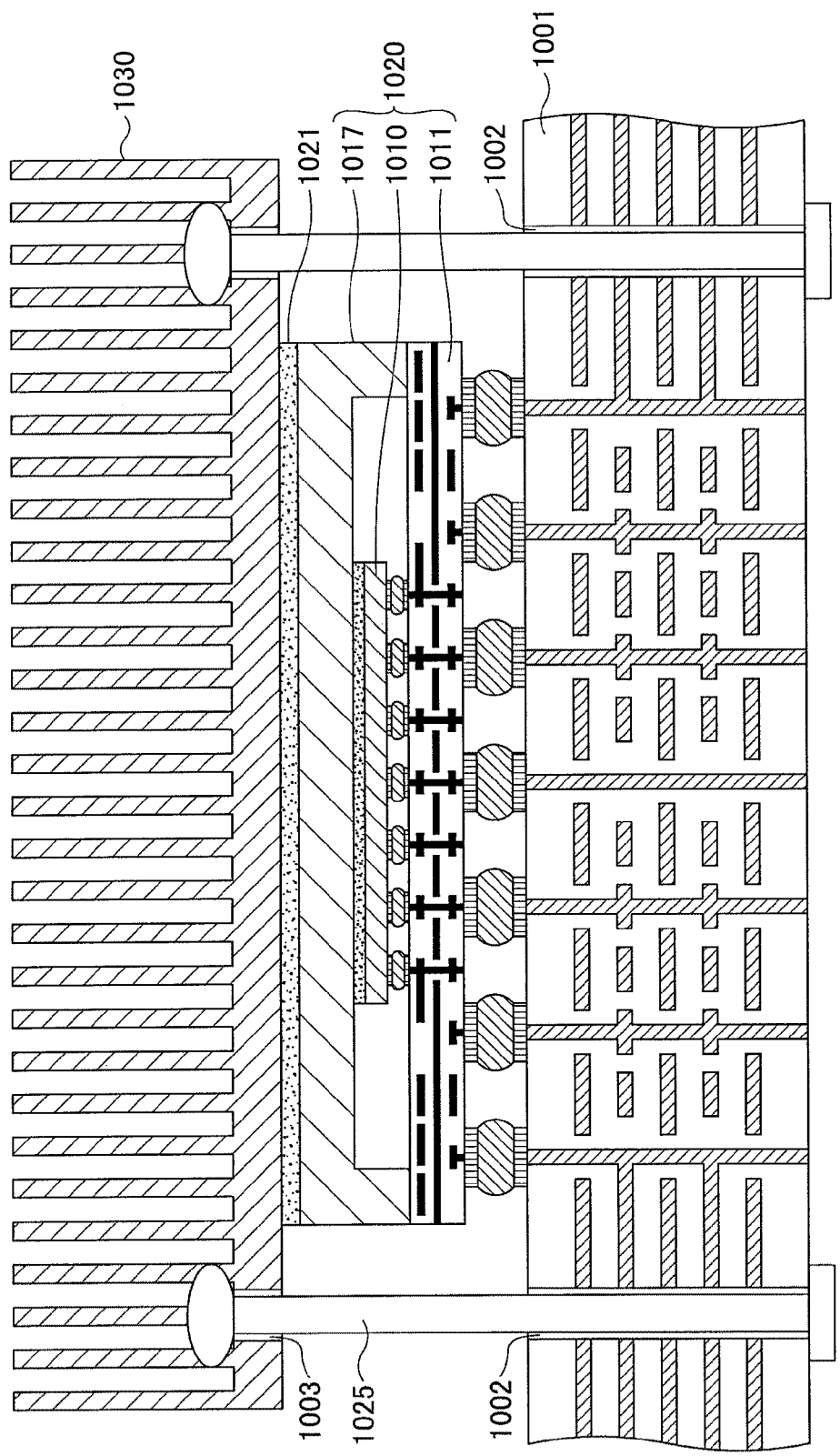
FIG. 1 is a cross-sectional view of a conventional structure for mounting a cooling system on a semiconductor package.
Figure 2:
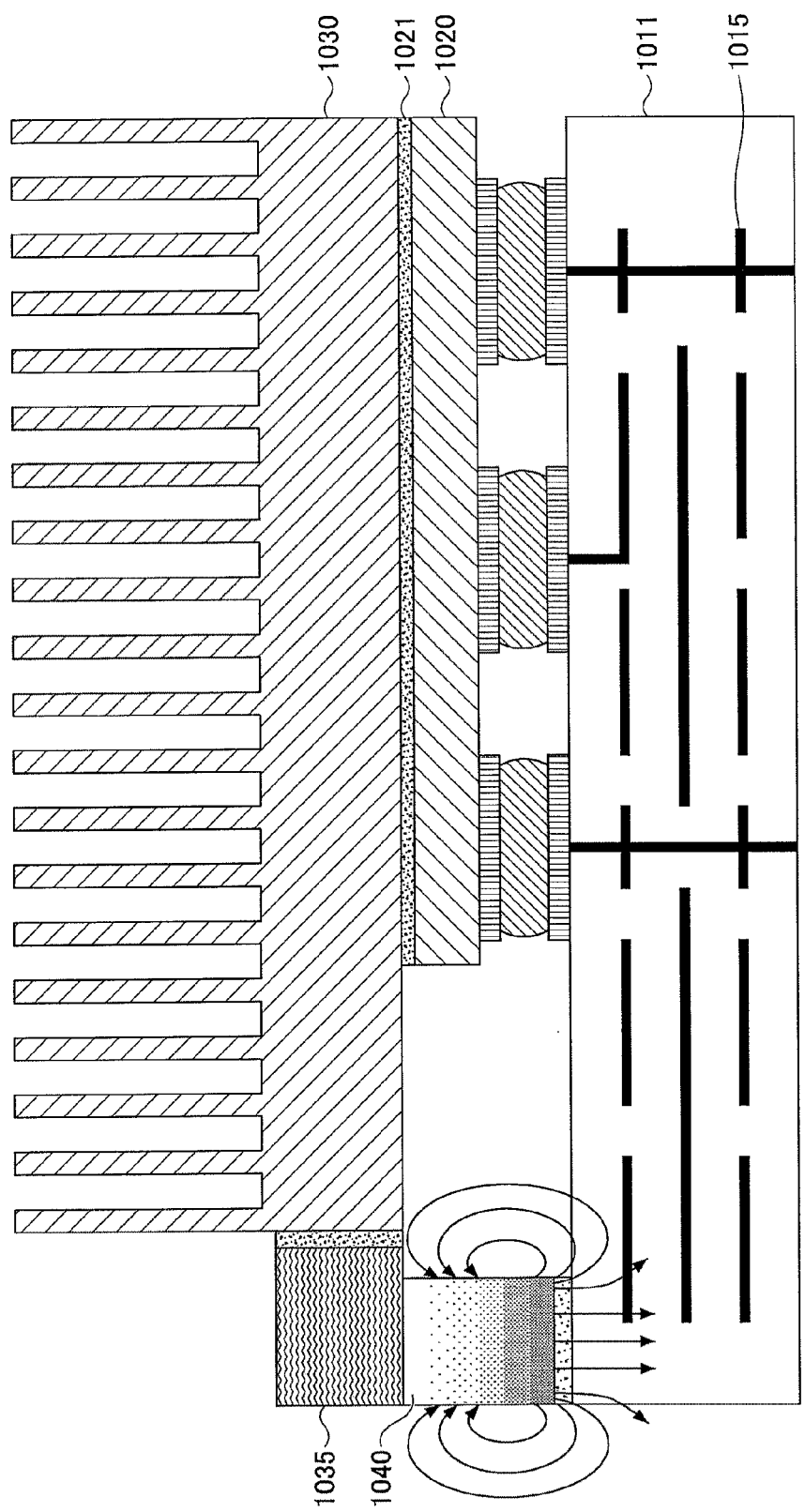
FIG. 2 is a diagram showing a problem arising from a heat dissipator fastening structure using a magnet.
Figure 3:
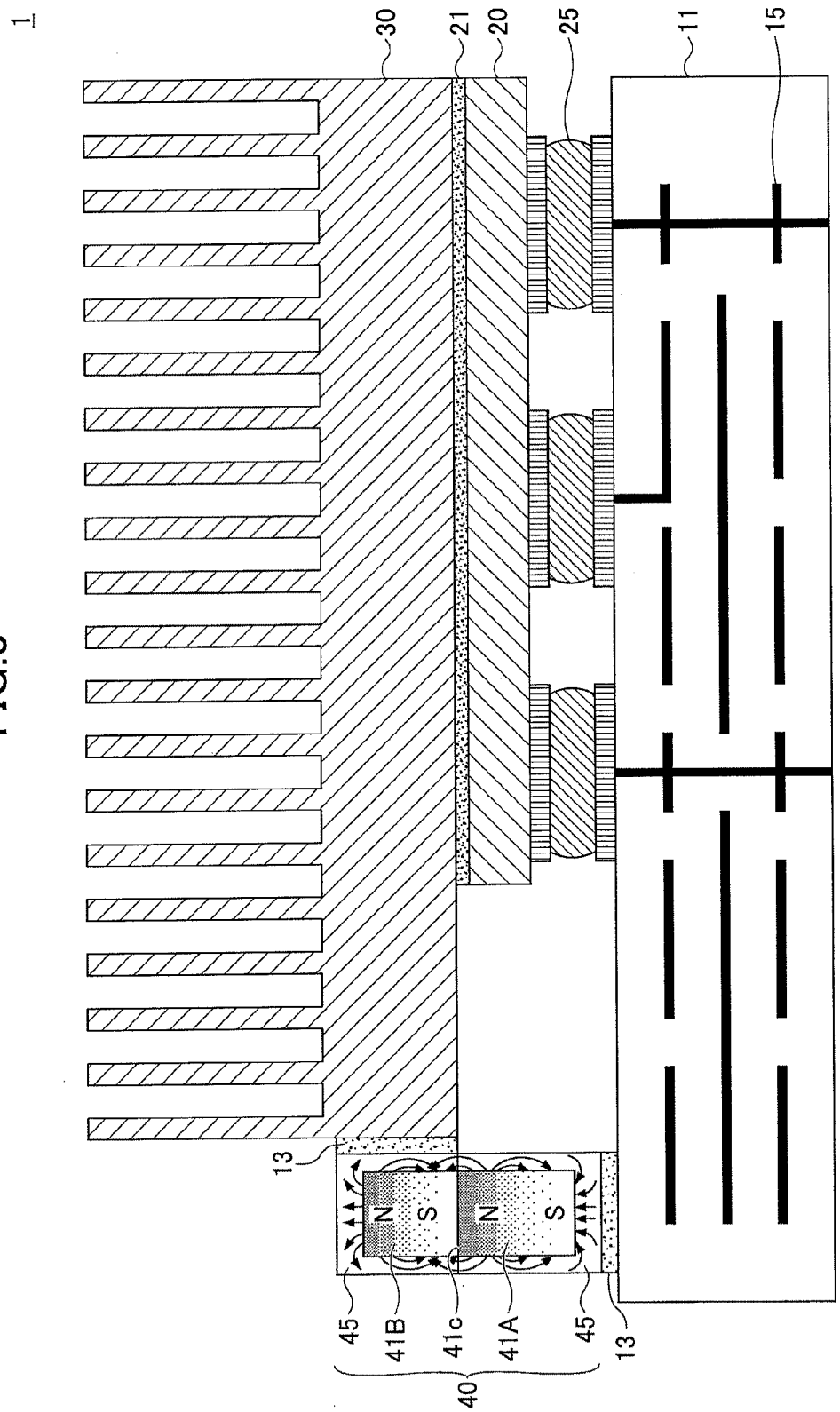
FIG. 3 is a cross-sectional view of an electronic device taken along the A-A' lines of FIG. 5A and FIG. 5B according to Embodiment 1 of the invention.
Figure 4:
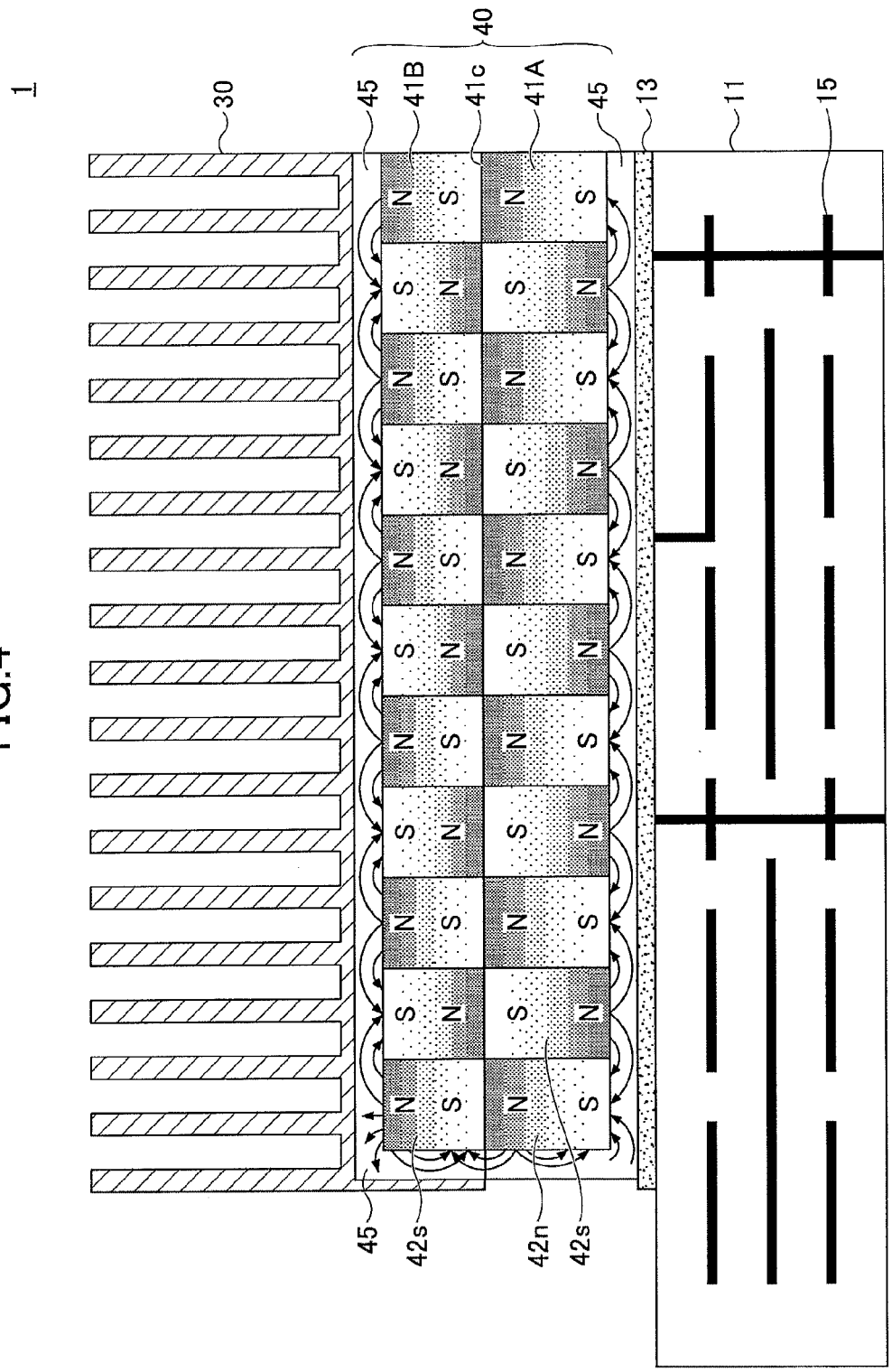
FIG. 4 is a cross-sectional view of the electronic device taken along the B-B' lines of FIG. 5A and FIG. 5B.
Figure 5:
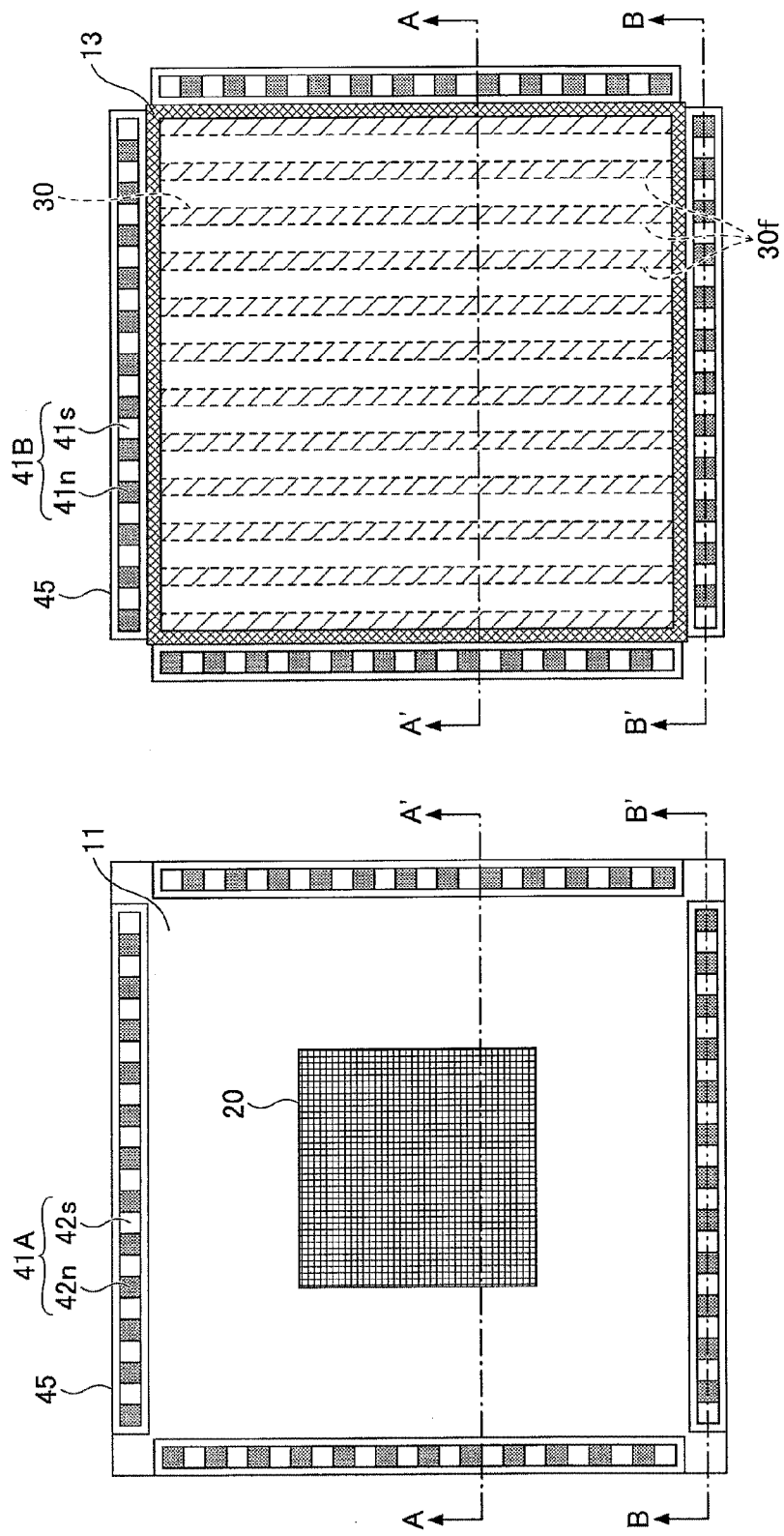
FIG. 5A is a top view of an interposer with an LSI chip mounted thereon according to Embodiment 1.
FIG. 5B is a bottom view of a cooling fin to be attached to the LSI chip in Embodiment 1.

FIGS. 3-5 illustrate a basic structure of an electronic device of Embodiment 1. FIG. 3 is a cross-sectional view of an electronic device taken along the A-A' lines of FIG. 5A and FIG. 5B, where a cooling fin 30 illustrated in FIG. 5B is fixed to an interposer substrate 11, while being held in close contact with a LSI chip 20 illustrated in FIG. 5A, and FIG. 4 is a cross-sectional view of the electronic device taken along the B-B' lines of the same. In Embodiment 1, the LSI chip 20 is an example of a heat generator to be cooled, and the cooling fin 30 serving as a heat dissipator is attached by thermal grease 21 to the top face (which is opposite to the circuit element forming face) of the LSI chip 20 mounted on the interposer substrate 11. A magnetic chuck 40 is employed as a fastening structure to secure the cooling fin 30 attached to the LSI chip 20 onto the interposer substrate 11.

As illustrated in FIG. 3 and FIG. 4, the magnetic chuck 40 includes a first magnet 41A placed over the interposer substrate 11 via an adhesive 13, a second magnet 41B provided to the cooling fin 30 via an adhesive 13, and a magnetic material 45 that covers the outer faces of the first magnet 41A and the second magnet 41B, except for the attracting surfaces (i.e., the magnetic coupling surface) 41c facing each other. The first magnet 41A and the second magnet 41B are arranged such that the attracting surfaces 41c of the first magnet 41A and the second magnet 41B facing each other have opposite polarities in order to serve as a magnetic chuck making use of a magnetic attractive force between the north pole (N) and south pole (S). In FIG. 3, the first magnet 41A and the second magnet 41B, which are coupled to each other under the magnetic attractive force, are entirely surrounded by the magnetic material (e.g., a high-permeability soft magnetic material) 45. Because a soft magnetic material has high permeability and conducts magnetic flux easily, most of the magnetic flux emitted from one of the magnetic poles and directed to the other pole pass through the magnetic material 45. As a result, leakage of magnetic flux emitted from the magnet 41A and 41B are prevented, and influence on electrical elements (not illustrated) such as interconnect patterns 15 located near the magnetic chuck 40 is reduced.

As illustrated in the B-B' cross sectional view of FIG. 4, each of the magnet 41A and 41B are magnetized such that multiple poles appear on the attracting surface 41c with the north poles and the south poles arranged alternately. In this example, each of the first magnet 41A and the second magnet 41B consists of a set of small blocks of magnets 42 oppositely magnetized one after the other.

To be more precise, in the first magnet 41A, small magnets 42n and small of magnets 42s are arranged alternately such that N poles and S poles appear alternately on the attracting surface 41c. In the second magnet 41B, small magnets 42s and small magnets 42n are arranged alternately in reverse order such that S poles and N poles appear alternately on the attracting surface 41c. With this arrangement, many magnetic circuits are produced to couple the interposer substrate 11 and the cooling fin 30, thereby achieving a steady attachment. Since many oppositely magnetized magnets facing each other are attracted to each other at many locations, self alignment can be realized in a simple and accurate manner. In addition, magnetic flux is generated between the N pole and the S pole of two adjacent small magnets 42n and 42s, so that these small magnets can be held tightly along the row of small magnets 42. Since the magnetic flux extending from a small magnet 42n to the adjacent small magnet 42s is confined in the magnetic material 45, adverse influence on the interconnect patterns 15 formed in the interposer substrate 11 can be avoided.

FIG. 5A is a top view of the interposer substrate 11 and FIG. 5B is a bottom view of the cooling fin 30 used in Embodiment 1. The bottom face of the cooling fin 30 of FIG. 5B is brought into close contact with the LSI chip 20 illustrated in FIG. 5A, and the cooling fin 30 is fixed to the interposer substrate 11 by the first magnet 41A and the second magnet 41B.

In this example, the interposer substrate 11 is made of glass ceramics with a size of 42×42 mm and a thickness of 2 mm. A silicon LSI chip 20 with a size of 20×20×1 mm is flip-chip bonded to the center of the interposer substrate 11. The cooling fin 30 is made of an aluminum alloy and has ten fins 30f. The size of the base part of the cooling fin 30 is 34×34 mm, and the height of each fin 30f is 10 mm. The first magnets 41A, each accommodated in the soft magnetic material 45, are arranged on the substrate 11 along the four sides thereof, as illustrated in FIG. 5A. The second magnets 41B, each accommodated in the soft magnetic material 45, are fixed to the entire circumference of the cooling fin 30 by an adhesive layer 13, as illustrated in FIG. 5B. The soft magnetic material 45 is, for example, high-permeability permalloy (Fe—Ni alloy).

Figure 6:
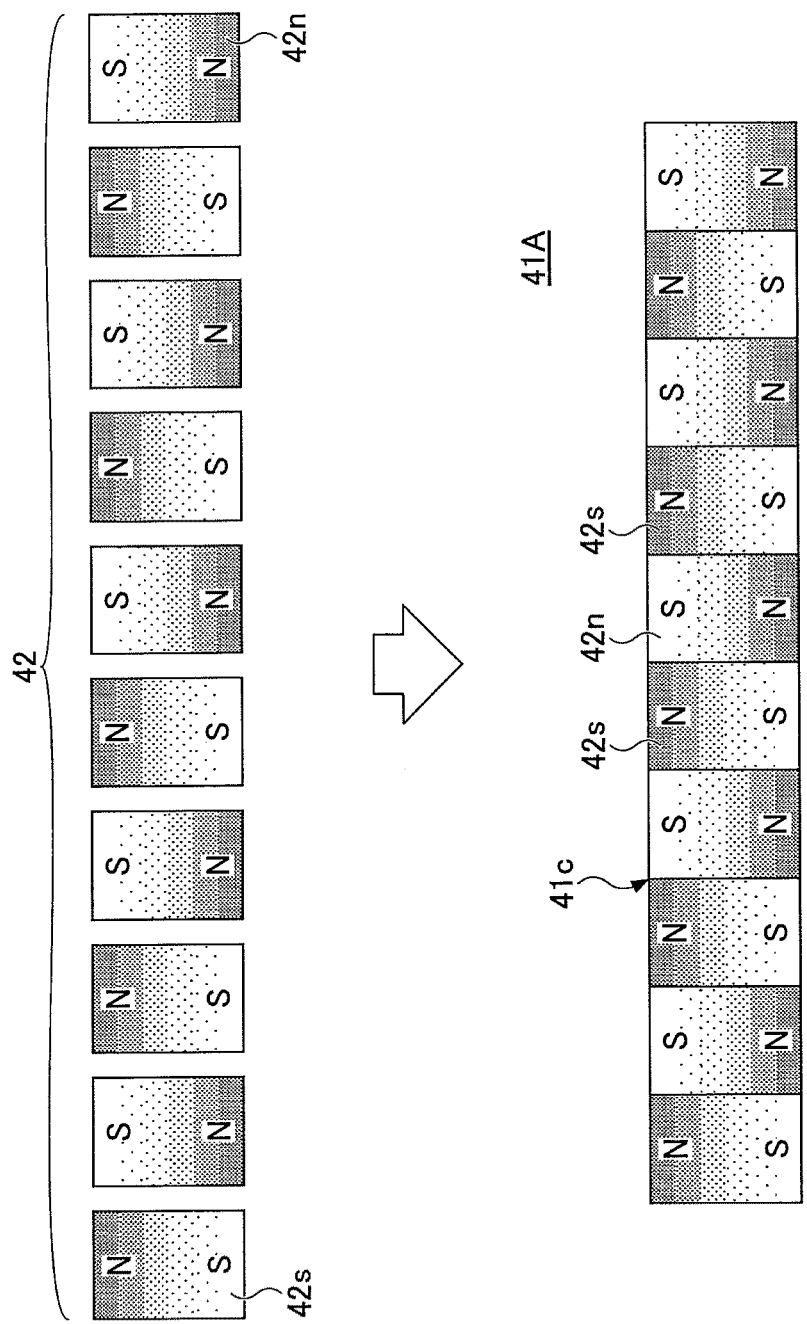
FIG. 6 illustrates a set of magnets used in Embodiment 1.

FIG. 6 illustrates a magnet 41 used as the first magnet 41A arranged on the interposer substrate 11, for example. Small magnets 42, which are blocks of permanent magnets, are aligned so as to have opposite magnetic poles (N pole and S pole) arranged alternately. Adjacent small magnets 42 are bonded to each other by a liquid type epoxy adhesive to fabricate the first magnet 41A. The second magnet 41B provided to the cooling fin 30 has the same structure, but the magnetic poles appearing on the attracting surface 41c are opposite to those appearing on the first magnet 41A.

Figure 7:
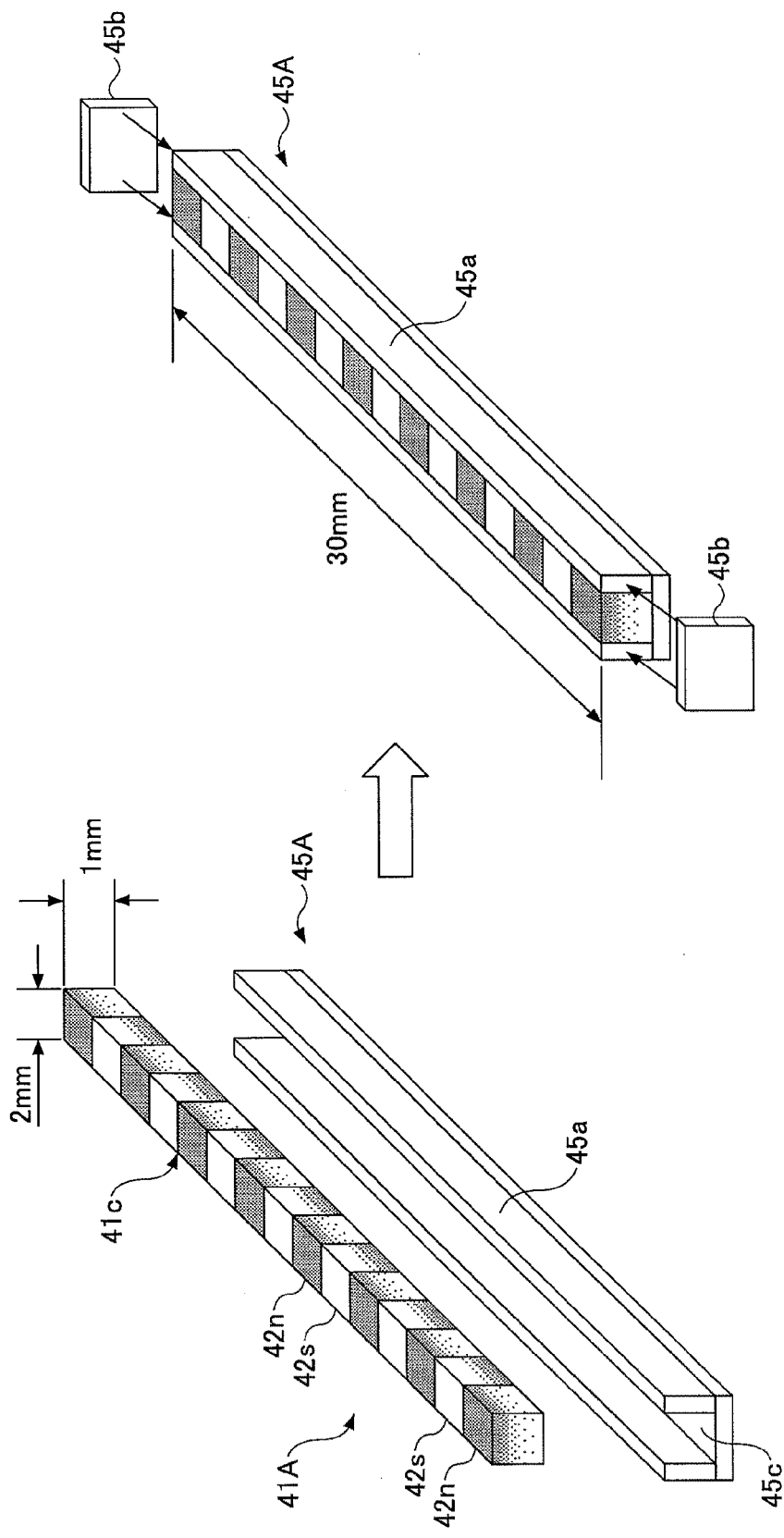
FIG. 7 illustrates an exemplified structure of a magnetic member for housing the magnets illustrated in FIG. 6.

To surround magnet 41A and magnet 41B, except for the attracting surfaces 41c thereof, using a soft magnetic material 45, a housing member with a groove may be used for each of the magnets 41A and 41B, as illustrated in FIG. 7. For example, to accommodate the first magnet 45A, a housing member 45A with a groove 45c is used. The housing member 45A includes a housing body 45a with both ends open, and end parts 45b adapted to cover both ends of the first magnet 41A received in the housing body 45a. The housing body 45a and the end parts 45b are assembled together to surround the magnet 41A. The housing 45a is made of permalloy (Fe—Ni alloy) and the groove 45c is formed by machining. The housing member 45A may be designed as a single unit of a housing case with the end parts 45b attached to the housing body 45a in advance to receive the first magnet 41A. Similarly the second magnet 41B is fit into the groove 45c of the corresponding housing body 45a with the attracting surface 41c exposed, and then end parts 45b may be adhered to both ends of the second magnet 41B to surround the entirety of the second magnet 41B except for the attracting surface 45c.

The thicknesses of the bottom and the side walls of the permalloy housing body 45a are set to 1 mm. The thickness of each of the end parts 45b is 1 mm. The size of the magnet 41A is 2×30 mm with a thickness of 1 mm. The size of each small magnet 42 is 2×2 mm with a thickness of 1 mm. The small magnets 42 are arranged such that N poles and S poles appear alternately on the attracting surface 41c. Permalloy and each of the small magnets 42 are attracted to each other as they are; however adhesive may be used. In this embodiment, two-component epoxy adhesive is used to secure the small magnets 42 in the permalloy housing members 45A and 45B. The alignment of magnetic poles of the small magnets 42 of the first magnet 41A (arranged over the interposer substrate 11) is opposite to that of the second magnet 41B attached to the cooling fin 30. The pole configurations of the first and second magnets 41A and 41B have the same pitch.

In the example illustrated in FIG. 6 and FIG. 7 small magnets 42 (which are permanent magnet blocks) are aligned such that N poles and S poles appear alternately on the attracting surface 41c. In place of the combination of small magnets, a square pole of a ferrite magnet with a width of 2 mm and a length of 30 mm may be used. In this case, the ferrite magnet is magnetized such that opposite magnetic polarities are alternately arranged. In either case where small magnet blocks 42 are combined into magnets 41A and 41B and surrounded by permalloy, or two ferrite magnets each being magnetized with opposite polarities arranged alternately and surrounded by permalloy are used, a satisfactory magnetic shielding effect is achieved. When a magnetic flux observation sheet consisting of two films sandwiching magnetic powder is placed outside the permalloy housing, no migration of magnetic powder is observed unlike the case where the observation sheet is placed near a magnet. Even when a metal of a magnetic material is moved close to the permalloy housing, the metal is not attracted to the permalloy. This means that the magnetic flux is well confined in the soft magnetic material 45. This will be explained below in more detail in conjunction with FIG. 34A and FIG. 34B.

Figure 8:
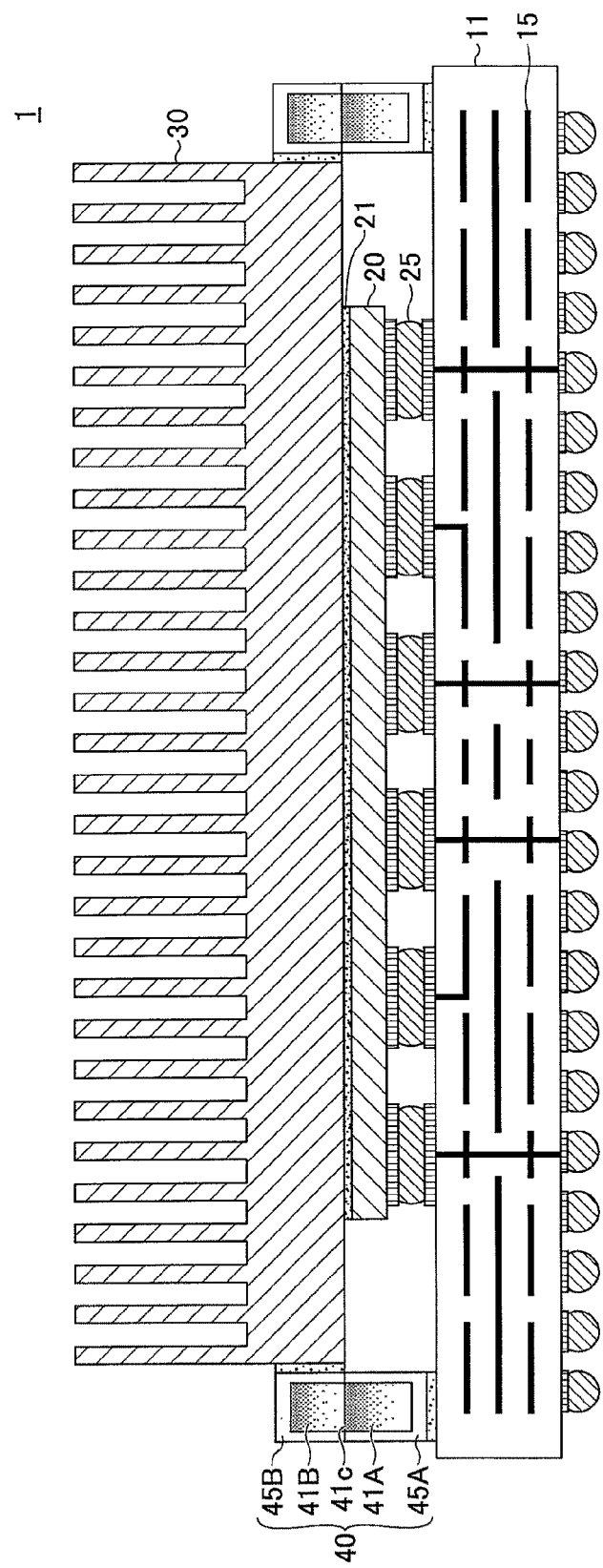
FIG. 8 illustrates an example of an electronic device in which a cooling fin is fixed to the interposer substrate.

FIG. 8 illustrates an assembled device in which magnets 41A and 41B accommodated in the housing materials 45A and 45B illustrated in FIG. 7 structure a magnetic chuck 40 to secure the cooling fin 30 to the interposer substrate 11. The housing 45A made of a magnetic material (such as permalloy) and receiving the first magnet 41A with the attracting surface (i.e., the magnetically coupling surface) 41c exposed is fixed to the interposer substrate 11 such that the attracting surface 41c faces upward. The housing 45B made of a magnetic material (such as permalloy) and receiving the second magnet 41B with the attracting surface 41c exposed is fixed to the side wall of the cooling fin 30 such that the attracting surface 41c faces downward. Thermal grease 21 is applied to the top face of the LSI chip 20, which top face is opposite to the circuit surface of the chip. When the cooling fin 30 is brought above the interposer substrate 11, N poles and S poles of the magnet 41B are attracted to the S poles and N poles of the magnet 41A and the thermal grease 21 is pressed and flattened. The cooling fin 30 is secured at a position on which the magnetic attractive force acts most strongly. This position is the correct position where the cooling fin 30 is to be aligned with respect to the interposer substrate 11. Once the magnet 41A and the magnet 41B are attracted to each other, these magnets are completely surrounded by the magnetic material 45 without an exposed surface. Thus, an electronic device 1 with a cooling system fixing structure with little leakage of magnetic flux to the exterior is completed.

Figure 28A:
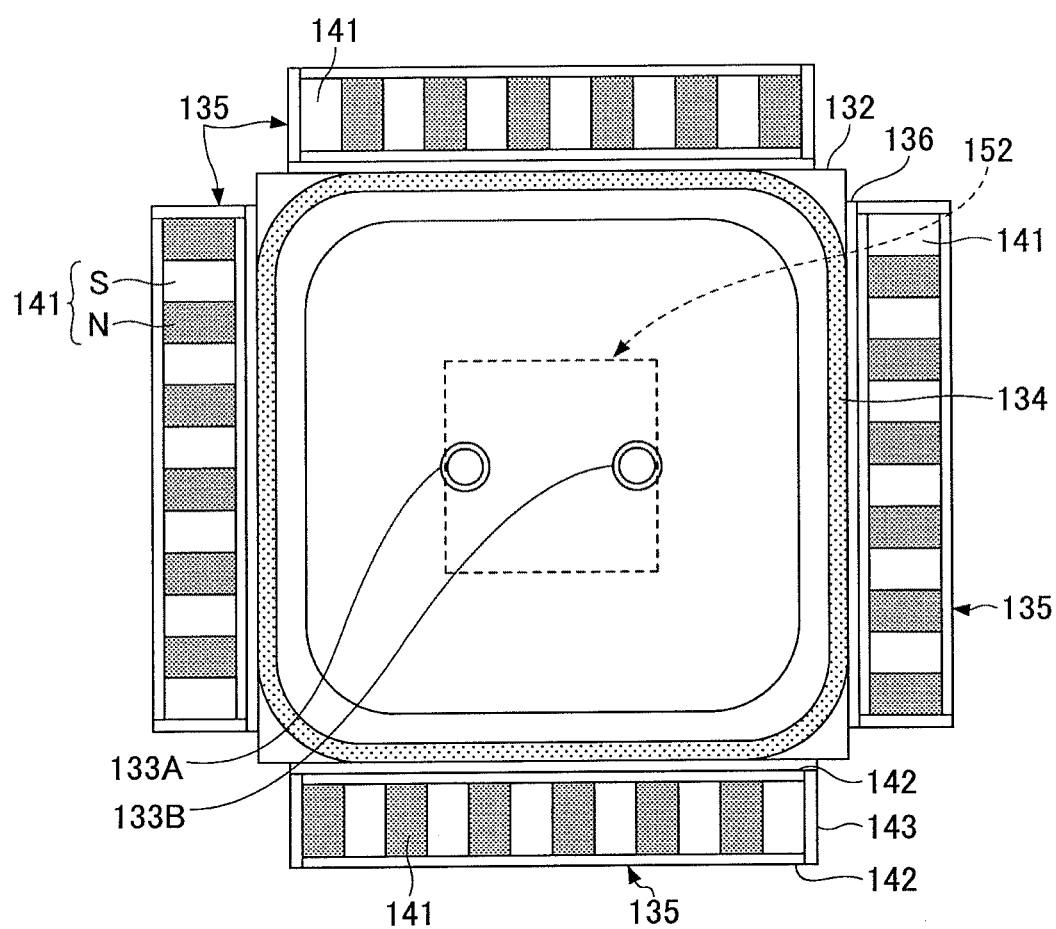
FIG. 28A illustrates how the heat receiving case is removed.
Figure 28B:
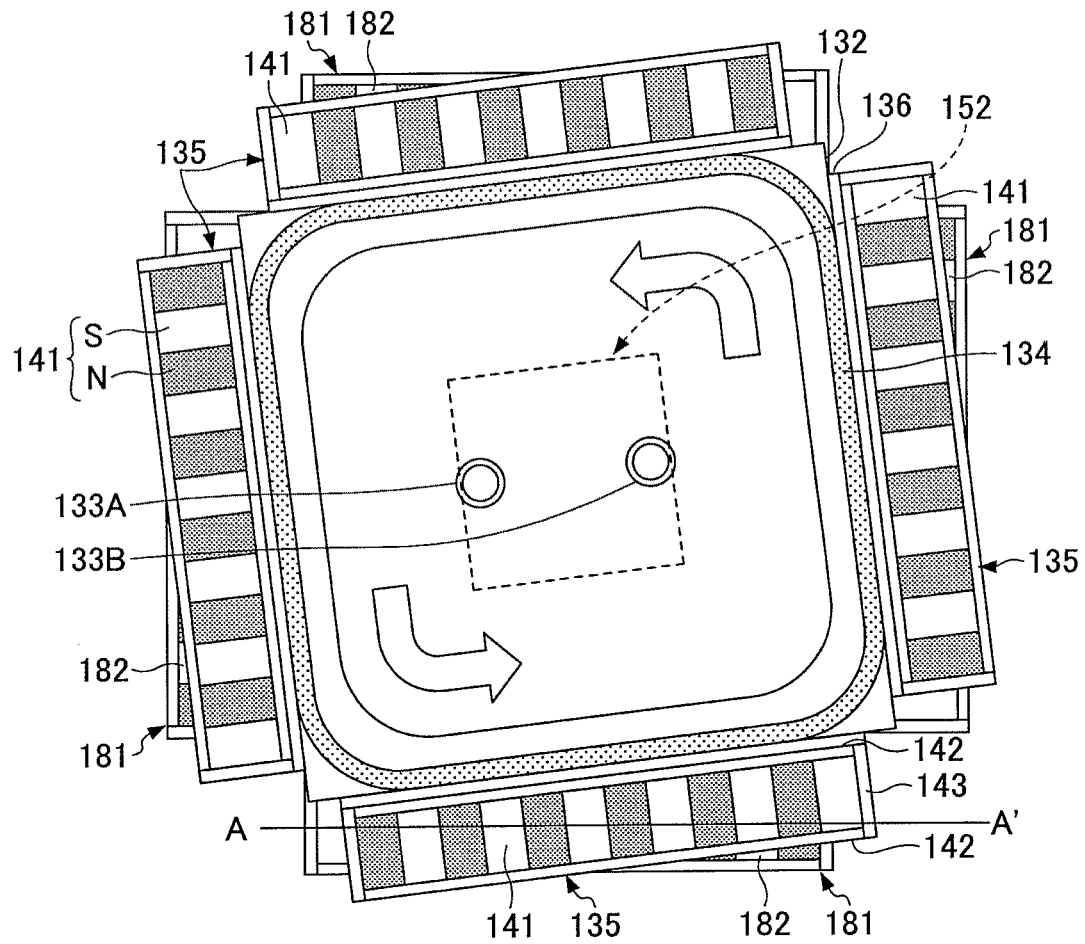
FIG. 28B illustrates how the heat receiving case is removed.

Since the cooling fin 30 is held in close contact with the LSI chip 20 making use of a magnetic attractive force, the fixing structure is simplified and alignment between the cooling fin 30 and the interposer substrate 11 is facilitated. In addition, by using thermal grease 21 made of a material whose adhesive power is broken down by application of heat, the cooling fin 30 can be removed easily from the interposer substrate 11 simply by turning or rotating one of them with respect to the other within a horizontal plane parallel to the substrate. This will be explained in more detail below in conjunction with FIG. 28A and FIG. 28B.

Although in Embodiment 1 the entire surfaces of first magnet 41A and the second magnet 41B, except for the attracting surfaces 41c, are surrounded by a soft magnetic material 45, a part of either or both magnets (for example, a part of the second magnet 41B attached to the cooling fin 30) may not be covered with the magnetic material as long as there is not influence on the nearby interconnects or electrical components.

<Modification of Embodiment 1>

Figure 9:
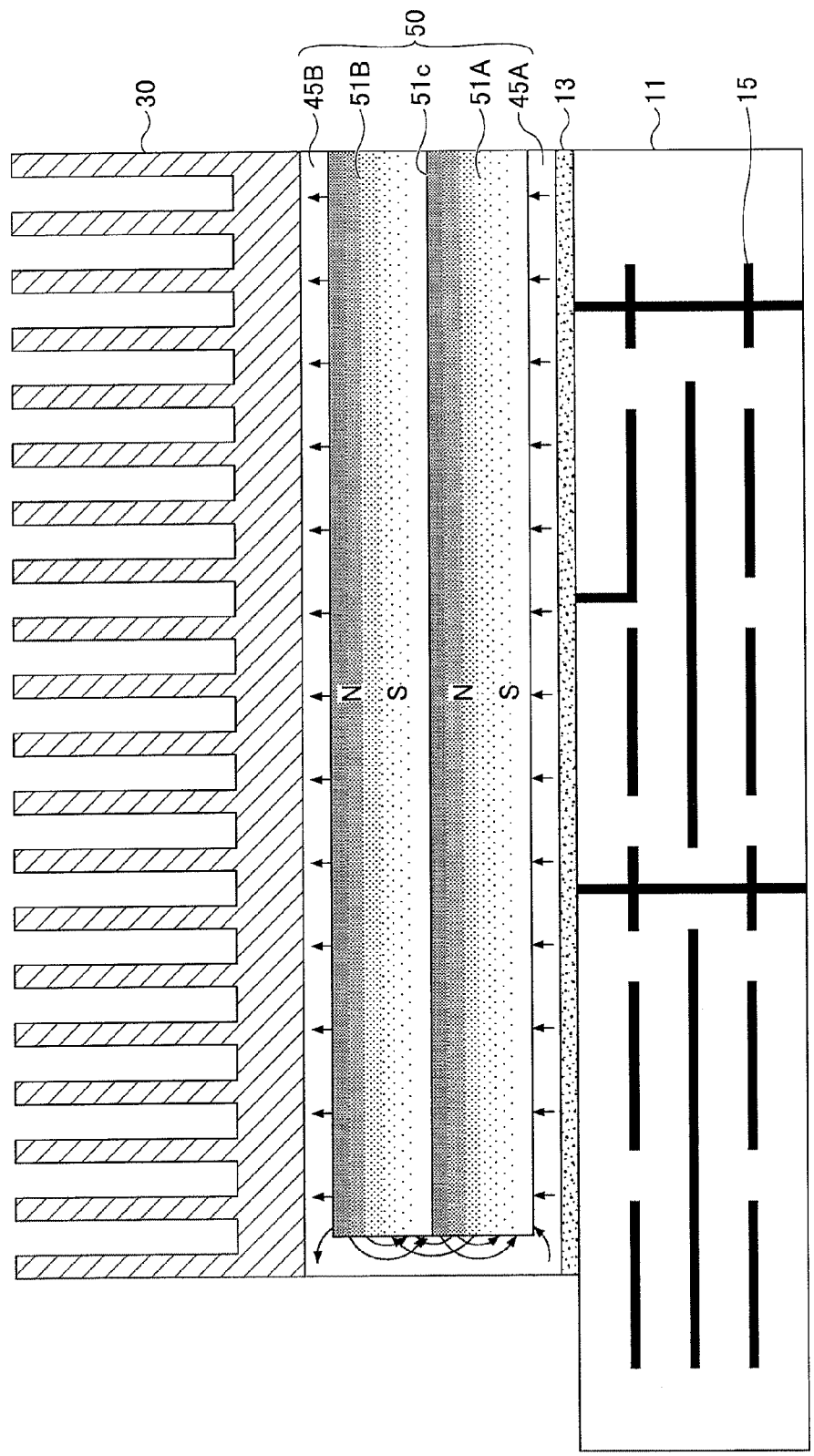
FIG. 9 illustrates a modification of Embodiment 1.

FIG. 9, FIG. 10A, FIG. 10B and FIG. 11 illustrate a modification of Embodiment 1. FIG. 9 is a cross-sectional view of an electronic device taken in the C-C' lines of FIG. 10A and FIG. 10B when the cooling fin 30 illustrated in FIG. 10B is secured to the interposer substrate 11 so as to be in close contact with the LSI chip 20 illustrated in FIG. 10A.

In Embodiment 1, each of the first magnet 41A and the second magnet 41B is structured so as to exhibit opposite magnetic polarities appearing alternately on the attracting surface 41c. In this modification, only one of the magnetic polarities appears on the attracting surface 41c of one of the magnets 51A and 51B, while the other magnetic polarity appears on the other of the magnets 51A and 51B. For example, the first magnet 51A is accommodated in the housing member 45A made of a soft magnetic material such that the N pole appears on the exposed surface, and placed over the interposer substrate 11. The second magnet 45B is accommodated in the housing member 45B made of a soft magnetic material such that the S pole appears on the exposed surface, and fixed to the cooling fin 30. Thermal grease 21 is applied onto the LSI chip 20 illustrated in FIG. 10A. When the cooling fin 30 illustrated in FIG. 10B is positioned above the interposer substrate 11, the first magnet 51A and the second magnet 512 are attracted to each other and serve as a magnetic chuck 50 which brings and secures the cooling fin 30 to a correct position on the interposer substrate 11. When the first magnet 51A and the second magnet 51B are coupled with each other at the attracting surfaces, the first and second magnets 51A and 51B are completely surrounded by the soft magnet material 45. Accordingly, the magnetic fluxes are prevented from leaking and adversely affecting the interconnect patterns 15 of the interposer substrate 11.

Figure 11:
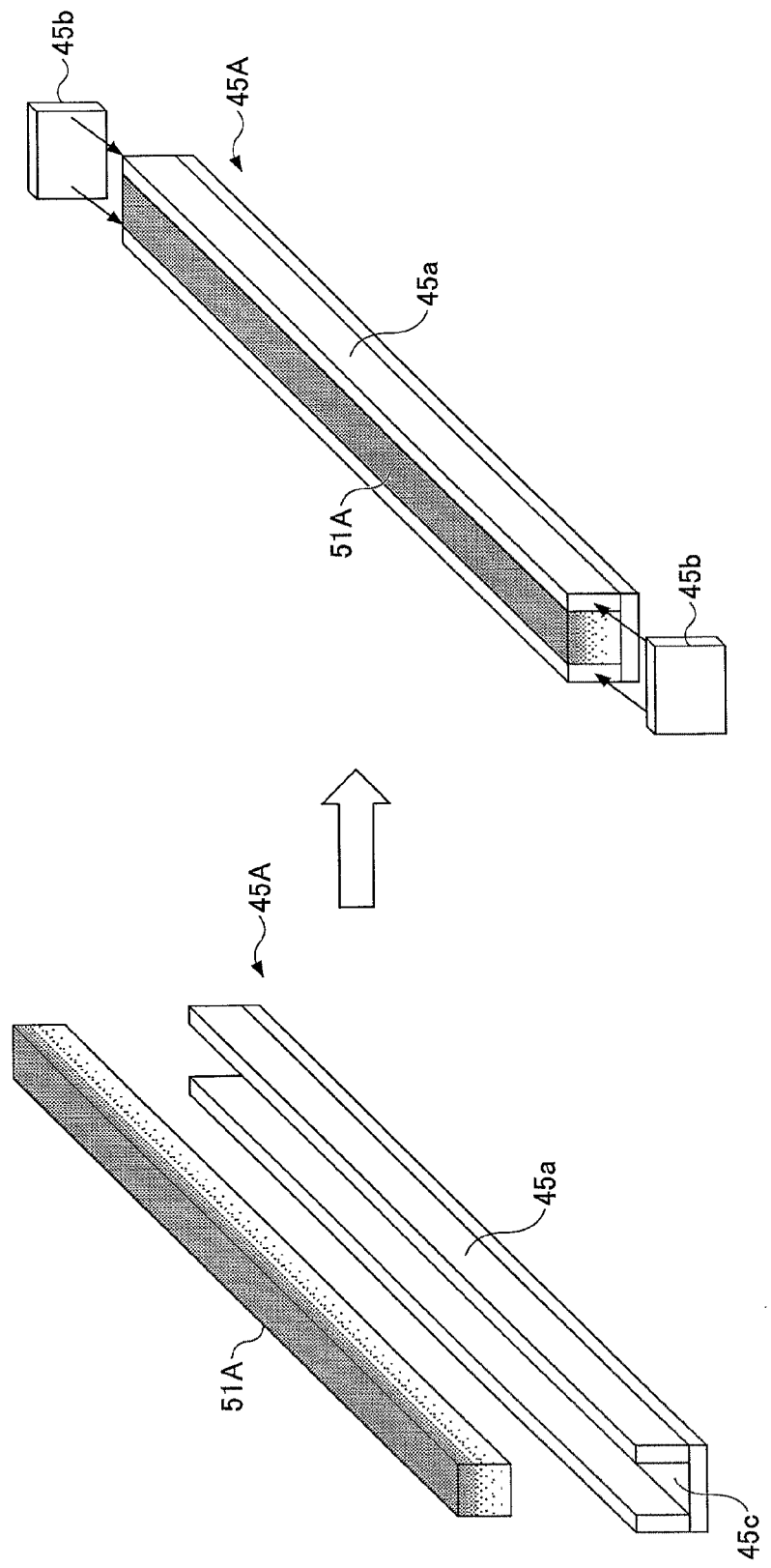
FIG. 11 illustrates an exemplified structure of a magnetic member for housing the magnet illustrated in FIG. 9.

The sizes and the material of the interposer substrate 11, the LSI chip 20, and the cooling fin 30 are the same as those in Embodiment 1. The area size of the attracting surface of each of the magnets 51A and 51B is 2×30 mm with a thickness of 1 mm. A single magnetic polarity (N pole or S pole) appears on the attracting surface of one of the magnets 51A and 51B, and an opposite polarity appears on the attracting surface of the other. The magnets 51A and 51B may be accommodated in the housing member 45 comprised of a housing body 45a and end parts 45b as illustrated in FIG. 11. The cooling fin 30 is secured to the interposer substrate 11 in a self-aligning manner, while keeping close contact with the LSI chip 20, making use of the magnetic attractive force acting between opposite magnetic polarities.

<Embodiment 2>

Figure 12:
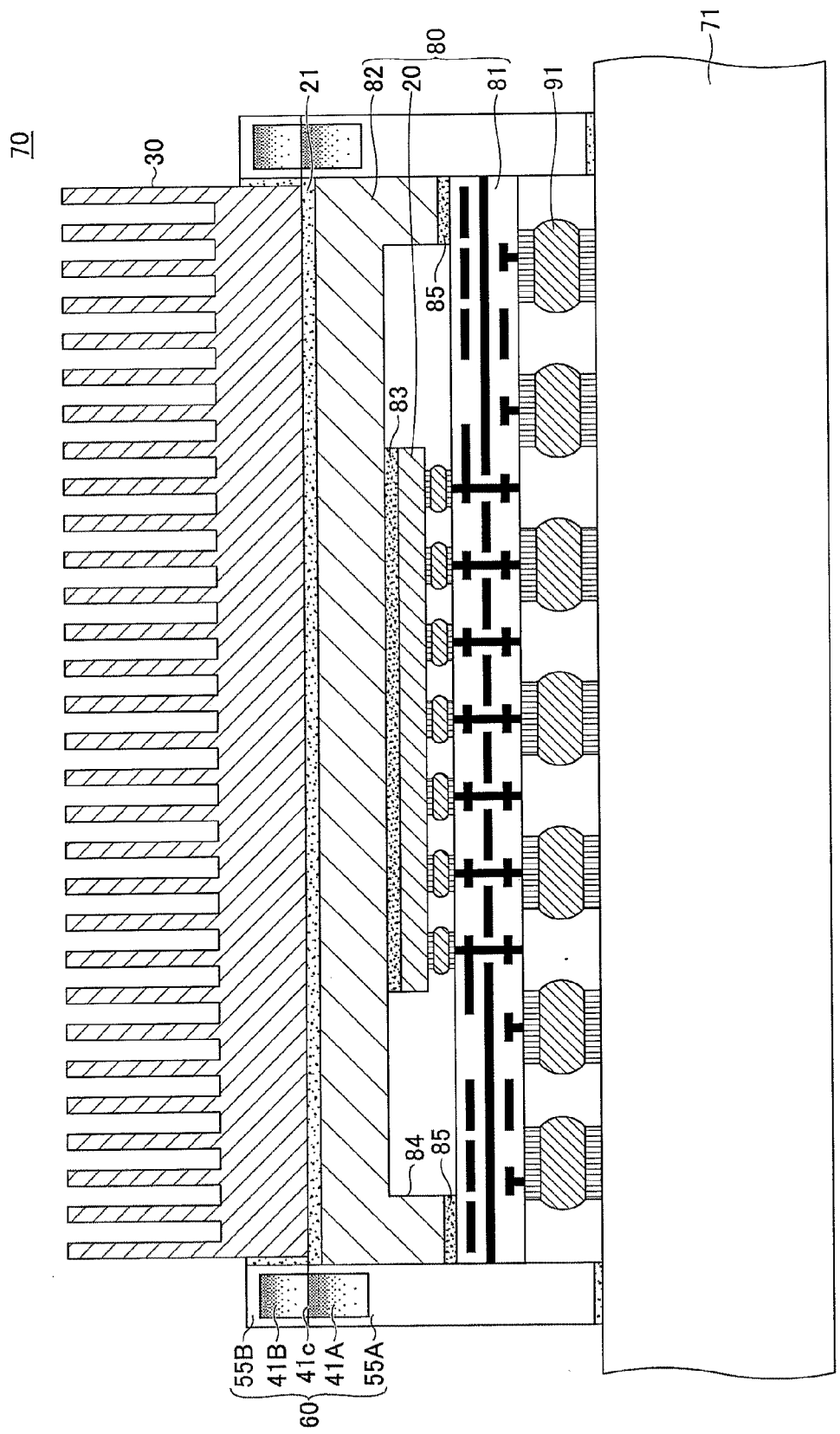
FIG. 12 is a cross-sectional view of an electronic device according to Embodiment 2.

FIG. 12 is a schematic cross-sectional view of an electronic device 70 according to Embodiment 2. In Embodiment 1, a cooling fin 30 is attached directly to an LSI chip 20. In Embodiment 2, a semiconductor package 80 with an LSI chip inside is to be cooled. To mount a large-scaled high-performance LSI chip on a circuit board, a BGA (ball grid array) package is effective. In a BGA package, an LSI bare chip is mounted on an interposer and packaged. Then solder balls are provided to the electrodes formed on the interposer surface opposite to the LSI-chip mounting surface. In Embodiment 2, an electronic device with a cooling system for cooling a packaged semiconductor device is provided.

In FIG. 12, a semiconductor package 80 includes an interposer substrate 81 on which is mounted an LSI chip 20, and a metallic cover 82 for packaging the LSI chip 20. The size of the metallic cover 82 is 42×30 mm with a thickness of 3 mm. The sizes of the LSI chip 20 and the interposer substrate 81 are the same as those used in Embodiment 1. A recess 84 with dimensions of 30×30×1.5 mm is formed in the metallic cover 82 to accommodate the LSI chip 20 and come into contact with the LSI chip 20. The metal cover 82 is bonded to the LSI chip 20 by a low-melting-point metal 83. The metal cover 82 is also bonded to the interposer substrate 81 by a heat resistant adhesive 85 to package the LSI chip 20. The semiconductor package 80 is electrically connected to a circuit board 71 via electrodes 91.

Figure 13A:
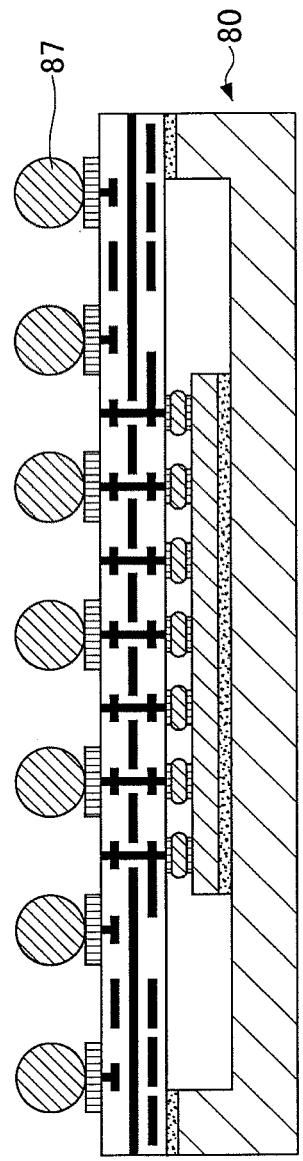
FIG. 13A illustrates a process of mounting a semiconductor package onto a substrate, which package is to be cooled in Embodiment 2.
Figure 13B:
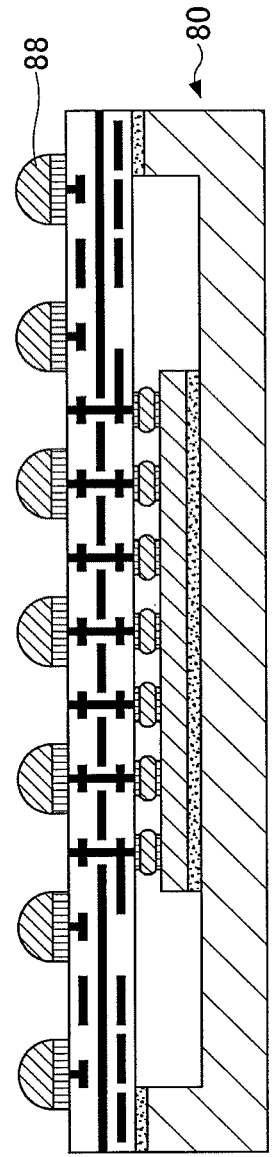
FIG. 13B illustrates a process of mounting a semiconductor package onto a substrate, which package is to be cooled in Embodiment 2.
Figure 13C:
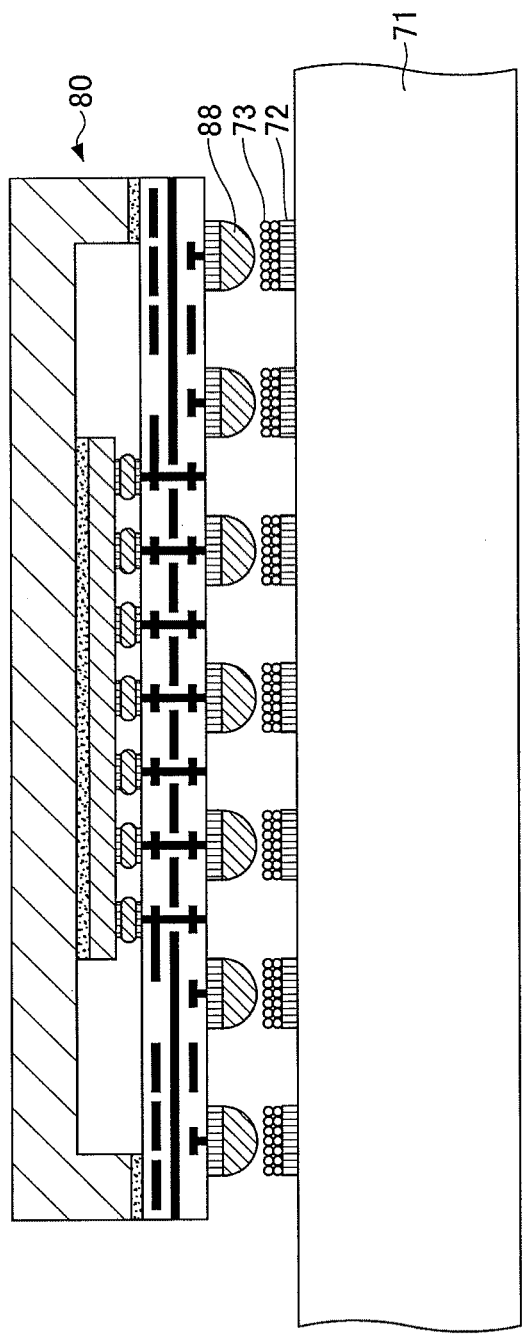
FIG. 13C illustrates a process of mounting a semiconductor package onto a substrate, which package is to be cooled in Embodiment 2.
Figure 13D:
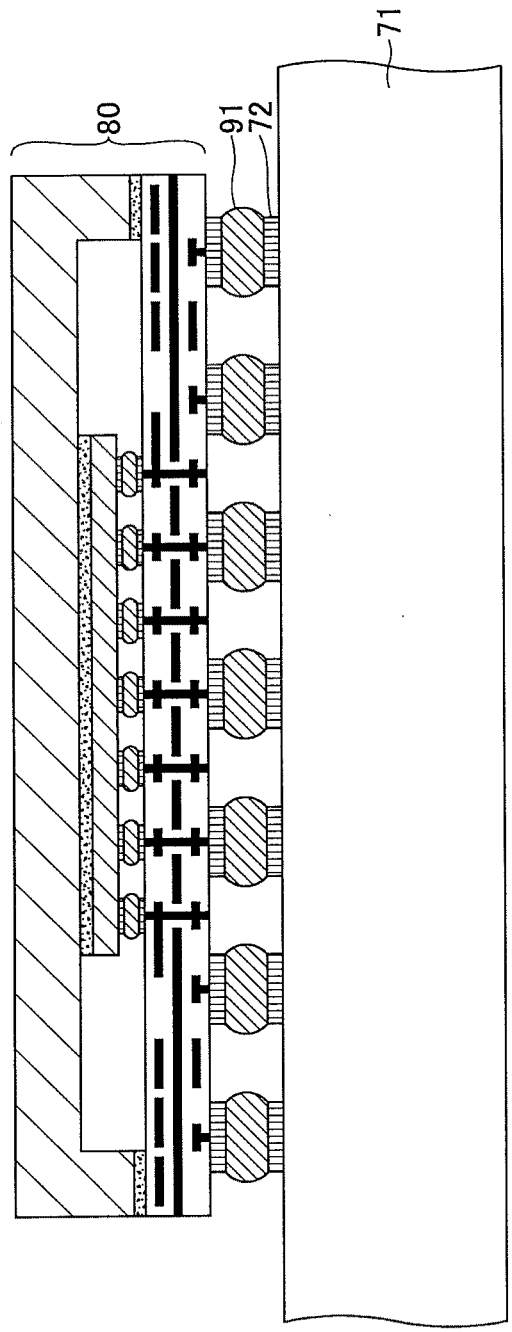
FIG. 13D illustrates a process of mounting a semiconductor package onto a substrate, which package is to be cooled in Embodiment 2.

FIG. 13A through FIG. 13D illustrate a process of mounting the semiconductor package 80 on a circuit board 71. As illustrated in FIG. 13A, Sn-3Ag-0.5Cu solder balls 87 are placed on the electrodes on the interposer substrate. Then, as illustrated in FIG. 13B, the solder balls 87 are subjected to a reflow process in a reflow oven in the nitrogen atmosphere at the maximum temperature of 240° C. (degrees C.) to form solder bump electrodes 88. Then, as illustrated in FIG. 13C, Sn-3Ag-0.5Cu paste 73 is printed on the electrodes 72 on the circuit board 71 using a metal mask, and the semiconductor package 80 illustrated in FIG. 13B is positioned onto the circuit board 71. Then, as illustrated in FIG. 13D, the semiconductor package 80 is bonded via connection electrodes 91 to the circuit board 71 through a reflow process in a reflow oven in the nitrogen atmosphere at the maximum temperature of 240° C.

Returning to FIG. 12, a cooling system is incorporated in the semiconductor package mounting structure illustrated in FIG. 13D. A first magnet 41A accommodated in a housing member 55A with the attracting surface 41c exposed is placed on the circuit board 71. In this example, the first magnet 41A is accommodated in the magnetic housing member 55A such that the attracting surface 41c aligns with the top face (on the opposite side of the mounting face or the connection electrodes 91) of the semiconductor package 80. A second magnet 41B accommodated in a housing member 55B with the attracting surface 41c exposed is fixed to the side wall of the cooling fin 30 such that the exposed attracting surface 41c facing the first magnet 41A. Thermal grease 21 is applied to the top face (opposite to the mounting face) of the semiconductor package 80. The thermal grease 21 is a heat-conductive adhesive whose adhesive property is destroyed by heat. By positioning the cooling fin 30 directly above the semiconductor package 80 with the thermal grease 21 applied, the cooling fin 30 is secured to the correct position on the circuit board 71 in a self-aligning manner by the attraction force acting between the first magnet 41A and the second magnet 41B, while being firmly held to the semiconductor package 80. The first and second magnets 41A and 41B with the attracting surfaces 41c and the magnetic housing members 55A and 55B form a magnetic chuck 60. In place of the magnets 41A and 41B, magnets 51A and 51B of the modification illustrated in FIG. 9 may be used. In this case, the same structure and the function can be achieved.

Figure 14A:
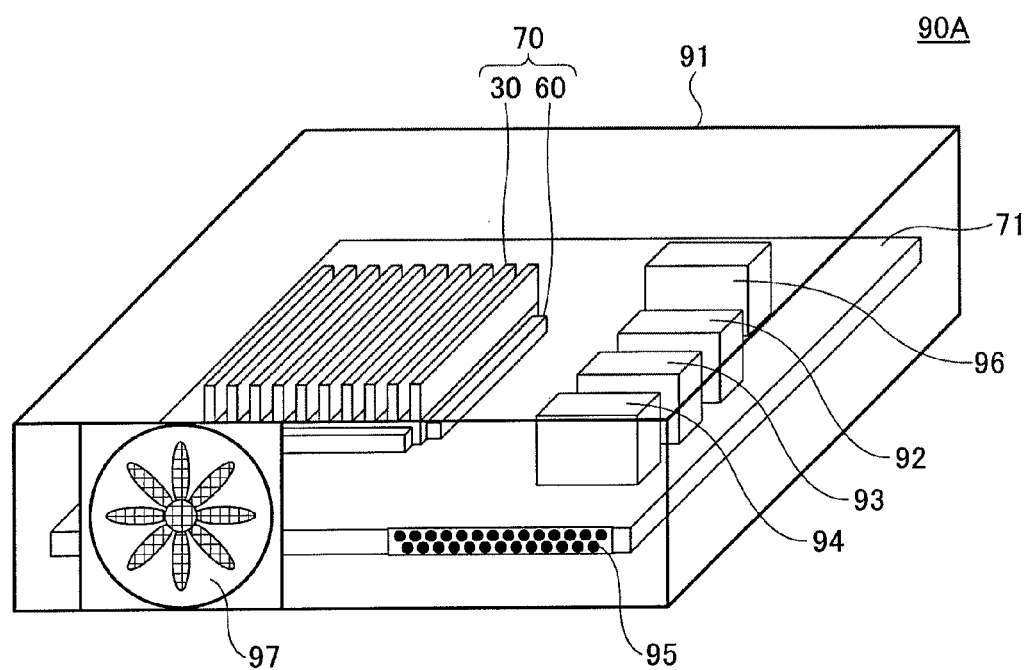
FIG. 14A illustrates an application of an electronic device with a cooling system.
Figure 14B:
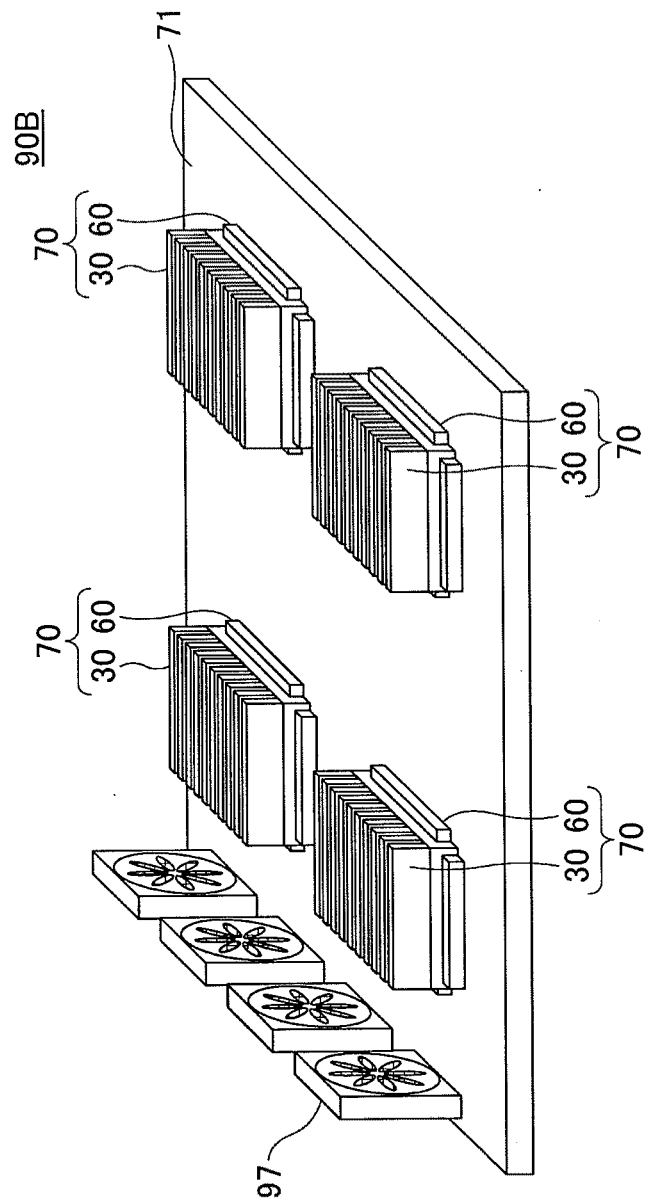
FIG. 14B illustrates another application of an electronic device with a cooling system.

FIG. 14A illustrates an application of the electronic device 70 with a magnetic chuck 60 illustrated in FIG. 12 to a rack server 90A. The electronic device 70 with a semiconductor package mounting structure is mounted on the circuit board 71 and electrically connected to a power unit 92, a connector unit 95, a controller 94 and a memory unit 93. These components are accommodated in a rack 91. A cooling fan 97 is provided to the rack 91 to supply the wind to the cooling fin 30 incorporated in the electronic device 70 in order to increase the cooling efficiency. By supplying the wind inside the rack, heat generated by the LSI chip 20 (see FIG. 12) can be removed effectively. Multiple electronic devices 70, each having a cooling fin 30 secured by a magnetic chuck 60, may be arranged on the circuit board 81, as illustrated in FIG. 14B.

In Example 2, a part of the first magnet 51A and/or the second magnet 51B, other than the attracting surfaces 41c, may be exposed without being covered with the soft magnetic housing member 55 unless there is adverse influence on the nearby interconnect or electric components.

<Embodiment 3>

FIGS. 15-23 illustrate an electronic device according to Embodiment 3. Embodiment 3 provides an electronic device with a cooling system for directing cooling a heat generator (i.e., an electronic components such as a semiconductor device) using a refrigerant. The basic idea for fastening a cooling system to a substrate on which an electronic component is mounted is the same as that in Embodiments 1 and 2, in which a first magnetic coupling unit and a second magnetic coupling unit are used as a fastening structure. A different point is that in Embodiment 3 the first magnetic coupling unit uses a magnet, and the second magnetic coupling unit uses a magnetic material which can be magnetically coupled with the first magnetic coupling unit. All or a part of the surfaces of the magnet, except for the coupling face between the magnet and the magnetic material, is covered with a soft magnetic material.

Figure 15:
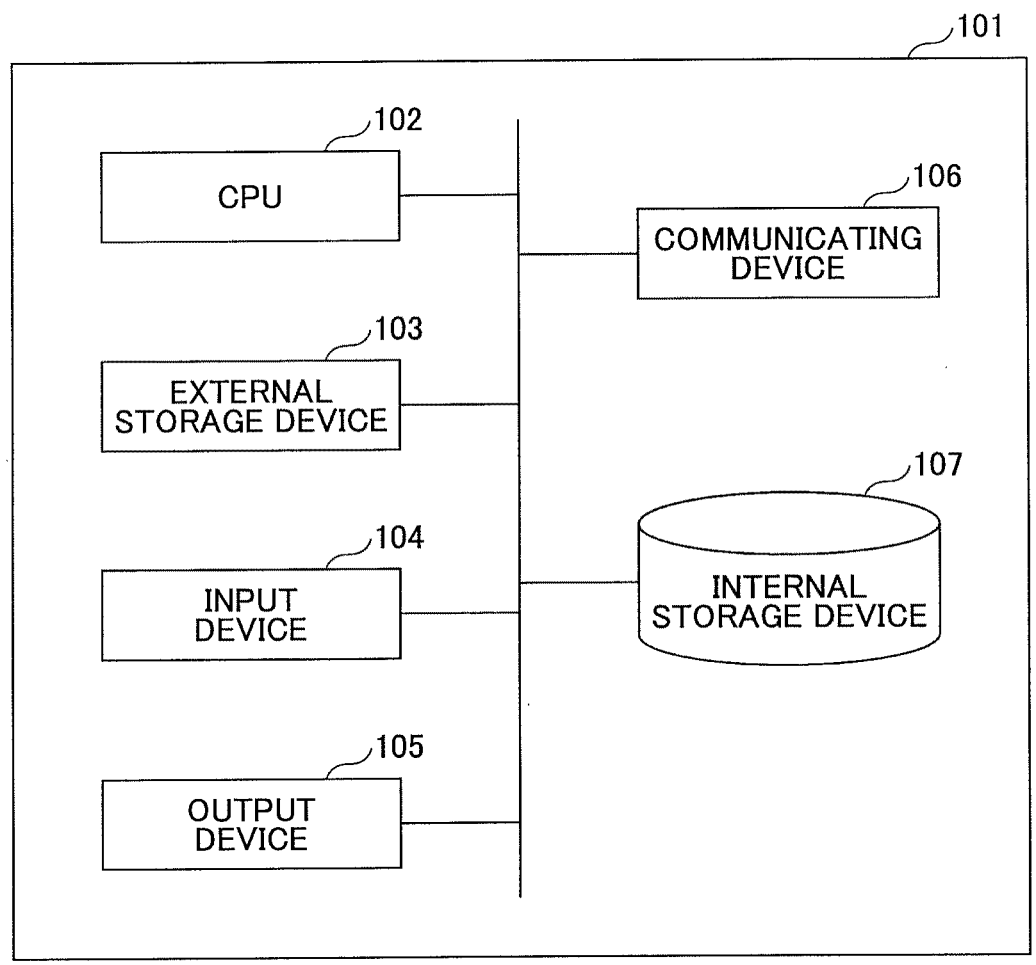
FIG. 15 is a block diagram of a server which is an application of an electronic device according to Embodiment 3.

FIG. 15 is a block diagram of a server to which the electronic device of Embodiment 3 is applied. A server 101 includes a central processing unit (CPU) 102, an external storage device 103, an input device 104, an output device 105, a communicating device 106, and an internal storage device 107, which devices are mutually connected via a bas. The CPU 102 is composed of a semiconductor package with a random access memory (RAM) not illustrated, a read only memory (ROM) not illustrated, or other circuits, and controls arithmetic processing of the server 101. The external storage device 103 writes and reads information in and from an external recording medium. The input device 104 includes a keyboard and a mouse. The communicating device 106 communicates with an external terminal device via a network. The internal storage device 107 includes, for example, a hard disk drive.

Figure 16:
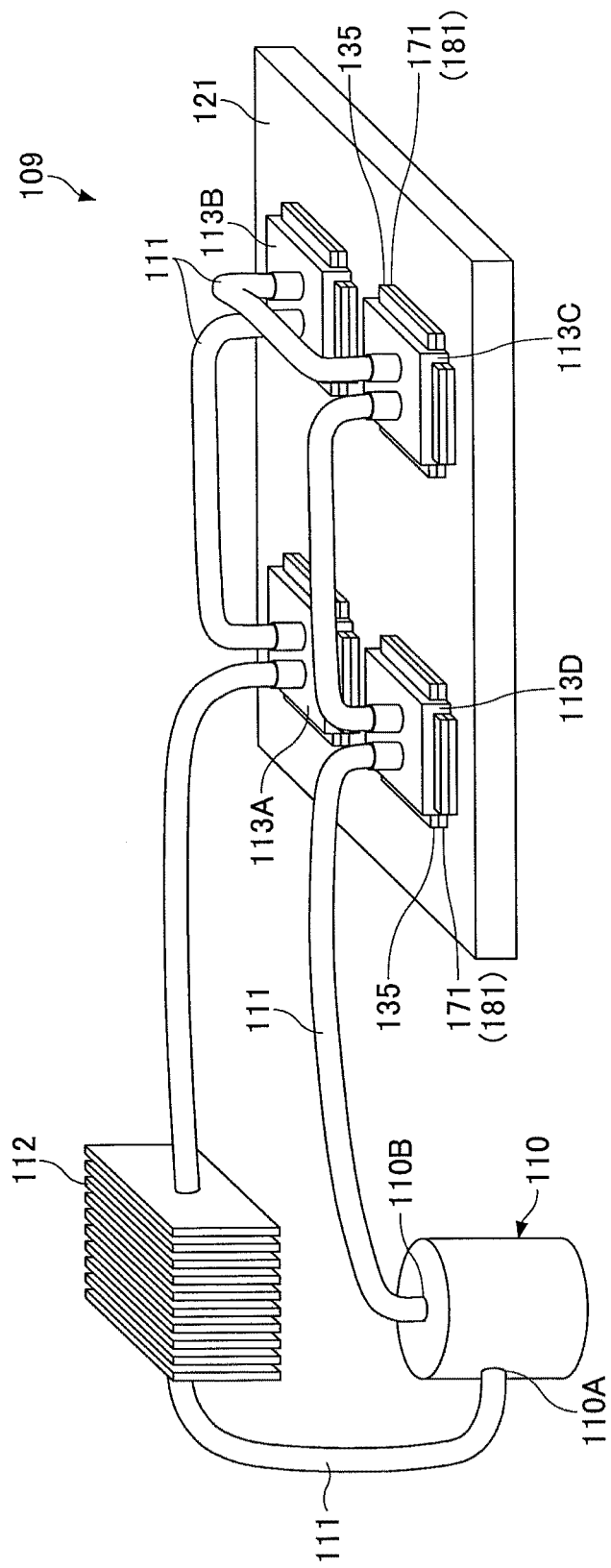
FIG. 16 is a schematic diagram of an electronic device according to Embodiment 3.

FIG. 16 is a schematic diagram illustrating a cooling apparatus 109 for cooling a semiconductor chip used for the CPU 102. The cooling apparatus 109 includes a pump 110 for applying pressure to eject a refrigerant. The ejection port 110A of the pump 110 is connected via a pipe 111 to a thermal exchanger 112. The thermal exchanger 112 is connected via a pipe 111 to multiple heat receiving cases 113A-113D (which may be collectively referred to as "heat receiving cases 113"). The heat receiving cases 113 are connected in series by the pipe 111. The most downstream heat receiving case 113D is connected to an inlet port 110B of the pump 110 via the pipe 111.

In Embodiment 3, a semiconductor chip (not illustrated in FIG. 16) serving as the CPU 102 is accommodated in one of the heat receiving cases 113 and mounted on the circuit board 121. In the example illustrated in FIG. 16, four semiconductor chips corresponding to the four heat receiving cases 113, are placed on the circuit board 121; however the number and the positions of the heat receiving cases 113 are not limited to this example.

A refrigerant used in the cooling apparatus 109 to cool the semiconductor chip is, for example, water, a mixture of water and an antifreeze liquid such as polypropylene glycol, or carbon dioxide. The pipe 111 may be a tube made of a metal or an elastic material such as a rubber. Alternatively, the pipe 111 may be a metallic pipe, such as a copper pipe.

Figure 17:
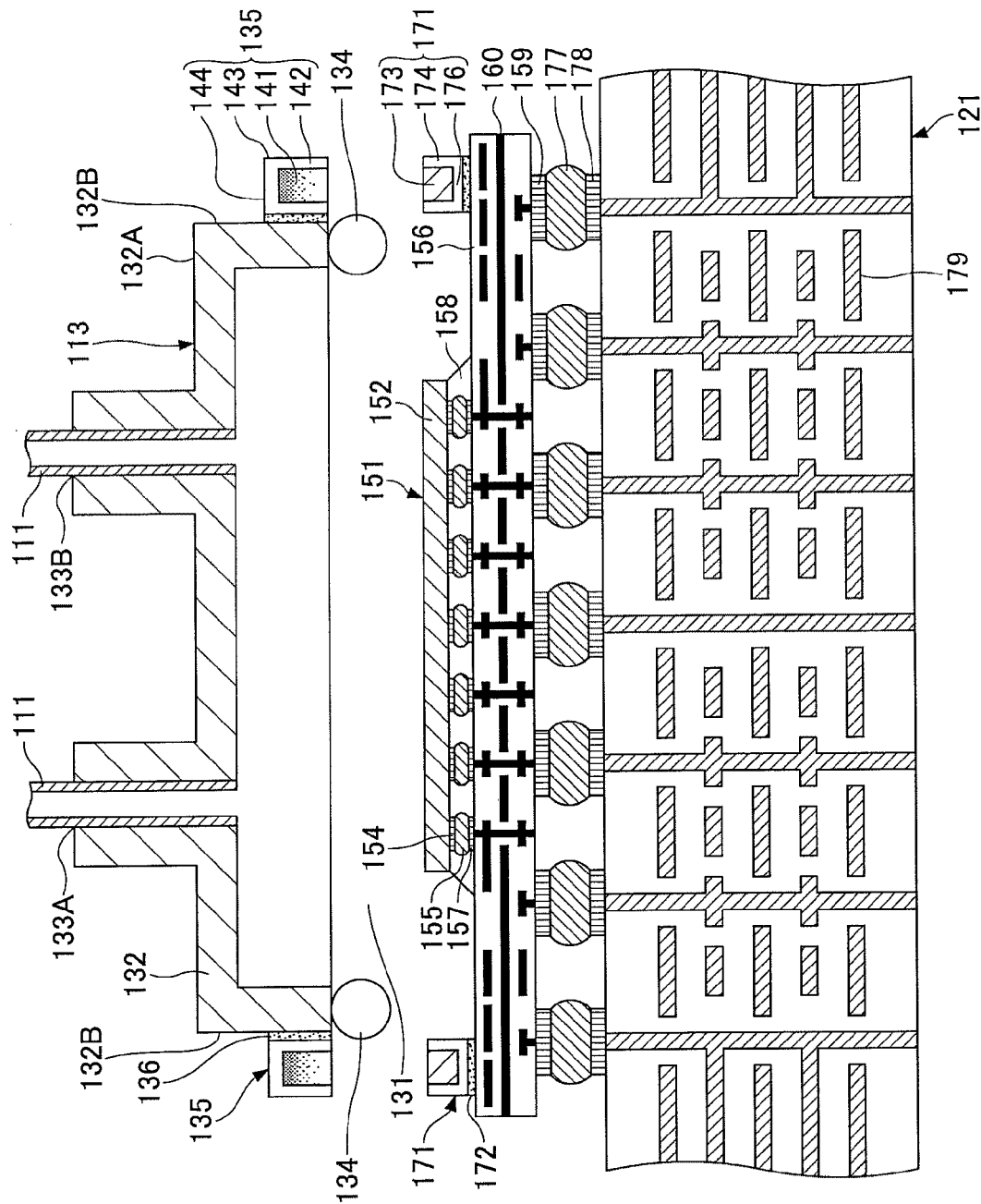
FIG. 17 is a cross-sectional view of an electronic device that includes a heat receiving case, a semiconductor package and a circuit board.

FIG. 17 is a cross-sectional view of a semiconductor device 151 arranged on a substrate 121, and a heat receiving case 113. The heat receiving case 113 includes a box-type main frame 132 with an opening 131 facing downward (i.e., facing the semiconductor device 151). First and second through-holes 133A and 133B are formed on the top 132A of the main frame 132, and a pipe 111 is connected to each of the first and second through-holes 133A and 133B. The heat receiving case 113 is made of, for example, copper or a copper alloy superior in anticorrosion property.

Figure 18:
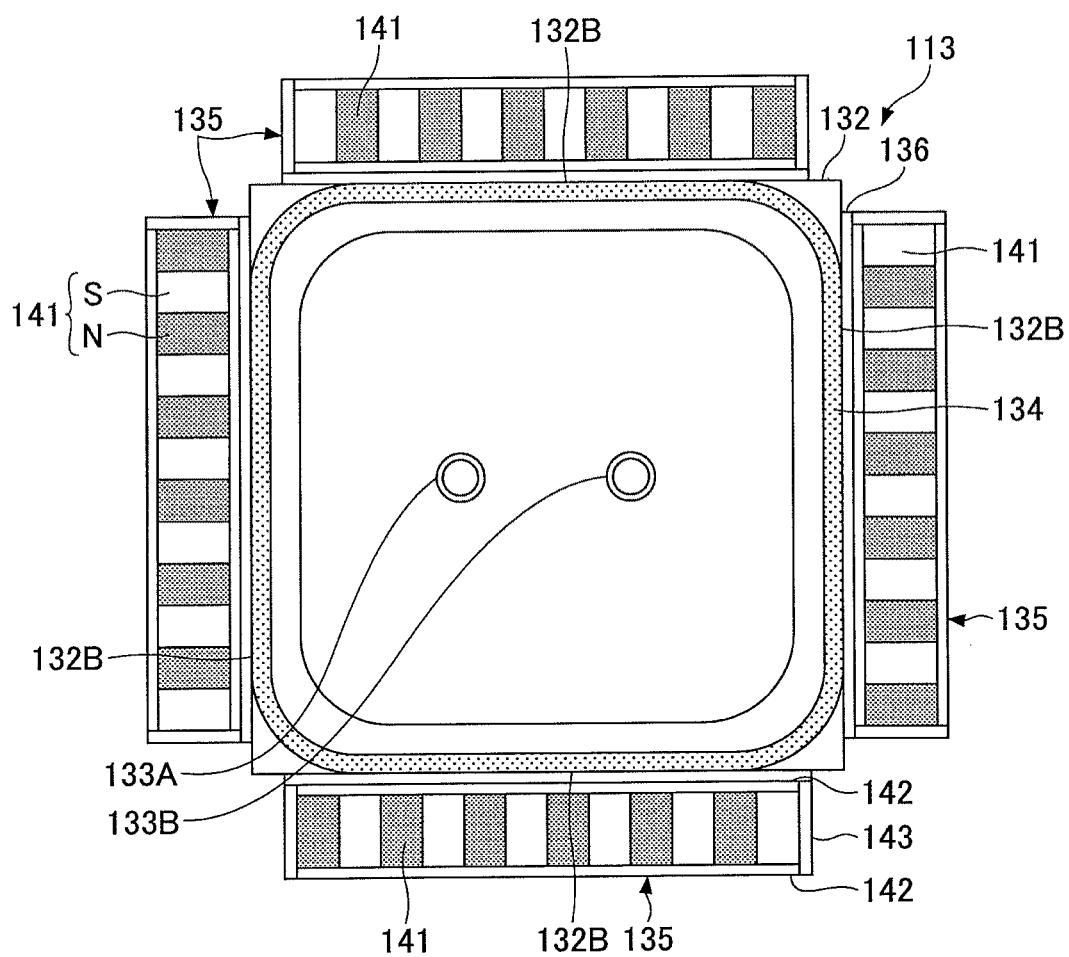
FIG. 18 is a bottom view of the heat receiving case used in Embodiment 3.

FIG. 18 is a bottom view of the heat receiving case 113 on the side of the opening 131. As illustrated in FIG. 17 and FIG. 18, a sealing material 134 is fixed via an adhesive to the bottom edge of the side wall 132B (which bottom edge faces the interposer substrate 156). The sealing material 134 is, for example, an O-ring made of a fluorine-containing rubber, silicone rubber, a natural rubber, or a polyurethane rubber.

The cross-sectional shape of the sealing material 134 is an arbitrary shape including a circle, a square, a triangle, etc.

As illustrated in FIG. 17 and FIG. 18, four first magnetic coupling units 135 are bonded by respective adhesives 136 to the outer faces of the corresponding sidewalls 132B of the main frame 132 of the heat receiving case 113. The first magnetic coupling units 135 extend in the lateral directions along the edges of the corresponding side walls 132B, and the lengths of the first magnetic coupling units 135 are substantially the same as those of the edges of the corresponding side walls 132B.

Figure 19:
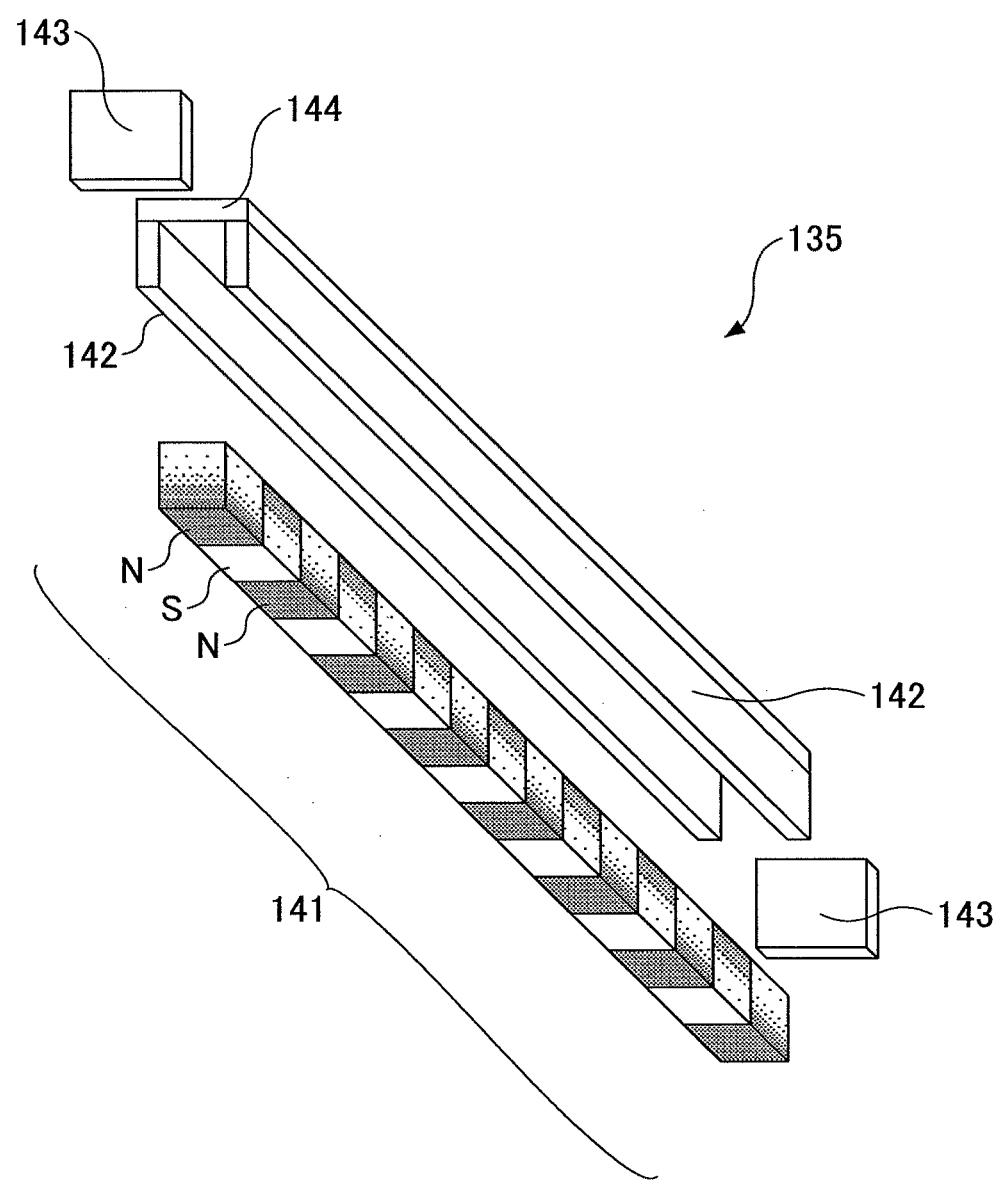
FIG. 19 is an exploded perspective view of the first magnetic coupling part used in the electronic device of Embodiment 3.

FIG. 19 is an exploded perspective view of the first magnetic coupling unit 135. The first magnetic coupling unit 135 has a first magnet 141 in the shape of a rectangular solid. The first magnet 141 is magnetized such that S poles and N poles align alternately. This is equivalent to the arrangement in which multiple magnets with opposite magnetisms are arranged alternately along the side wall 132B of the main frame 132.

The first magnetic coupling unit 135 includes plate-like soft magnetic materials 142, 143, and 144 which serve as shielding materials to confine magnetic flux lines. The soft magnetic materials 142, 143 and 144 are magnetically coupled to the first magnet 141 except for the bottom face of the first magnet 141 (that faces the interposer substrate). A pair of soft magnetic materials 142 covers two parallel long faces of the first magnet 141. One of the soft magnetic materials 142 is adhered to the side wall 132B of the main frame 132 of the heat receiving case 113 via an adhesive 136, as illustrated in FIG. 18. Returning to FIG. 19, soft magnetic materials 143 cover the two end faces of the first magnet 141. Still another soft magnetic material 144 covers the top face (opposite to the exposed surface facing the interposer substrate) of the first magnet 141.

The first magnet 141 is made of a hard magnetic material with a high coercive force, for example, a permanent magnet including an oxide magnet such as a ferrite magnet, and a metallic magnet such as a Neodymium-Iron magnet, an Alnico magnet, or a samarium-cobalt magnet.

The soft magnetic materials 142-144 are made of, for example, iron, silicon steel, permalloy, sendust alloy, permendur, Kovar (registered trademark), 42-alloy or 52-alloy which is a nickel alloy. The soft magnetic materials 142-144 may be bonded by an adhesive to the first magnet 141.

Returning to FIG. 17, explanation is made of a semiconductor device 151 to which the heat receiving case 113 is secured. In Embodiment 3, the semiconductor device 151 includes a semiconductor chip 152 mounted on an interposer substrate 156 (which may be referred to simply as "interposer substrate 156").

The semiconductor chip 152 has a semiconductor circuit formed on a substrate, and multiple electrodes 154 are formed on the bottom face (facing the interposer substrate 156). Solder 155 is provided on the electrodes 154 such that the electrodes 154 of the semiconductor chip 152 are electrically connected via the solder 155 to corresponding electrodes 157 of the interposer substrate 156. The gap between the semiconductor chip 152 and the interposer substrate 156 is filled with an underfill material 158 such as an epoxy resin with ceramic filler mixed therein.

The interposer substrate 156 is a resin substrate in this example. The electrodes 157 are formed on one of the surfaces of the interposer substrate 156 on which surface the semiconductor chip 152 is to be connected. Electrodes 159 are formed on the other surface of the interposer substrate 156. A circuit 60 is formed inside the interposer substrate 156.

Figure 20:
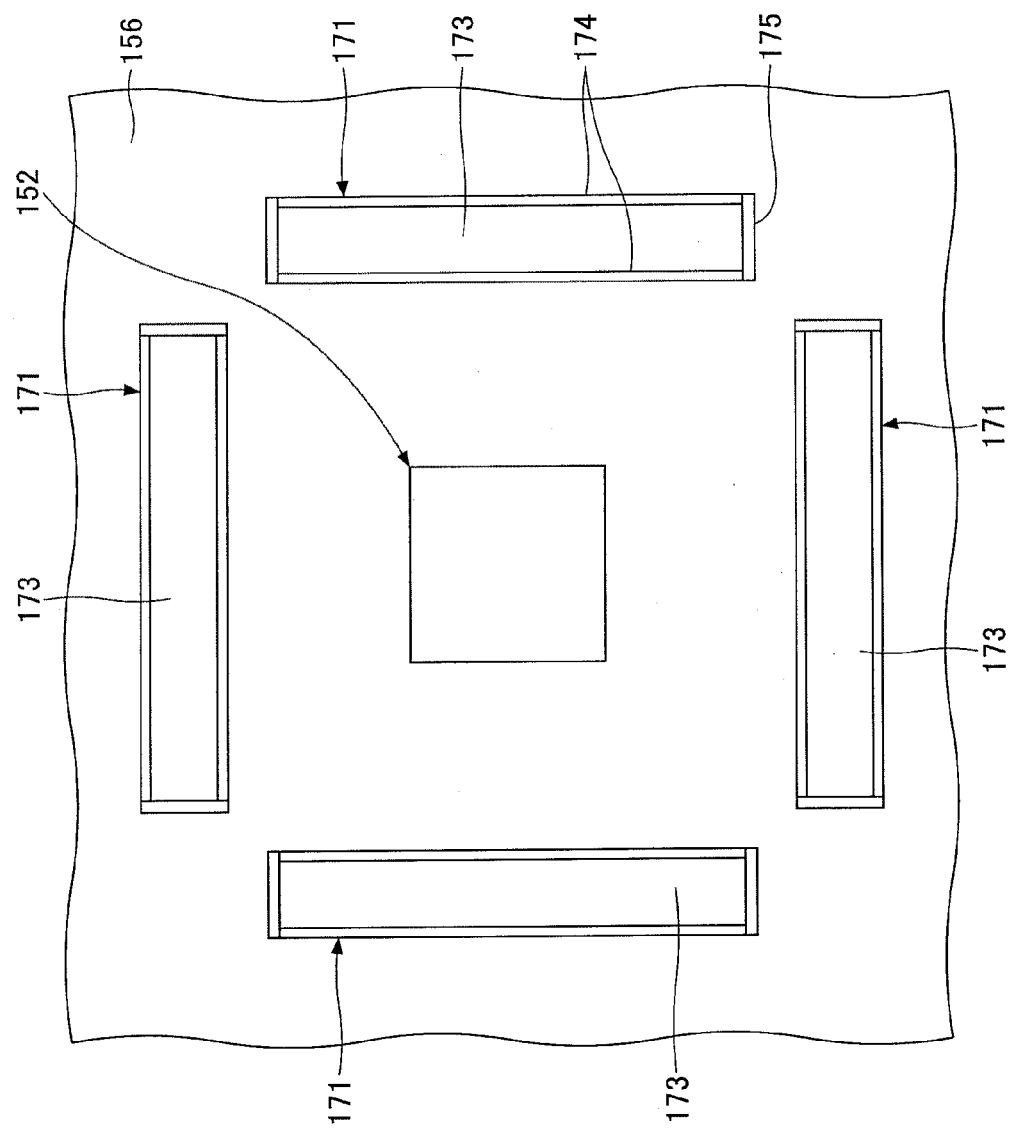
FIG. 20 is a plan view illustrating the semiconductor chip and the second magnetic coupling part arranged on the interposer used in the electronic device of Embodiment 3.

A second magnetic coupling unit 171 is bonded by an adhesive 172 to said one of the surfaces of the interposer substrate 156 (to which the semiconductor chip 152 is to be connected). FIG. 20 is a plan view of the interposer substrate 156. Four second magnetic coupling units 171 are fixed to the interposer substrate 156 so as to surround the semiconductor chip 152, as illustrated in FIG. 20. The second magnetic coupling units 171 face the corresponding first magnetic coupling units 135 illustrated in FIG. 18.

Each of the second magnetic coupling units 171 has a coupling material 173 of a rectangular solid. The coupling material 173 is made of a soft magnetic material, such as iron, silicon steel, permalloy, sendust alloy, permendur, Kovar (registered trademark), 42-alloy or 52-alloy which is a nickel alloy.

The second magnetic coupling unit 171 includes soft magnetic materials 174, 175 and 176 that are magnetically attached to the surfaces of the coupling material 173 except for the top face (i.e., the coupling surface with the first magnetic coupling unit 135) and serve as shielding materials against the magnetic flux lines.

The soft magnetic materials 174-176 can be made of the same material as that of the first magnet 141 and the soft magnetic materials 142-143 provided to the heat receiving case 113. The coupling material 173 and the soft magnetic materials 174-176 may be formed as a single unit. Alternatively, the coupling material 173 and the soft magnetic materials 174-176 may be made of different soft magnetic materials.

Although in FIG. 18, the sealing material 134 is provided to the heat receiving case 113, the sealing material 134 may be provided to the interposer substrate 156, or it may be provided to both the heat receiving case 113 and the interposer substrate 156.

Returning again to FIG. 17, explanation is made of the circuit board 121 on which the semiconductor device 151 is mounted. The circuit board 121 has an electric circuit formed inside it, and electrodes 178 arranged on one of the major surfaces (facing the interposer substrate 156). The interposer substrate 156 of the semiconductor device 151 is mounted on the electrodes 178 via the solder 177. Other electrical components, such as capacitors, are also mounted on the circuit board 121.

Next, how the cooling apparatus 109 is incorporated is explained.

As illustrated in FIG. 17, the interposer substrate 156 with the semiconductor chip 152 is mounted on the circuit board 121. Then, four second magnetic coupling units 171 are fixed by the adhesive 172 to the interposer substrate 156 so as to surround the semiconductor chip 152. Accordingly, the coupling material 173 of each of the second magnetic coupling units 171 is secured to the interposer substrate 156 via the soft magnetic material 176. The surfaces of the coupling material 173 are covered with the soft magnetic materials 174-176, except for the top face (that is, the coupling surface with the magnet 141 of the first magnetic coupling unit 135).

On the other hand, a first magnetic coupling unit 135 is provided to each of the side walls 132B of the main frame 132 via adhesive 136. Four first magnets 141 are fixed by the adhesive 136 to the side walls of the heat receiving case 113 via the soft magnetic material 142. The first magnet 141 is covered with the soft magnetic materials 142-144, except for the coupling surface (that is, the bottom face in FIG. 17) magnetically coupled to the second magnetic coupling unit 171.

Figure 21:
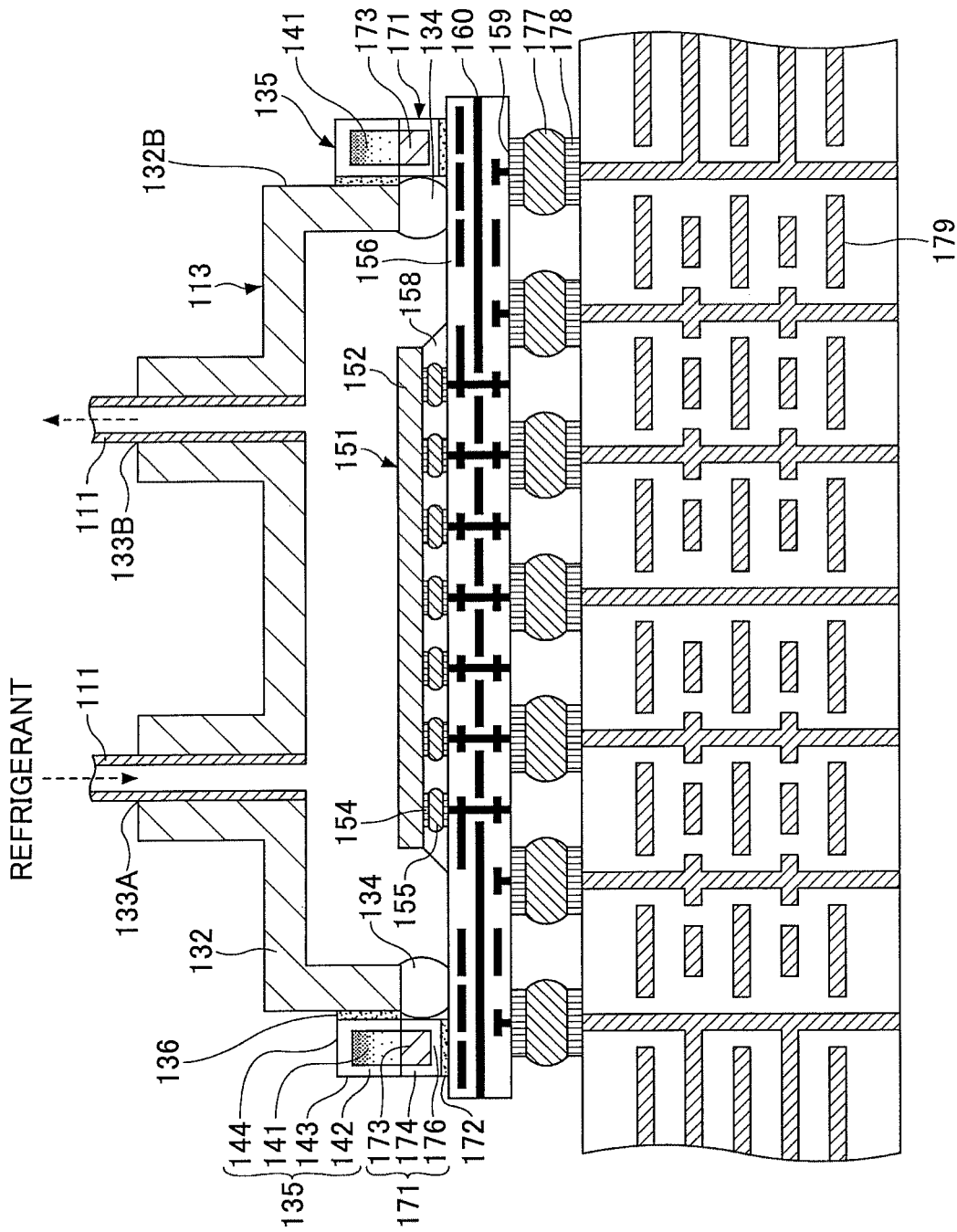
FIG. 21 is a cross-sectional view of the electronic device in which a heat receiving case is coupled to a semiconductor package in Embodiment 3.

From this state, the heat receiving case 113 is secured to the interposer substrate 156 so as to cover the semiconductor chip 152, as illustrated in FIG. 21. Thus, the semiconductor chip 152 is accommodated in the inner space of the heat receiving case 113. Upon covering the semiconductor chip 152 with the heat receiving case 113, the first magnets 141 of the first magnetic coupling unit 135 attached to the heat receiving case 113 are magnetically coupled with the coupling material 173 of the magnetic coupling unit 171 provided to the interposer substrate 156.

The distance from the top face of the interposer substrate 156 to the bottom end of the side wall 132B of the heat receiving case 113 is set smaller than the height of the sealing material 134 without application of an external force on it. Accordingly, when the heat receiving case 113 is secured to the interposer substrate 156, the sealing material 134 is compressed against the interposer substrate 156. As a result, the opening 131 of the heat receiving case 113 is sealed with respect to the interposer substrate 156 by means of the sealing material 134, while keeping the semiconductor chip 152 inside the heat receiving case 113.

Then, the pipes 111 (see FIG. 16) are inserted in the through-holes 133A and 133B of the heat receiving case 113. The heat receiving case 113 is connected via the pipes 111 to the pump 110 and the thermal exchanger 112, as illustrated in FIG. 16 to complete the cooling apparatus 109. The heat receiving case 113 may be secured to the interposer substrate 156 after the pipes 111 are connected to the heat receiving case 113.

As illustrate in FIG. 21, when the first magnetic coupling unit 135 and the second magnetic coupling unit 171 are magnetically coupled, the first magnet 141 of the first magnetic coupling unit 135 and the coupling material 173 of the second magnetic coupling unit 171 are surrounded by the soft magnetic materials 142-144 and 174-176. To be more precise, the side faces of the first magnet 141 and the coupling material 172 are covered with the soft magnetic materials 142 and 174, respectively. The top face is covered with the soft magnetic materials 144 and the bottom face is covered with the soft magnetic material 176.

Because the magnetism (or the direction of the magnetic poles) of the soft magnetic materials 142-144 and 174-176 easily change, the magnetic flux lines tend to pass through the soft magnetic materials 142-144 and 174-176 more easily, compared with the surroundings. As the magnetic flux lines remaining inside the soft magnetic materials 142-144 and 174-176 increase, the magnetic flux lines leaking and stretching outside the soft magnetic materials 142-144 and 174-176 decrease. Consequently, the magnetic field generated between the first magnet 141 and the coupling material 173 can be confined in the soft magnetic materials 142-144 and 174-176.

Figure 22:
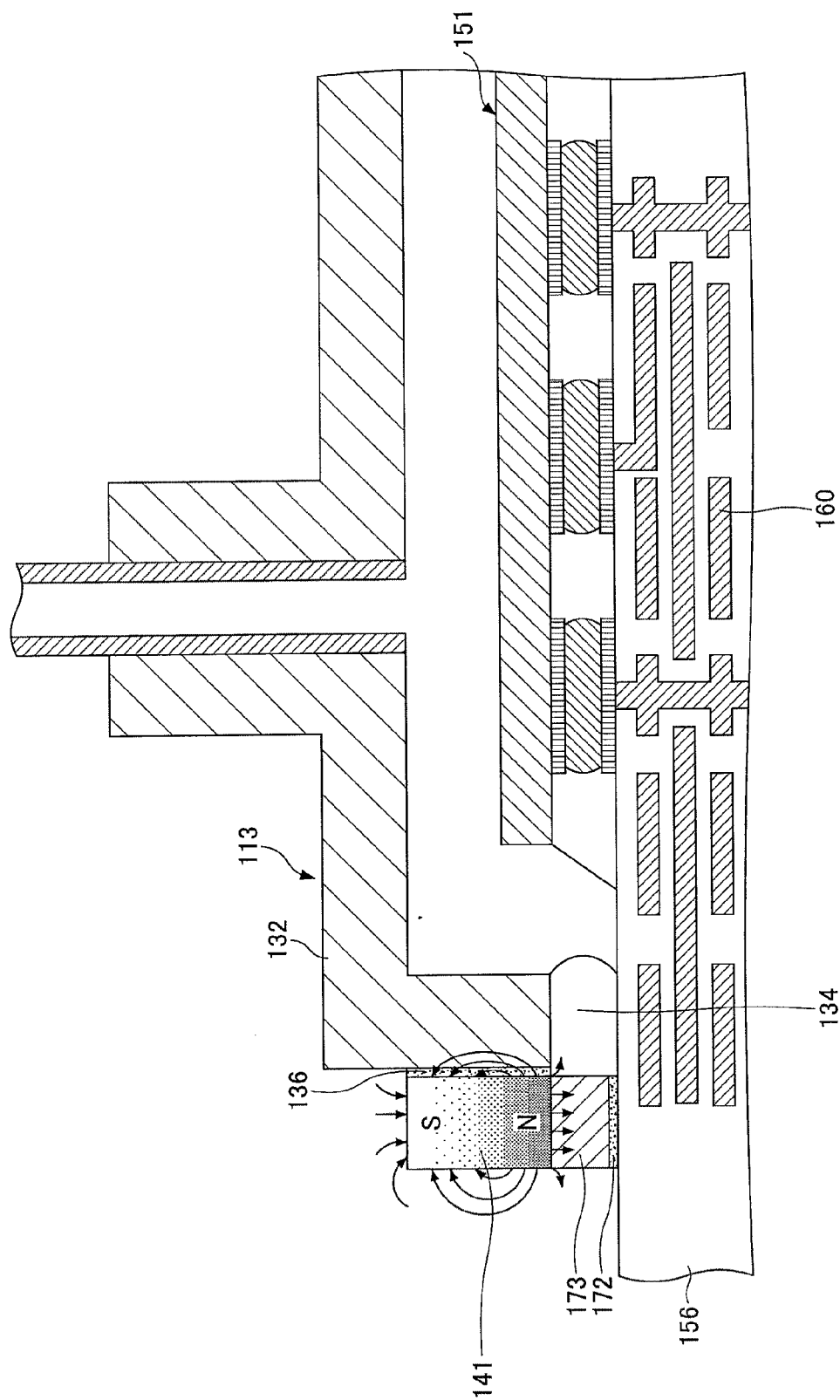
FIG. 22 is a schematic diagram of an electronic device of a comparison example, illustrating distribution of the magnetic flux.

FIG. 22 illustrates a comparison example showing the magnetic flux lines stretching out into the surroundings without soft magnetic materials 142-144 and 174-176. In this case, the magnetic flux lines broadly stretch out near the first magnet 141, and the magnetic field is likely to act on the electrical components located near the heat receiving case 113 or the circuit 160 of the interposer substrate 156.

Figure 23:
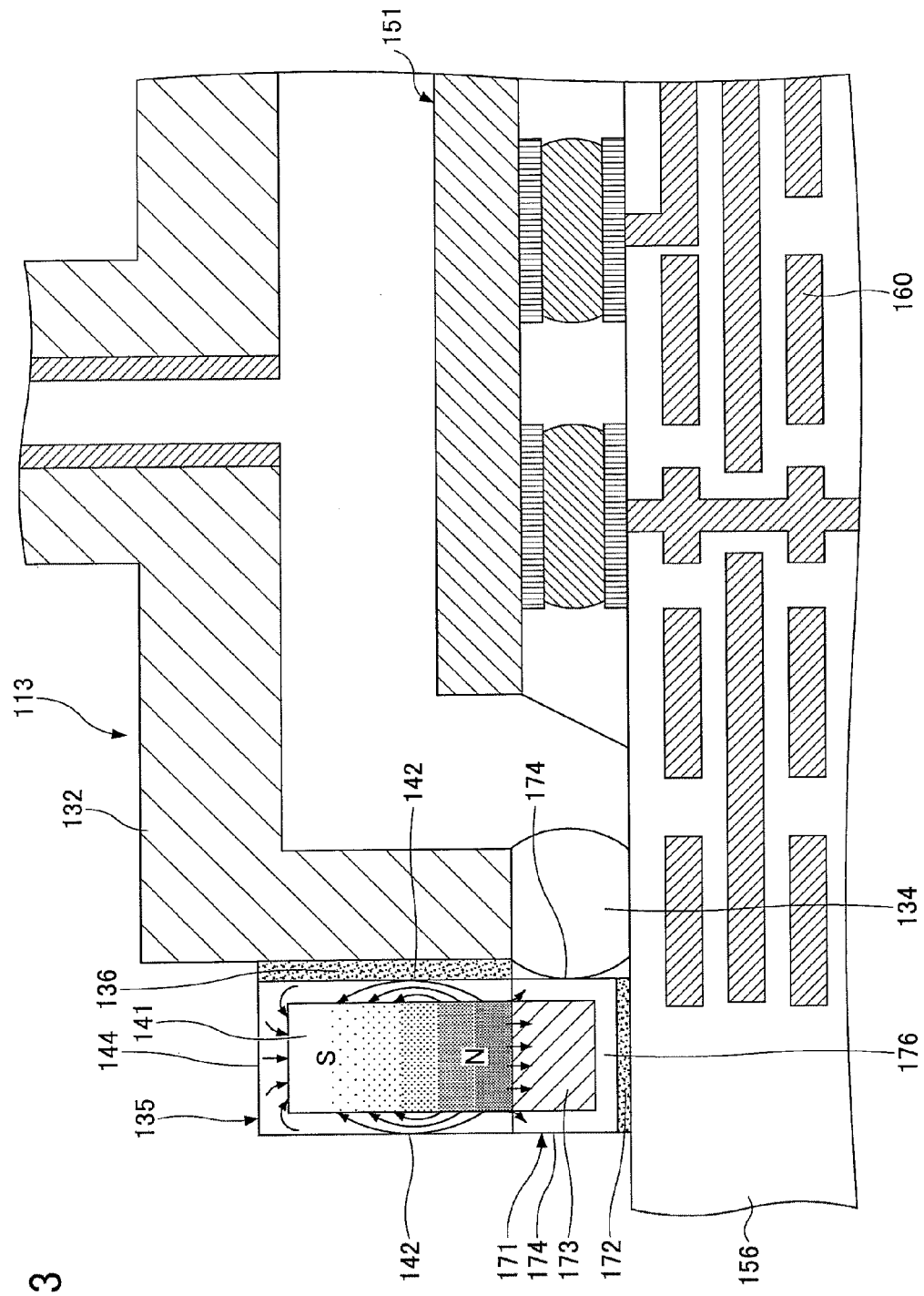
FIG. 23 illustrates distribution of the magnetic flux in an electronic device according to Embodiment 3.

FIG. 23 illustrates the effect of the structure of Embodiment 3, in which soft magnetic materials 142-144 and 174-176 are arranged along the magnetic flux path of the first magnet 141. To be more precise, the soft magnetic materials 142-144 and 174-176 are arranged on the closed path extending from one of the magnetic poles (S pole or N pole) to the other (N pole or S pole) of the first magnet 141, which arrangement can prevent the magnetic flux lines of the first magnet 141 from stretching out. Consequently, the magnetic field does not act on the circuit 160 of the interposer substrate 156 or the electric components provided near the heat receiving case 113, because it is sufficiently weakened so as not to influence on the nearby circuit or electric components.

Returning to FIG. 21, how the semiconductor chip 152 of the semiconductor device 151 is cooled is explained. When cooling the semiconductor chip 152, the pump 110 (see FIG. 16) is driven to eject the refrigerant. The refrigerant is cooled in the thermal exchanger 112, and flows into the heat receiving case 113 via the pipe 111 and the first through-hole 133A, as indicated by the dashed arrow. The semiconductor chip 152 held inside the heat receiving case 113 is cooled directly by the refrigerant and the heat is taken away from the semiconductor chip 152. The refrigerant having cooled the semiconductor chip 152 is output from the heat receiving case 113 via the second through-hole 133B. Having flowed through the multiple heat receiving cases 113A through 113D (see FIG. 16) one by one, the refrigerant returns to the pump 110 and is ejected again from the ejection pot 110A. The cooling apparatus 109 cools the semiconductor chip 152 by circulating the refrigerant.

To increase the area size of the back face (opposite to the mounting face) of the semiconductor chip 152, the surface of the semiconductor chip 152 may be roughened or fine grooves may be formed. This arrangement can improve the cooling efficiency.

Next, explanation is made of removal of the heat receiving case 113 from the interposer substrate 156 to exchange or remove the semiconductor chip 152. The heat receiving case 113 is removed when repairing or exchanging the semiconductor chip 152.

To remove the heat receiving case 113 from the interposer substrate 156, the heat receiving case 113 is rotated relative to the interposer substrate 156 to cause the first magnet 141 and the coupling material 173 to be out of alignment. Since the coupling surfaces of the first magnet 141 and the coupling material 173 are elongated rectangles, the area size of the coupling surfaces of the first magnet 141 and the soft magnetic material 172 decreases as the heat receiving case 113 is rotated relative to the interposer substrate 156, and the coupling force can be easily reduced. The heat receiving case 113 may be displaced in parallel to shift the position of the first magnet 141. To realize this, a space for rotating the heat receiving case 113 is provided above the interposer substrate 156.

Then, the heat receiving case 113 is brought upward and removed from the interposer substrate 156 to expose the semiconductor chip 152 having been accommodated in the heat receiving case 113.

Then, the solders 177 connecting the interposer substrate 156 to the circuit board 121 are heated and melted to remove the interposer substrate 156 from the circuit board 121. The interposer substrate 156 with a new semiconductor chip 152 mounted may be mounted again on the circuit board 121 as necessary. The process for mounting the interposer substrate 156 with the semiconductor chip 152 on the circuit board 121 and cooling the semiconductor chip 152 in the heat receiving case 113 is the same as that explained above.

In this manner, in Embodiment 3, soft magnetic materials 142-144 are arranged as shielding materials along the magnetic flux path on the surface of the first magnet 141, which magnet is used to secure the heat receiving case 113 to the interposer substrate 156, to prevent the magnetic flux lines from stretching out into the circumference. Since the soft magnetic materials 142-144 allow the magnetic flux lines to pass through easily, the magnetic flux lines generated from the first magnet 141 concentrate in the soft magnetic materials 142-144. Consequently, leakage of the magnetic field can be prevented. When the heat receiving case is secured onto the interposer substrate 156, the soft magnetic materials 142-144 and 174-176 surround the first magnet 141, and the magnetic flux lines are prevented from leaking in any directions. Thus, the nearby circuits or electrical components are unlikely to be subjected to the influence of the magnetic field.

The first magnet 141 is covered with soft magnetic materials 142-144, except for the coupling surface that faces the coupling material 173. The coupling material 173 is covered with soft magnetic materials 174-176, except for the coupling surface that faces the first magnet 141. Upon fastening the heat receiving case 113 onto the interposer substrate 156, the entire surfaces of the first magnet 141 and the coupling material 173 are covered with the soft magnetic materials 142-144 and 174-176.

Because S poles and N poles are arranged alternately in the first magnet 141 on the surface extending parallel to the top face (i.e., the semiconductor chip mounting face) of the interposer substrate 156, a strong attractive force can be obtained and the heat receiving case 113 can be secured reliably to the interposer. When the heat receiving case 113 is secured onto the interposer substrate 156 to keep the semiconductor chip 152 in the enclosed space, the sealing material 134 provided to the heat receiving case 113 is compressed by the first magnet 141 and leakage of the refrigerant is prevented without fail.

Since the refrigerant is supplied directly onto the semiconductor chip 152 in the heat receiving case 113, the semiconductor chip 152 is cooled efficiently. When removing the semiconductor chip 152, the heat receiving case 113 is removed easily by simply displacing the first magnet 141 from the coupling position with the coupling material 173. Accordingly, reworking is carried out easily.

Next, explanation is made of a manufacturing process of the electronic device of Embodiment 3.

The interposer substrate 156 is made of glass ceramics with a size of 80×80 mm and a thickness of 5 mm. The semiconductor chip 152 with a size of 25×25 mm is used. As the second magnetic coupling unit 171, a coupling material 173 with dimensions of 10×2.5×70 mm, which is covered with permalloy soft magnetic materials 174-176 with a thickness of 1 mm except for the coupling surface with respect to the first magnetic coupling unit 135, is used. The second magnetic coupling unit 171 is fixed to the interposer substrate 156 by an epoxy adhesive 172.

The main frame 132 of the heat receiving case 113 is fabricated by forming a recess of 60×60 mm with a depth of 4 mm in the center of a copper plate of 80×80 mm with a thickness of 8 mm. Through-holes 133A and 133B are formed on the top face 132A of the main frame 132 (see FIG. 17), and copper pipes with a diameter of 3 mm are inserted in the through-holes 133A and 133B. The first magnetic coupling unit 135 is formed by a 10×5×70 mm ferrite magnet, which magnet is covered with permalloy soft magnetic materials 142-144 with a thickness of 1 mm, except for the coupling surface (the bottom face in FIG. 17) with respect to the coupling material 173 of the second magnetic coupling unit 171. The first magnetic coupling unit 135 is fixed to the heat receiving case 113 by an epoxy adhesive 136.

The ferrite magnet used as the first magnet 141 is magnetized such that S poles and N poles align alternately at a pitch of 6 mm. After the magnetization, a pair of sheets sandwiching magnetic powder is placed over the first magnet 141 to confirm the magnetization. From the pattern produced by the magnetic powder, magnetization with opposite magnetic polarities appearing alternately is observed.

After the first magnet 141 is covered with the soft magnetic materials 142-144 except for the coupling surface (bottom face) with respect to the second magnetic coupling unit, the sheets sandwiching magnetic powder are placed again over the first magnetic coupling unit 135 via the soft magnetic materials 142-144. This time, a pattern produced by a magnetized body is not observed. It is understood that the influence of the magnetic field toward the circumference of the first magnet 141 can be reduced effectively.

The first magnetic coupling unit 135 is adhered to the side wall of the heat receiving case 113 such that the coupling surface (bottom face) aligns with the bottom edge of the main frame 132 of the heat receiving case 113. A sealing material 134 (for example, an O-ring made of a fluorine elastomer with a cross-sectional diameter of 4 mm) is fixed by an adhesive to the bottom edge of the main frame 132.

Pure water is introduced as the refrigerant and circulated by the pump 110 at a rate of 3 liter per minute in the cooling apparatus 109 (see FIG. 16) assembled onto the interposer substrate 156. The semiconductor chip 152 is cooled without water leakage.

Under the application of a rotational force to the heat receiving case 113 relative to the interposer substrate 156, the heat receiving case 113 can be removed easily from the interposer substrate 156. When removing the heat receiving case 113, the pipe 111 on the inlet side is removed and the compressed air is supplied into the heat receiving case 113 to purge the refrigerant remaining in the heat receiving case 113.

It is desired for the first magnet 141 to have a multipole structure with N poles and S poles arranged alternately; however, a magnet with a single pole structure may be used. In this case, two first magnets 141 positioned at opposite sides of the heat receiving case 113 have the same magnetic polarity. The shape of the first magnet 141 is not limited to a rectangular solid.

The second magnetic coupling unit 171 may be fixed to the circuit board 121. In this case, the semiconductor chip 152 may be mounted on the circuit board without using the interposer substrate 156.

The second magnetic coupling unit 171 may be fixed by an adhesive 172 to the edge of the interposer substrate 156.

The second magnetic coupling unit 171 may be fixed to the heat receiving case 113, and the first magnetic coupling unit 135 may be fixed to the interposer substrate 156.

<Embodiment 4>

Embodiment 4 is explained in conjunction with FIG. 24 through FIG. 30. In Embodiment 4, both the first and second magnetic coupling units employ magnets. The same numerical symbols are assigned to the same elements as those in Embodiment 3.

An example of electronic device of Embodiment 4 is a server 101 illustrated in FIG. 15. The server 101 includes a cooling apparatus 109 for cooling the CPU 102, as illustrated in FIG. 16. In the cooling apparatus 109, a first magnetic coupling unit 135 is provided to the outer face of one of the four side walls 132B of the main frame 132 of the heat receiving case 113. Second magnetic coupling units 181 are fixed by an adhesive 172 to a surface of the interposer substrate 156 on which the semiconductor chip 152 is mounted.

Figure 24:
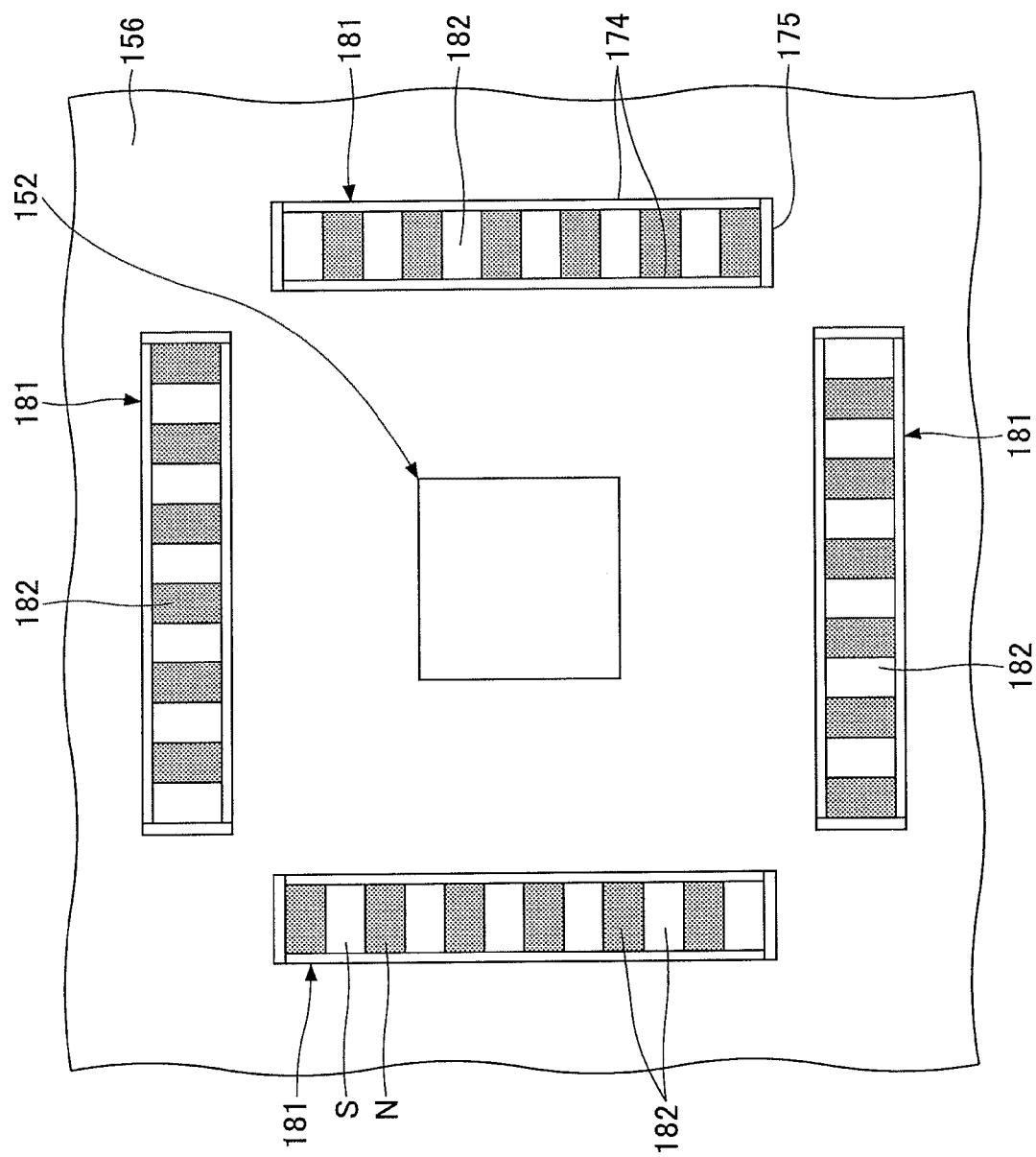
FIG. 24 is a plan view illustrating a semiconductor chip and the second magnetic coupling parts arranged on an interposer according to Embodiment 4.
Figure 25:
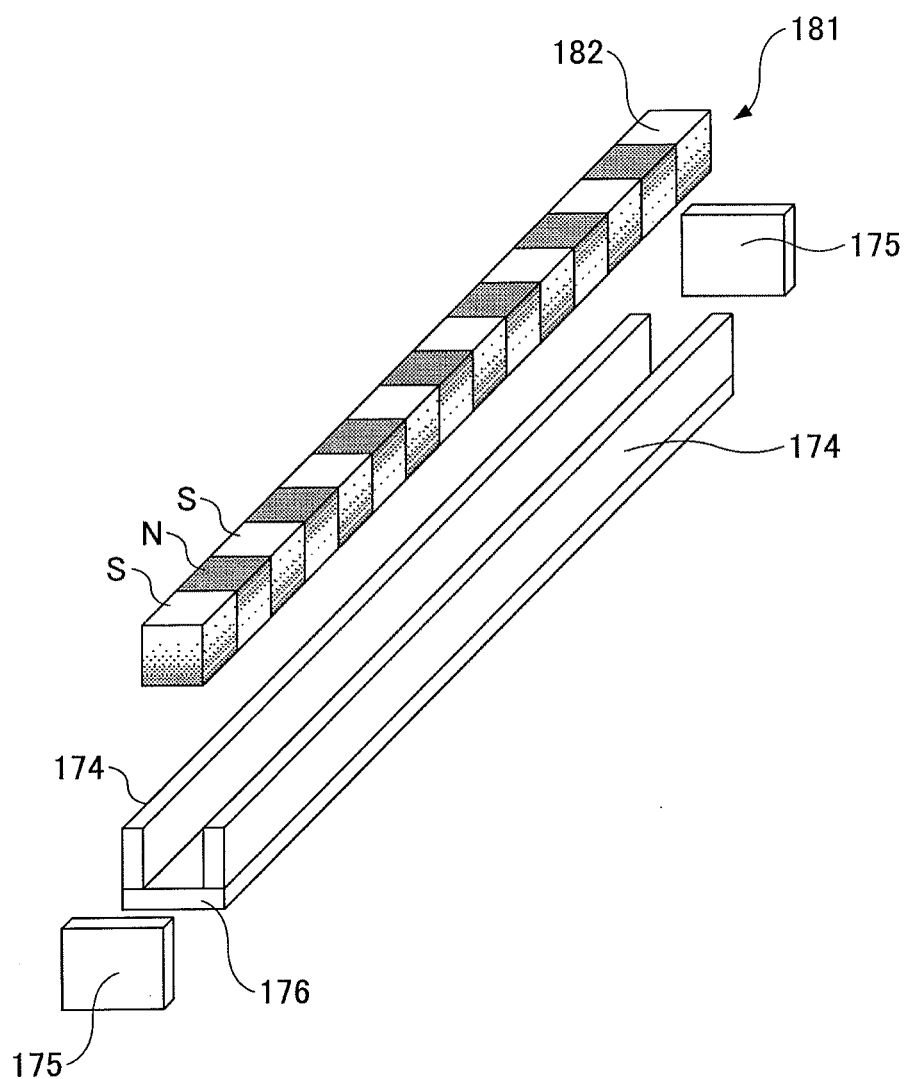
FIG. 25 is an exploded perspective view of the second magnetic coupling part used in an electronic device of Embodiment 4.

As illustrated in the plan view of FIG. 24, the second magnetic coupling units 181 are arranged at four positions so as to surround the semiconductor chip 152. Each of the second magnetic coupling units 181 includes a second magnet 182 of a rectangular solid, as illustrated in the exploded view of FIG. 25. Plate-like soft magnetic materials 174, 175 and 176 serving as shielding materials are magnetically attached to the surfaces of the second magnet 182, except for the coupling surface (i.e., the top face in FIG. 25) with respect to the first magnetic coupling unit 135. To be more precise, a pair of soft magnetic materials 174 cover the long side faces of the second magnet 182, another pair of soft magnetic materials 175 covers the end faces of the second magnet 182, and a soft magnetic material 176 covers the bottom face of the second magnet 182, which bottom face is fixed to the interposer substrate 156 via an adhesive 172.

The second magnet 182 is magnetized such that S poles and N poles align alternately. The second magnet 182 is made of the same material as that of the first magnet 141 of the first magnetic coupling unit 135 fixed to the heat receiving case 113. The soft magnetic materials 174-176 may be attached onto the second magnet 182 using an adhesive.

Figure 26:
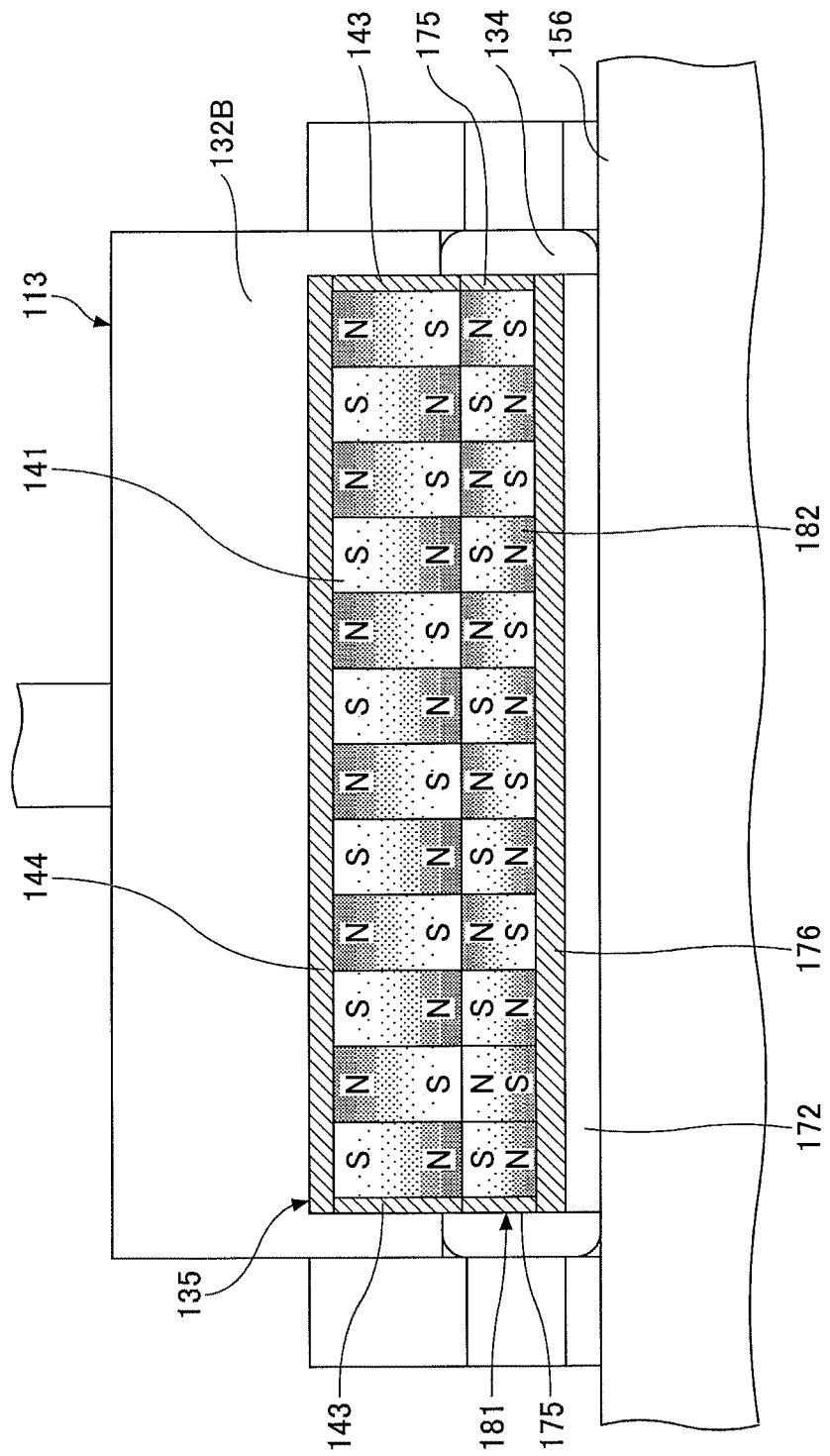
FIG. 26 illustrates an example of the pole configuration of an electronic device in which a heat receiving case is coupled to a semiconductor package according to Embodiment 4.

As illustrated in FIG. 26, the second magnetic coupling unit 181 is positioned so as to face the first magnetic coupling unit 135 fixed to the heat receiving case 113. The S poles and N poles are arranged alternately along a plane parallel to the surface of the interposer substrate 156, which alignment is in reverse order to that of the first magnet 141 of the first magnetic coupling unit 135 such that opposite magnetic polarities face each other. Accordingly, if the first magnet 141 has an alignment sequence of S, N, S, . . . , then the second magnet 182 has an alignment sequence of N, S, N, . . . .

Next, explanation is made of how the cooling apparatus 109 is assembled. First, a semiconductor chip 152 is mounted on the interposer substrate 156. The second magnetic coupling units 181 are fixed to the interposer substrate 156 by an adhesive 172 such that the coupling surface of the second magnet 182 is exposed with the other faces covered with the soft magnetic materials 174-176. The interposer substrate 156 is then mounted on the circuit board 121.

Then, as illustrated in FIG. 21, a heat receiving case 113 to which the first magnetic coupling unit 135 is fixed is placed over the interposer substrate 156 so as to cover the semiconductor chip 152. The heat receiving case 113 is connected to the pump 110 and the thermal exchanger 112 via the pipe 111 (see FIG. 16). Thus, the cooling apparatus 109 is assembled.

In this state, the first magnet 141 of the first magnetic coupling unit 135 fixed to the heat receiving case 113 is magnetically coupled with the second magnet 182 positioned on the interposer side. As illustrated in FIG. 26, S poles of the first magnet 141 and N poles of the second magnet 182 align in a direction vertical to the mounting surface of the interposer substrate 156 and are magnetically coupled with each other. Similarly, N poles of the first magnet 141 and S poles of the second magnet 182 align in a direction vertical to the interposer substrate 156 and are magnetically coupled with each other. Consequently, the heat receiving case 113 is attracted to the interposer substrate 156 and the sealing material 134 is compressed. The opening space 131 is sealed against the interposer substrate 156 with the semiconductor chip 152 accommodated in the inner space of the heat receiving case 113 to form a part of the refrigerant circulating path. When the first magnet 141 and the second magnet 182 are coupled magnetically with each other, the entire surfaces of the first magnet 141 and the second magnet 182 are covered with the soft magnetic materials 142-144 and 174-176. To be more precise, the side faces of the combination of the first magnet 141 and the second magnet 182 are covered with soft magnetic materials 142 and 174, the top face is covered with soft magnetic material 144, and the bottom face is covered with soft magnetic material 176.

Figure 27:
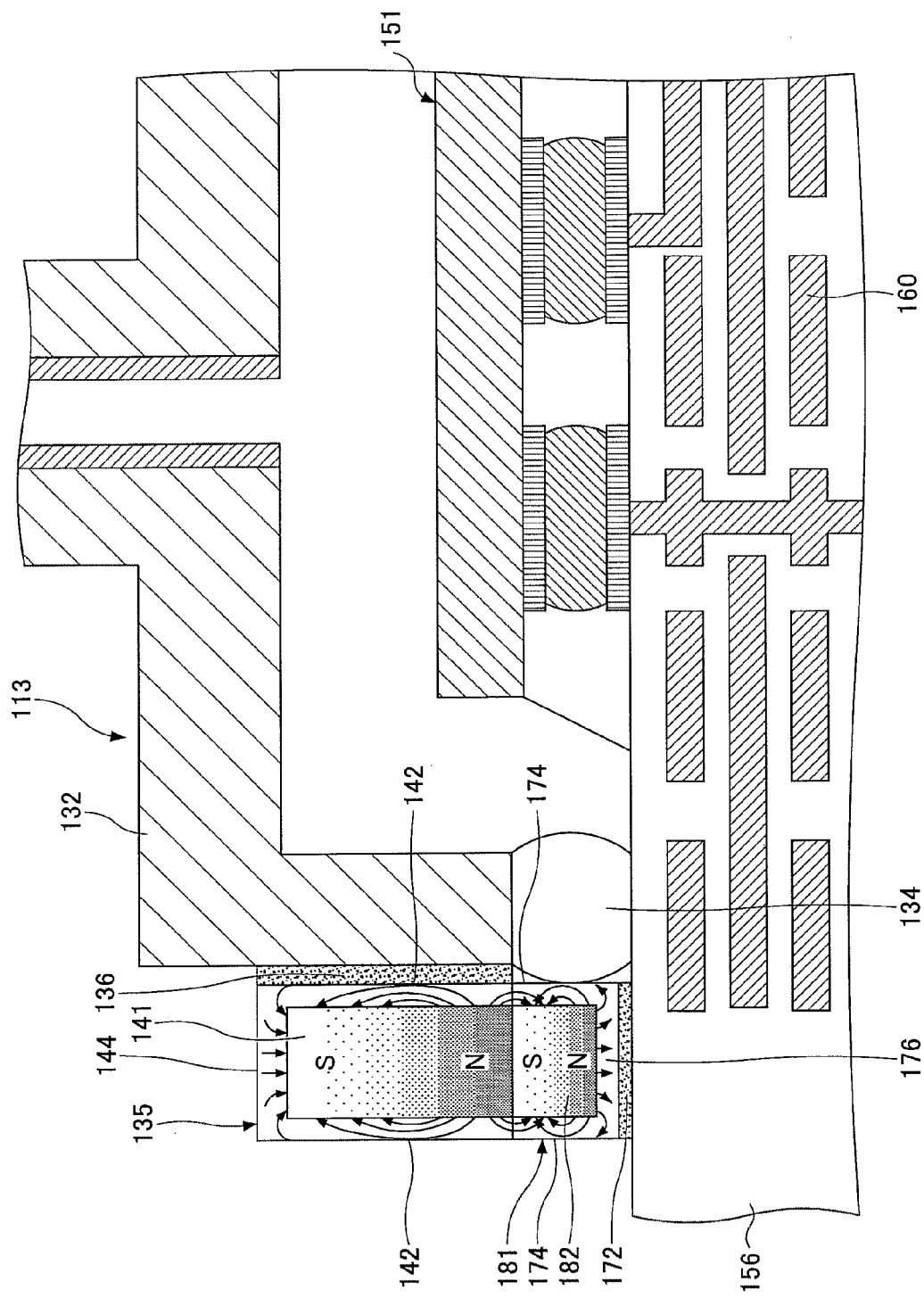
FIG. 27 illustrates distribution of the magnetic flux in an electronic device according to Embodiment 4.

FIG. 27 illustrates the magnetic flux confining effect of Embodiment 4. If the first magnet 141 and the second magnet 182 are not covered with the soft magnetic materials 142-144 and 174-176, the magnetic fluxes stretch out as illustrated in FIG. 22 and nearby components and circuit are likely to be affected by the influence of the magnetic field. In contrast, using the cooling apparatus 109 of Embodiment 4, the soft magnetic materials 142-144 and 174-176 are arranged along the magnetic flux paths of the first magnet 141 and the second magnet 182 as illustrated in FIG. 27. These soft magnetic materials 142-144 and 174-176 are placed on the closed paths extending between the magnetic poles (S poles or N poles) and the other poles (N pole or S pole) of the first magnet 141, the closed paths extending between the magnetic poles (S pole or N pole) and the other poles (N pole or S pole) of the second magnet 182, and the closed paths extending between magnetic poles of the first magnet 141 and the opposite poles of the second magnet 182.

With this arrangement, the magnetic fluxes pass through the soft magnetic materials 142-144 and 174-176 increase, while the magnetic fluxes passing outside the soft magnetic materials 142-144 and 175-176 decrease. Consequently, the magnetic fluxes are prevented from stretching out from the first magnet 141 and the second magnet 182, and the influence of the magnetic field on the nearby components mounted near the heat receiving case 113 can be made negligibly small. The process of cooling the semiconductor chip 152 is the same as that explained in Embodiment 3.

FIG. 28A, FIG. 28B, FIG. 29A and FIG. 29B illustrate how the heat receiving case 113 is removed from the interposer substrate 156. The heat receiving case 113 is removed when, for example, replacing the semiconductor chip 152. To remove the heat receiving case 113, the heat receiving case 113 is rotated relative to the interposer substrate 156 from the state illustrated in FIG. 28A to the state illustrated in FIG. 28B. The first magnet 141 of the first magnetic coupling unit 135 and the second magnet 182 of the second magnetic coupling unit 181 have alternate sequences of magnetism with S poles and N poles arranged alternately, and the first magnet 141 and the second magnet 182 are arranged such that opposite magnetic poles face each other. When the heat receiving case 113 is rotated relative to the interposer substrate 156, the first magnet 141 is displaced from the second magnet 182 and same magnetic poles come to face each other. The first magnet 141 and the second magnet 182 repel each other, and the coupling between the first magnet 141 and the second magnet 182 is weakened. Consequently, the heat receiving case 113 is released from the interposer substrate 156. To realize this, a space is provided above the interposer substrate 156 to allow the relative rotation of the heat receiving case 113.

When the heat receiving case 113 is brought upward from the interposer substrate 156, the semiconductor chip 152 is exposed. The heat receiving case 113 may be removed from the interposer substrate 156 by translating the heat receiving case 113 relative to the interposer substrate 156 so as to displace the position of the magnetic poles of the first magnet 141 away from the opposite magnetic poles of the second magnet 182, as illustrated in FIG. 29A. Due to a repulsive force between the same magnetic polarities, the first magnet 141 can be easily separated from the second magnet 182 as illustrated in FIG. 29B.

The interposer substrate 156 is removed from the circuit board 121 by heating to melt the solders 177 (see FIG. 21) connecting the interposer substrate 156 to the circuit board 121. The interposer substrate 156 with a replaced semiconductor chip 152 mounted is placed again on the circuit board 121. The process for mounting the semiconductor chip 152 on the interposer substrate 156 and the process for cooling the semiconductor chip 152 using the heat receiving case 113 are the same as those explained in Embodiment 3.

In Embodiment 4, the heat receiving case 113 and the interposer substrate 156 are provided with the magnets 141 and the magnet 182, respectively, to couple the magnets 141 and 182 with each other, and the semiconductor chip 152 can be held securely in the enclosed space by a simple structure.

Soft magnetic materials 142-144 and 174-176 are provided as shielding materials on the surfaces along the flux paths of the first magnet 141 and the second magnet 182, respectively, to prevent the magnetic fluxes from stretching out in the space. Because the soft magnetic materials 142-144 and 174-176 allow magnetic fluxes generated from the first magnet 141 and the second magnet 182 to pass easily, the magnetic fluxes concentrate on the soft magnetic materials 142-144 and 174-176. Accordingly, the leakage of magnetic fluxes generated from the first magnet 141 and the second magnet 182 can be prevented.

When the heat receiving case 113 is fixed onto the interposer substrate 156, the first magnet 141 and the second magnet 182 are attracted to each other and surrounded all around by the soft magnetic materials 142-144 and 174-176. Leakage of the magnetic fluxes generated from the first magnet 141 and the second magnet 182 can be prevented in any directions, and consequently, components and circuits arranged near the first magnet 141 and the second magnet 182 can be protected from the influence of the magnetic field.

The first magnet 141 and the second magnet 182 have magnetic pole alignment sequences with S poles and N poles arranged alternately. The magnetic pole alignment order of the first magnet 141 is reverse to that of the second magnet 182, and therefore, the heat receiving case 113 can be secured to the interposer substrate 156 under a high attractive force. Many pairs of S pole and N pole attracted to each other are aligned along the coupling surface between the first magnet 141 and the second magnet 182. Even if the heat receiving case 113 is displaced to a certain degree from the interposer substrate 156, the heat receiving case 113 is maintained at the correct position on the interposer substrate 156 because if S poles and S poles or N poles and N poles approach each other due to displacement, a repulsive force generated between the same polarities acts to restore the first and second magnets to the correct positions with S poles and N poles attracting each other. This arrangement can prevent positional shift of the heat receiving case 113 in the cooling apparatus 109.

On the other hand, when the heat receiving case 113 is displaced to such an extent that N poles and N poles or S poles and S poles face each other, the heat receiving case 113 is detached easily making use of the repulsive force acting between the first magnet 141 and the second magnet 182. The other advantages are the same as those in Embodiment 3.

Next, explanation is made of the fabrication process of the electronic device according to Embodiment 4.

The interposer substrate 156 is made of glass ceramics with a size of 80×80 mm and a thickness of 5 mm. The semiconductor chip 152 with a size of 25×25 mm is used. As the second magnet 182 of the second magnetic coupling unit 181, a ferrite magnet of 10×2.5×70 mm is used. The ferrite magnet is magnetized such that S poles and N poles align alternately at a pitch of 6 mm. The ferrite magnet is covered with permalloy soft magnetic materials 174-176 with a thickness of 1 mm except for the coupling surface with respect to the first magnetic coupling unit 135. The second magnetic coupling unit 181 is fixed to the interposer substrate 156 such that the coupling surface of the second magnet 182 is exposed upward. The magnetic pole alignment and the effect of the soft magnetic materials 174-176 are confirmed using a pair of sheets with magnetic powder between them, the details of which are described below.

The main frame 132 of the heat receiving case 113 is fabricated by forming a recess of 60×60 mm with a depth of 4 mm in the center of a copper plate of 80×80 mm with a thickness of 8 mm. Through-holes 133A and 133B are formed on the top face 132A of the main frame 132 (see FIG. 17), and copper pipes with a diameter of 3 mm are inserted in the through-holes 133A and 133B. The first magnetic coupling unit 135 is formed by a 10×5×70 mm ferrite magnet which is magnetized such that S poles and N poles align alternately at a pitch of 6 mm. The ferrite magnet is covered with permalloy soft magnetic materials 142-144 with a thickness of 1 mm, except for the coupling surface with respect to the second magnetic coupling unit 181. The first magnetic coupling unit 135 is fixed to the heat receiving case 113 by an epoxy adhesive.

The first magnetic coupling unit 135 is adhered to the side wall of the heat receiving case 113 such that the coupling surface (bottom face) aligns with the bottom edge of the main frame 132 of the heat receiving case 113. A sealing material 134 (for example, an O-ring made of a fluorine elastomer with a cross-sectional diameter of 4 mm) is fixed by an adhesive to the bottom edge of the main frame 132.

Pure water is introduced as the refrigerant and circulated by the pump 110 at a rate of 3 liter per minute in the cooling apparatus 109 assembled onto the interposer substrate 156. The semiconductor chip 152 is cooled without water leak.

The first magnet 141 may be positioned at or near a corner between two adjacent side walls 132B of the main frame 132. Alternatively, the first magnet 141 may be positioned at or near the center of the bottom portion of the side wall 132B of the main frame 132. In these cases, the second magnet 182 may be placed only at a position facing the first magnet 141.

<Modification of Embodiment 4>

Figure 30:
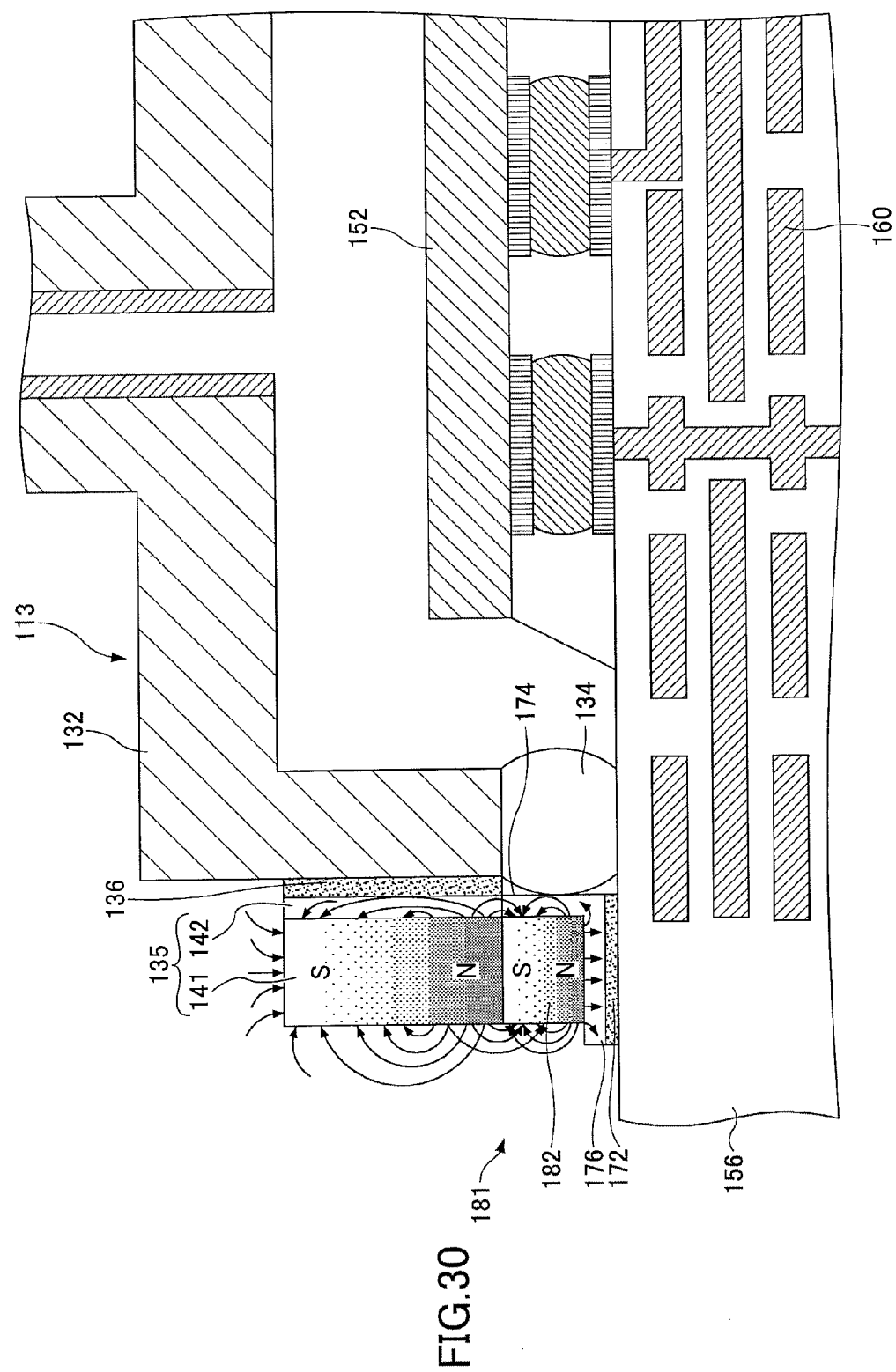
FIG. 30 illustrates another example of distribution of the magnetic flux in an electronic device according to Embodiment 4.

FIG. 30 illustrates a modification of Embodiment 4. In this modification, the first magnet 141 is covered with a soft magnetic material 142 only at the adhered surface to be fixed to the heat receiving case 113. In this example, the soft magnetic material 142 is provided so as to align with the height of the first magnet 141; however, the soft magnetic material 142 may extend over the top of the first magnet 141. The second magnet 182 is covered with soft magnetic material 174 and 176 only at the surface brought into contact with the heat receiving case 113 and the bottom face fixed to the interposer substrate 156.

In the interposer substrate 156 illustrated in FIG. 30, circuits or electric or electronic components do not exist near the first magnet 141 and the second magnet 182. It is not required to shield the magnetic fluxes stretching outside the heat receiving case 113 because there is not a concern about the influence on such components. Accordingly, in the modification, the outer surfaces (opposite to the heat receiving case 113) of the first magnet 141 of the first magnetic coupling unit 135 and the second magnet 182 of the second magnetic coupling unit 182 are not covered with soft magnetic material. Because the surfaces of the magnet 141 and 182 located at the interface with the heat receiving case 113 are covered with the soft magnetic materials 142 and 174, influence of the magnetic field on the semiconductor chip 152 can be prevented. Similarly, by providing soft magnet material 176 at the bottom face of the second magnet 182, influence of magnetic field on the electrodes or interconnects 160 of the interposer substrate 156 can be prevented.

In the modification, soft magnetic materials 142, 174 and 176 are provided to only those areas in which the circuits or components are likely to be influenced by the magnetic field. Accordingly, the entire device structure can be simplified. Although in the example illustrated in FIG. 30 soft magnetic materials 142, 174 and 176 are arranged in an L-shape in the cross-sectional view, only the inner surfaces of the first magnet 141 and the second magnet 182 (adjacent to the heat receiving case 113) may be covered with the soft magnetic material. Alternatively, the first magnet 141 and the second magnet 182 may be surrounded by the soft magnetic materials except for the coupling surfaces thereof and the top face of the first magnet 141.

In embodiments 3 and 4, a part or all of the surfaces of the first magnet 141 and the coupling material 173 (Embodiment 3) or the second magnet 182 (Embodiment 4), except for the coupling surface, are covered with soft magnetic materials. An adhesive layer may be inserted between the first magnet 141 and the coupling material 173 or the second magnet 182.

<Embodiment 5>

Figure 31A:
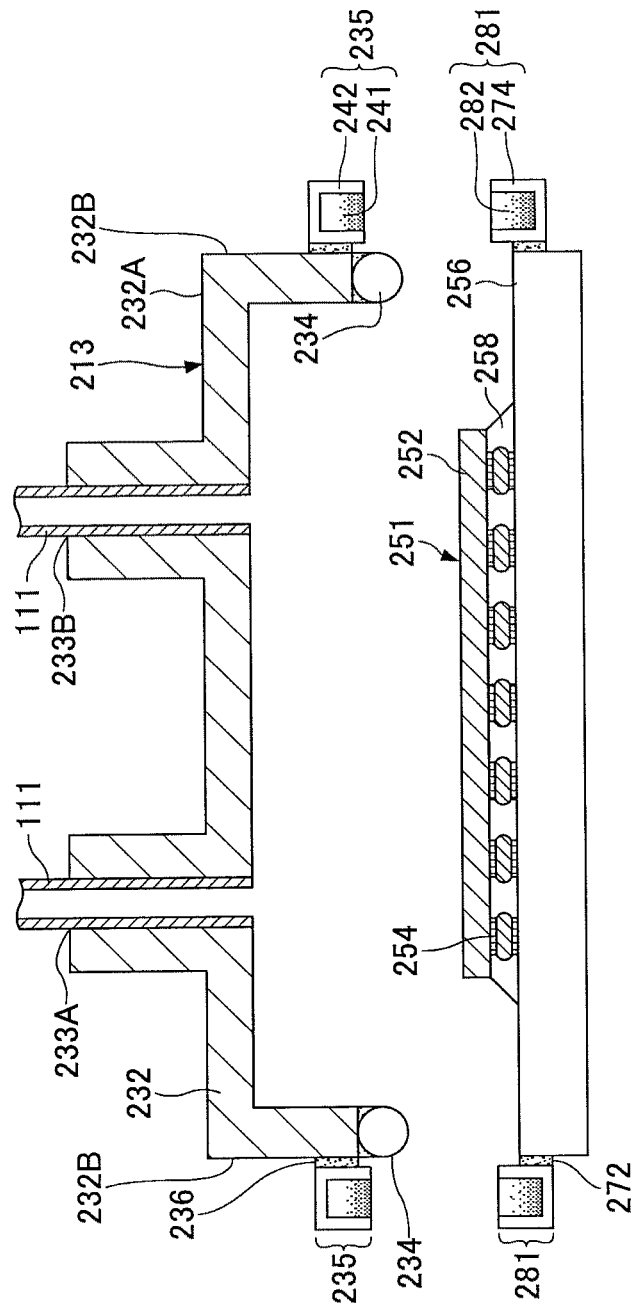
FIG. 31A illustrates an assembling process of an electronic device according to Embodiment 5.
Figure 31B:
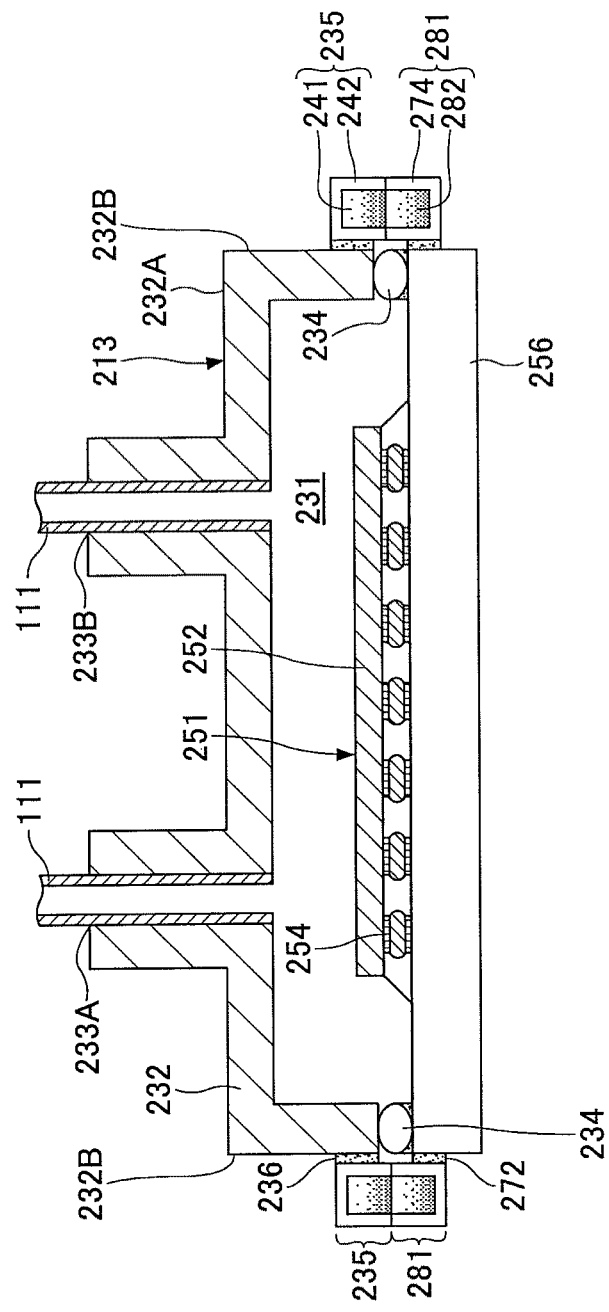
FIG. 31B illustrates an assembling process of an electronic device according to Embodiment 5.

FIG. 31A through FIG. 31C illustrate a semiconductor package mounting process according to Embodiment 5. In Embodiment 5, a semiconductor chip 252 is flip-chip bonded to an interposer substrate 256 to assemble a semiconductor package 251. The semiconductor package 251 is sealed with a heat receiving case 213 so that the semiconductor chip 252 is cooled directly, as in Embodiments 3 and 4. In Embodiment 5, a second magnetic coupling unit 281 is fixed to each of four edges of the interposer substrate 256. The first magnetic coupling unit 235, which is provided to the heat receiving case 213, and the second magnetic coupling unit 281 work together to securely hold the heat receiving case 213 onto the semiconductor package 251 to define a space for circulating a refrigerant.

As illustrated in FIG. 31A, the second magnetic coupling unit 281 is fixed to the edge of the interposer substrate 256 via an adhesive 272. The interposer substrate 256 is made of a glass ceramics with a size of 80×80 mm and a thickness of 5 mm. The semiconductor chip 252 with a size of 25×25 mm is flip-chip bonded to the interposer substrate 256 and sealed with an underfill material 258.

The second magnetic coupling unit 281 includes a second magnet 282 and a soft magnetic material 274 covering a part or all of the surfaces of the second magnet 282 except for the coupling face. The second magnet 282 is a ferrite magnet with dimensions of 10×5×70 mm magnetized such that S poles and N poles align alternately at a pitch of 6 mm. The soft magnetic material 274 is a permalloy soft magnetic material with a thickness of 1 mm. The soft magnetic material is provided on at least a surface located near electric components or circuits to be protected from the influence of the magnetic fields, except for the coupling surface to be coupled with the first magnetic coupling unit 235. In the example illustrated in FIG. 31A, all the surfaces of the second magnet 282, except for the coupling face (top face in the figure), are covered with the soft magnetic material 274. The second magnetic coupling unit 281 is fixed to the edge of the interposer substrate 256 such that the coupling face of the second magnet 282 is positioned 1.5 mm above the to face of the interposer substrate 256.

The main frame 232 of the heat receiving case 213 is fabricated by forming a recess of 60×60 mm with a depth of 4 mm in the center of a copper plate of 80×80 mm with a thickness of 8 mm. Through-holes 233A and 233B are formed on the top face 232A of the main frame 232 (see FIG. 17), and copper pipes 111 with a diameter of 3 mm are inserted in the through-holes 233A and 233B.

The first magnetic coupling unit 235 includes a first magnet 241 and a soft magnetic material 242 covering a part or all of the surfaces of the first magnet 241 except for the coupling face. The first magnet 241 is a ferrite magnet with dimensions of 10×5×70 mm magnetized such that S poles and N poles align alternately at a pitch of 6 mm. In this example, the surfaces of the first magnet 241 except for the coupling face are covered with soft magnetic material 242 made of a permalloy with a thickness of 1 mm. The first magnetic coupling unit 235 is fixed to the bottom end of the side wall 232B of the heat receiving case 213 by an epoxy adhesive 236 such that the coupling face of the first magnet is positioned 1.5 mm downward from the bottom end of the main frame 232. A sealing material 234 which is, for example, an O-ring made of a fluorine elastomer with a cross-sectional diameter of 4 mm.

Then, as illustrated in FIG. 31B, the heat receiving case 213 is positioned so as to face the interposer substrate 256 and placed on the interposer substrate 256. Since the magnetic poles of the first magnet 241 of the first magnetic coupling unit 235 are arranged alternately and the same applies to the second magnet 281 of the second magnetic coupling unit 282, magnetic poles with opposite polarities are attracted to each other. Accordingly, the heat receiving case 213 is secured to the interposer substrate 256 at the correct position even if a little positional offset is contained.

Due to the magnetic coupling between the first magnetic coupling unit 235 and the second magnetic coupling unit 281, the sealing material 234 is compressed by about 1 mm, and a sealed space 231 is created between the heat receiving case 213 and the interposer substrate 256.

Then, as illustrated in FIG. 31C, a refrigerant 205 is supplied into the circulation path including the heat receiving case 213 and the pipes 111. Pure water is circulated as the refrigerant 205 at a flow rate of 3.2 liters per minute. The semiconductor chip 252 is cooled without leakage from the sealing material 234.

Thus, in Embodiment 5, the cooling system is assembled into the semiconductor package 252 by means of magnetic coupling, while preventing influence of the magnetic flux on electric components or circuits by coving the first and second magnets 241 and 282 except for the coupling faces.

Embodiment 5 is not limited to the example illustrated in FIG. 31A through FIG. 31C. The first magnetic coupling unit 235 may be provided at or near a corner between two adjacent side walls 232B of the main frame 232, or it may be provided only at or near the center of the bottom end of the side wall 232B. In such cases, the second magnetic coupling unit 282 is provided at or near a corner, or alternatively a center of an edge of the interposer substrate 256 so as to face the first magnetic coupling unit 235.

When removing the heat receiving case 213, inlet and outlet hose pipes (not illustrated) are removed and compressed air is introduced to purse the refrigerant 205 from the heat receiving case 213. Then, a force is applied to the heating receiving case 213 in a rotating direction relative to the interposer substrate 256, as explained in conjunction with FIG. 28A and FIG. 28B. Pairs of opposed magnetic poles of the first magnet 241 of the first magnetic coupling unit 235 and the second magnet 282 of the second magnetic coupling unit 281 are uncoupled from each other, and the heat receiving case 213 is easily removed.

The first and second magnets 241 and 282 are not limited to ferrite magnets. A metal magnet, such as a neodymium ironstone, an Alnico, or a samarium-cobalt magnet may be used to achieve the same effect.

The sealing material 234 is not limited to an O-ring made of a fluorine elastomer. Any material that can be distorted in shape by coupling of the first magnet 241 and the second magnet 282 may be used. Such a material includes silicone rubber, natural rubber, and urethane rubber. The cross-sectional shape of the sealing material is not necessarily a circle, and any cross-sectional shape may be acceptable as long as the sealing material can deform when the first magnetic coupling unit 235 and the second magnetic coupling unit 281 are coupled with each other. The sealing material 234 may be fixed to the interposer substrate 256, in place of fixing it to the heat receiving case 235; or alternatively, it may be fixed to both the heat receiving case 235 and the interposer substrate 256.

Figure 32:
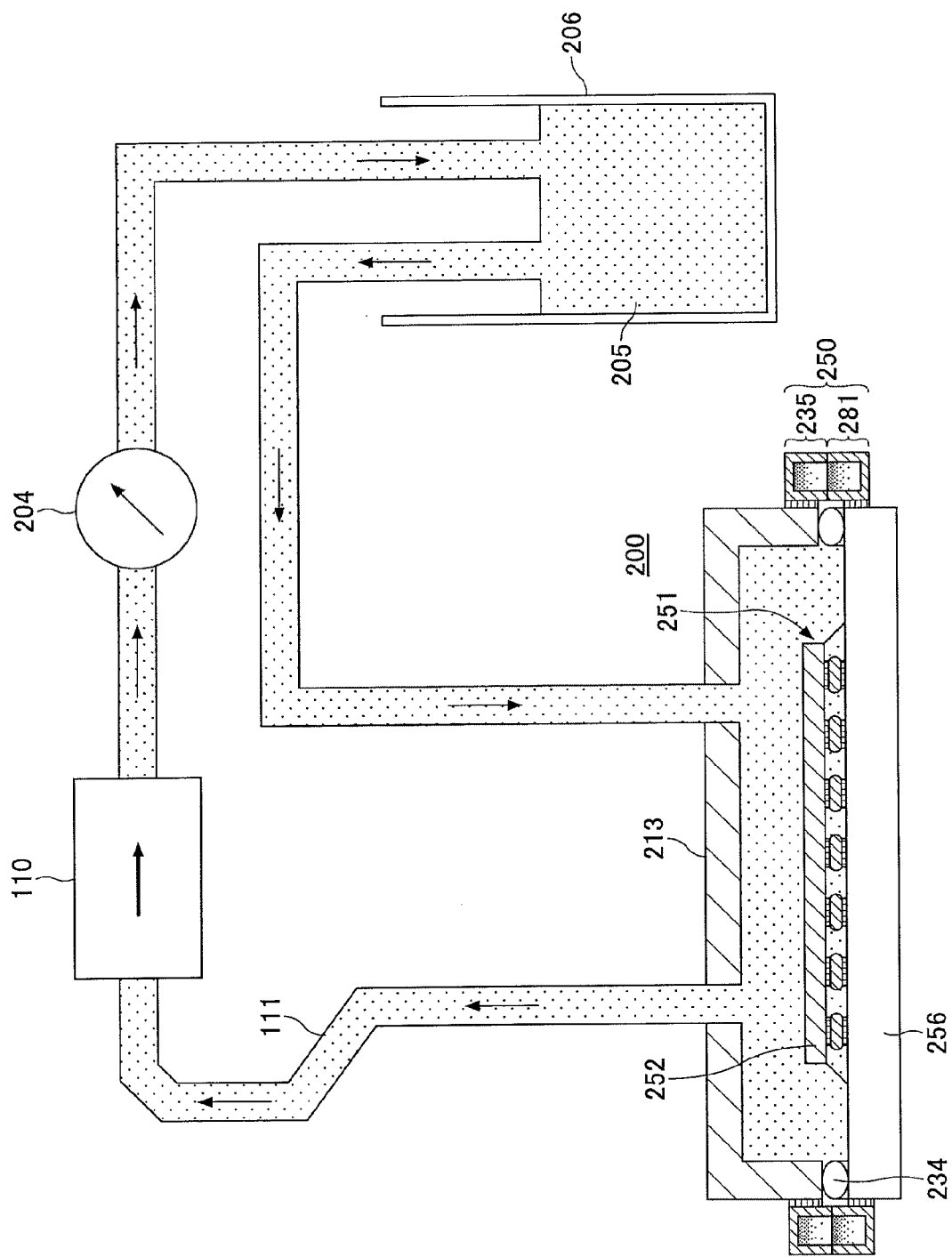
FIG. 32 illustrates an example of the cooling system of the electronic device of Embodiment 5.

FIG. 32 is a schematic diagram of a semiconductor device mounting structure 200 serving as an electronic device according to Embodiment 5. A heat receiving case 213 used as a part of a cooling system is fixed by fastening means 250 onto a semiconductor package 251 in which a semiconductor chip 252 is mounted on the interposer substrate 256. The fastening means 250 includes a first magnetic coupling unit 235 fixed to the heat receiving case 235 and a second magnetic coupling unit 291 fixed to the interposer substrate 281.

Inside of the heat receiving case 213 is an enclosed space sealed with the sealing material 234. Refrigerant 205 stored in a reservoir 206 is supplied to the heat receiving case 213 via a pump 110, a flowmeter 204, and pipes 111 to directly cool the semiconductor chip 252 that is a heat generator. Although the heat receiving case 213 is fixed to the semiconductor package 251 by the magnetic fastening means 250, influence of the magnetic flux on the semiconductor chip 252, which is an electronic component, can be prevented because of the soft magnetic materials 242 and 274 (see FIG. 31A to FIG. 31C) surrounding the first and second magnets 241 and 282. The heat receiving case 213 can be dismounted easily by simply applying a force in a direction rotating the heat receiving case 213 relative to the semiconductor package 251.

Figure 33:
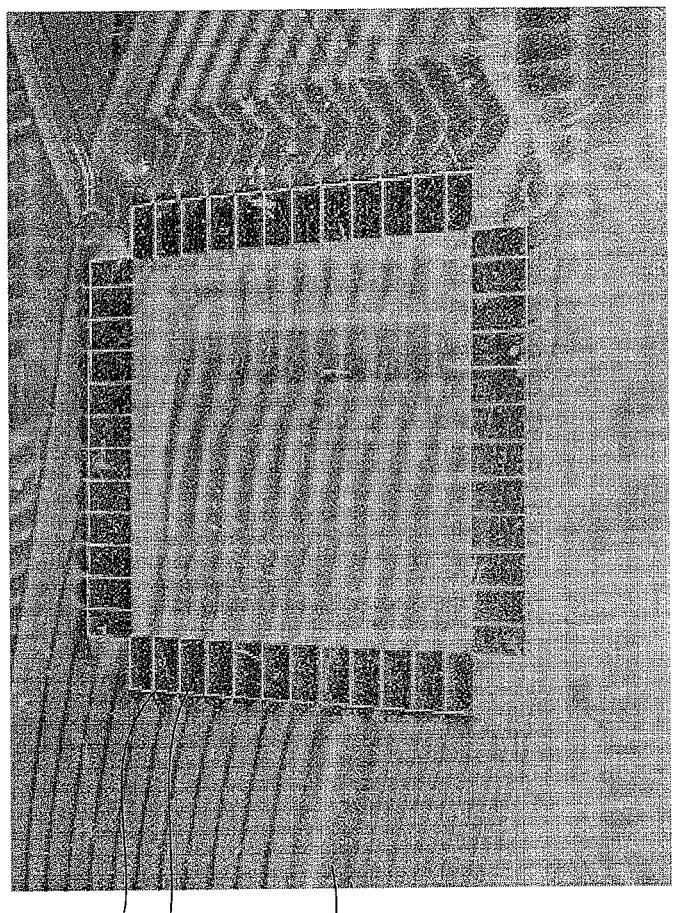
FIG. 33 illustrates a pole configuration of magnets used in the embodiments.

FIG. 33 illustrates a magnetic pole alignment sequence of the magnet used in Embodiments 1-5. When placing a magnetic field visualization sheet 301 with magnetic powder sandwiched by films onto the coupling face of the fastening means or the magnetic chuck, a pattern of S poles and N poles aligning alternately can be recognized visually. The magnetic flux confining effect of the magnetic chuck or the fastening means of the present invention is confirmed using the magnetic field visualization sheet 301.

As illustrated in FIG. 34A, a ferrite magnet 302 with dimensions of 10×5×70 mm and magnetized such that S poles and N poles are arranged alternately is prepared. When a magnetic field visualization sheet 301 is placed on the magnet 302, alignment sequence of the magnetic poles is visualized as illustrated in FIG. 34B. This is because magnetic flux is emitted from the surface of the magnet 302 and acts on the magnetic powder in the magnetic field visualization sheet 301. Thus, the state of the magnetic field can be confirmed.

Figure 35A:
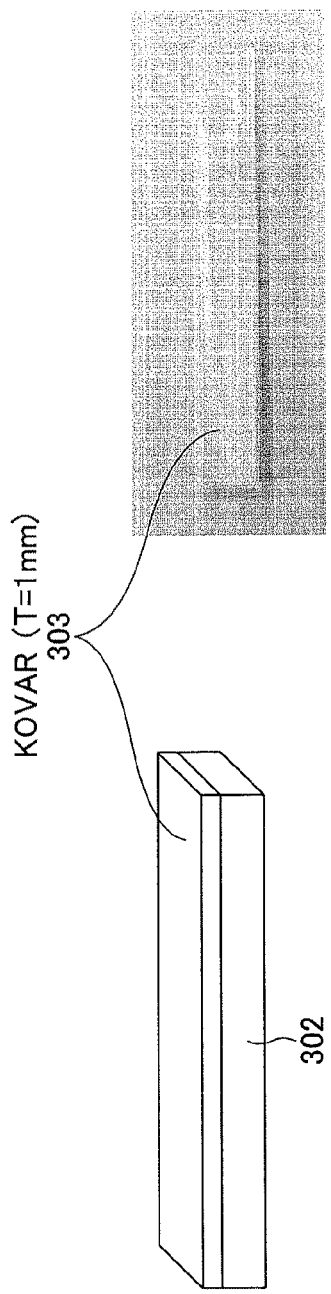
FIG. 35A illustrates a magnetic shielding effect of the housing of a soft magnetic material.
Figure 35B:
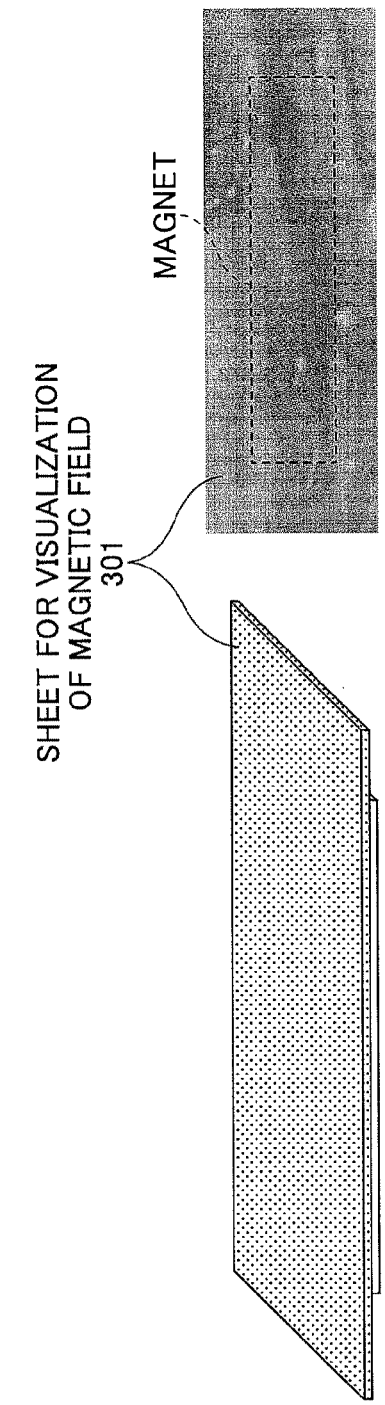
FIG. 35B illustrates a magnetic shielding effect of the housing of a soft magnetic material.

Next, as illustrated in FIG. 35A, a Kovar (registered trademark) plate (Fe—Ni—Co alloy) 303 of a soft magnetic material with a thickness of 1 mm is placed on the ferrite magnet 302. In this case, no magnetic pole alignment pattern is recognized even if the magnetic field visualization sheet 301 is placed on the Kovar plate 303, as illustrated in FIG. 35B. This means that the magnetic flux is prevented from stretching out by the Kovar plate 303, which is an example of the soft magnetic material. In this manner, influence of the magnetic field on the circumference can be reduced by covering the magnets used in the fastening means (or the magnetic chuck).

<Embodiment 6>

Figure 36A:
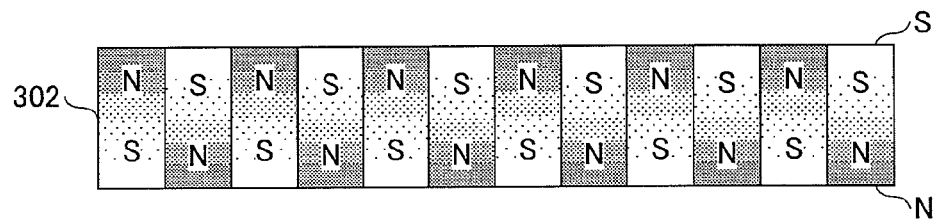
FIG. 36A illustrates a magnet to be covered with a magnetic shielding material according to Embodiment 6.
Figure 36B:
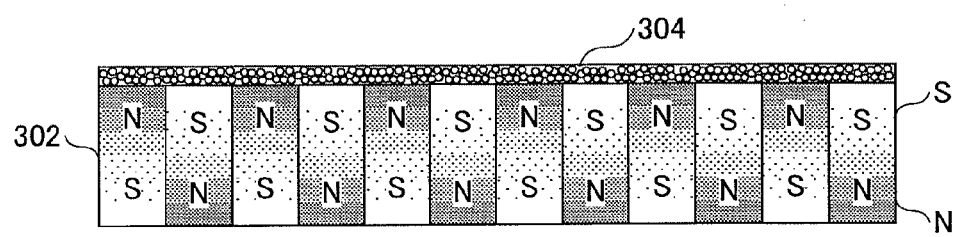
FIG. 36B illustrates a magnetic shielding material of Embodiment 6.
Figure 36C:
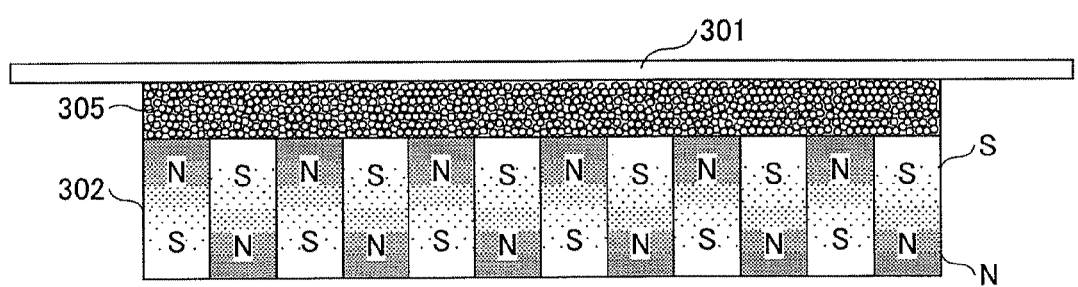
FIG. 36C illustrates a magnetic shielding material of Embodiment 6.

FIG. 36A through FIG. 36C illustrate magnetic shielding means. In Embodiment 6, a magnetic shielding material with magnetic powder mixed in a resin is used as a magnetic shield. First, a ferrite magnet 302 with dimensions of 10×5×70 mm and magnetized such that S poles and N poles align alternately is prepared as illustrated in FIG. 36A. A magnetic shielding material 304 is applied onto the ferrite magnet 302 as illustrated in FIG. 36B. The magnetic shielding material 304 is a mixture of an epoxy adhesive of 20 grams and nickel powder of 50 grams with grain diameter of 50 um. The magnetic shielding material 304 is applied in several layers up to the thickness of 6 mm to form a magnetic shielding coat 305. When a magnetic field visualization sheet 301 is placed over the magnetic shielding coat 305 as illustrated in FIG. 36C, no magnetic pole alignment pattern is observed. This means that the magnetic shielding coat 305 confines magnetic flux. In place of the nickel (Ni) powder, other soft magnetic materials may be used. In place of the epoxy adhesive, other resin or polymer, such as an acrylic adhesive, a polyimide adhesive, or gum elastic may be used to hold magnetic powder.

Figure 37:
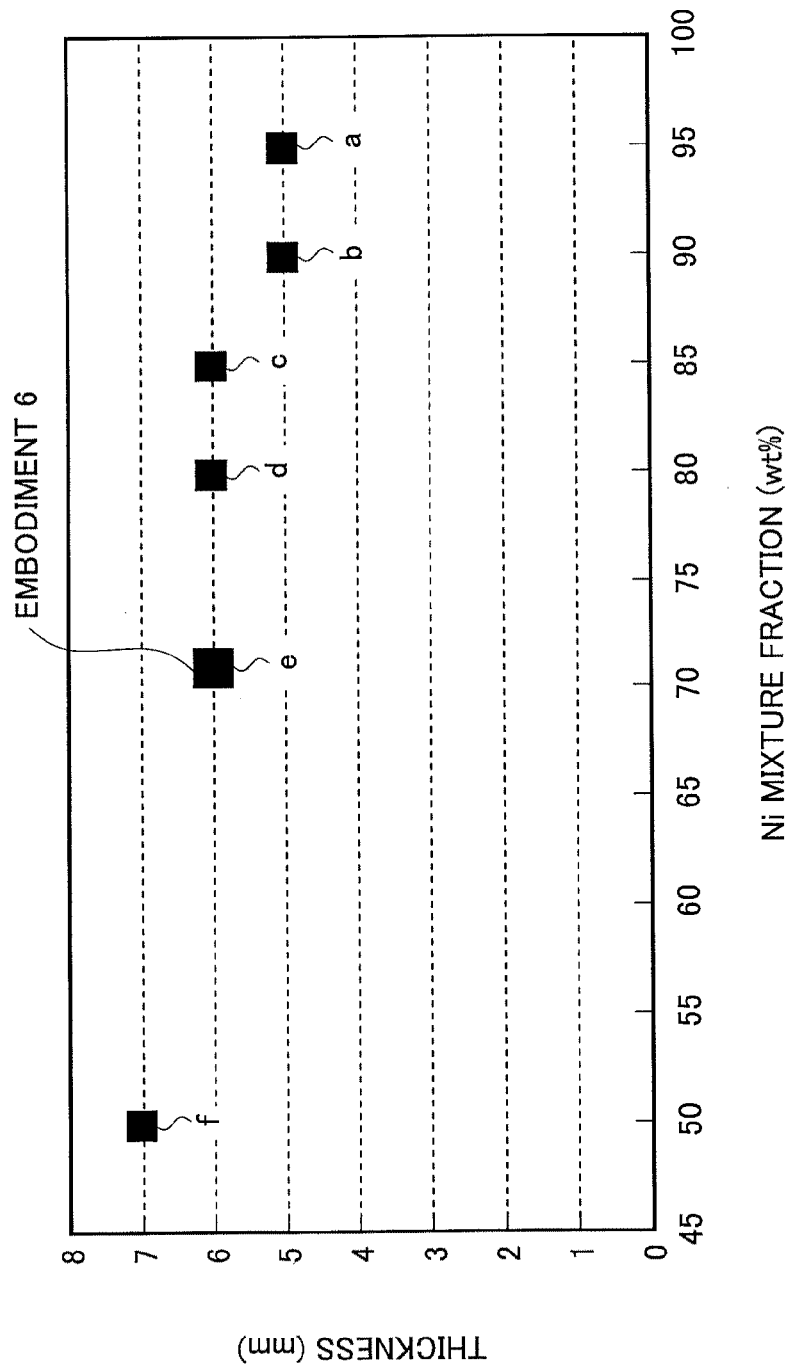
FIG. 37 is a graph plotting thickness of a magnetic shield as a function of nickel (Ni) mixture fraction.

FIG. 37 is a graph illustrating the relationship between the mixture fraction of magnetic powder (w %) and thickness of the magnetic shielding coat 305. Nickel powder is mixed in an epoxy adhesive to form a magnetic shielding plate with a thickness of 1 mm, while changing the mixture ratio as presented by conditions (a) through (f).

The fabricated magnetic shielding plates are stacked until the magnetic pole alignment pattern observed through the magnetic field visualization sheet disappears, and the number of plates (i.e., the thickness) is recorded.

| | |
|---|---|
| adhesive 5%+Ni powder 95% | (a) |
| adhesive 10%+Ni powder 90% | (b) |
| adhesive 15%+Ni powder 85% | (c) |
| adhesive 20%+Ni powder 80% | (d) |
| adhesive 29%+Ni powder 71% (magnetic fielding coat of Embodiment 6) | (e) |
| adhesive 50%+Ni powder 50% | (f) |

When the adhesive dries and becomes a plate, the Ni-mixed magnetic shielding plate is stacked over the ferrite magnet 302 of 10×5×70 mm. Every time a magnetic shielding plate is stacked, the magnetic field shielding sheet 301 is placed on the top of the plate to observe the visualization state of the magnetic field, and the total thickness of the plates at which the magnetic pole alignment pattern disappear is measured. The graph of FIG. 37 plots the pattern disappearing thickness as a function of Ni-powder mixture ratio.

Without the magnetic shielding coat 305, distribution of the magnetic field of the ferrite magnet 302 can be observed at about 7 mm away from the ferrite magnet 302. If the magnetic shielding coat 305 with 50% nickel powder contained is used, a thickness of 7 mm is required and little effect is obtained. When 70% of nickel powder is mixed, the magnetic field is not observed at a thickness of 6 mm. Above 85 weight percent of nickel powder, the thickness of the magnetic shielding coat can be reduced below 5 mm.

From the above, using a soft magnetic material, such as Kovar (registered trademark), is efficient to cover the magnets. Of course, the thickness of the soft magnetic housing material may be reduced and the housing material may be adhered to the cooling system (i.e., the heat sink or the heat receiving case) by the magnetic shielding coat 305 in which magnetic powder is mixed therein.

The present invention has been described above based upon actual examples; however, the invention is not limited to these examples, and there are many alterations, substitutions and modifications. For example, a heat generator is not limited to a semiconductor chip, but includes an arbitrary electronic component that generates heat when operating. When a magnet is used in one of the first and second magnetic coupling units, the other may includes either a magnet or a non-magnetized magnetic material. In this case, the magnet may be fixed to the cooling system, or alternatively, to the substrate (interposer substrate, or a circuit board when a bare chip is mounted). In place of a soft magnetic material used as the magnetic shielding means to allow the magnetic flux bypass and concentrate on the soft magnetic material, a diamagnetic material that blocks the magnetic flux itself may be used as the magnetic shielding material. Either an oxide permanent magnet or a metallic permanent magnet may be used as the first magnet and the second magnet. Arbitrary combinations of Embodiments 1-6 are available. For example, in the semiconductor package mounting structure of Embodiments 3-5, the semiconductor chip may be held in an enclosed space by securing the heat receiving case to the circuit board as in Embodiment 2, instead of securing the heat receiving case onto the interposer substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic device comprising:
   an electronic component mounted on a substrate;
   a cooling system for cooling the electronic component; and
   a fastening structure for fastening the cooling system to the substrate,
   wherein the fastening structure includes
   a first magnet provided to one of the substrate and the cooling system,
   a second magnetic material fixed to the other of the substrate and the cooling system and magnetically coupled with the first magnet, and
   a magnetic shield that covers a part or all of the first magnet except for a coupling face to be coupled with the second magnetic material.

2. The electronic device according to claim 1, wherein the first magnet has S poles and N poles arranged alternately along a plane parallel to a major surface of the substrate.

3. The electronic device according to claim 2, wherein the second magnetic material is a second magnet that has N poles and S poles arranged alternately in a reverse alignment order to the first magnet.

4. The electronic device according to claim 3, wherein the magnetic shield covers a part or all of the surfaces of the second magnet, except for a coupling surface to be coupled with the first magnet.

5. The electronic device according to claim 1, wherein the magnetic shield is provided along a magnetic flux path extending between magnetic poles of the first magnet.

6. The electronic device according to claim 1, wherein the magnetic shield is a housing member made of a soft magnetic material accommodating the first magnet with the coupling face exposed.

7. The electronic device according to claim 1, wherein the magnetic shield is a magnetic shielding coat with magnetic powder mixed in an adhesive.

8. The electronic device according to claim 7, wherein the magnetic powder is soft magnetic powder, and a mixture ratio of the soft magnetic powder is more than 50 weight percent.

9. The electronic device according to claim 1, wherein the first magnet is formed by multiple blocks of permanent magnets arranged at a constant pitch such that directions of magnetic poles are alternating.

10. The electronic device according to claim 1, wherein the first magnet is an oxide magnet magnetized such that opposite magnetic polarities align alternately.

11. The electronic device according to claim 1, wherein the second magnetic material is a second magnet, and the first magnet has a single magnetic polarity on the coupling face, while the second magnet has a single magnetic polarity opposite to that of the first magnet on the coupling face.

12. The electronic device according to claim 1, further comprising:
   a sealing material that seals the cooling system against the substrate to hold the electronic component securely.

13. The electronic device according to claim 1, wherein the cooling system includes
   a heat receiving case secured to the substrate and sealing the electronic component in an enclosed space, and
   a pipe for supplying a refrigerant into the enclosed space of the heat receiving case.

14. The electronic device according to claim 13, wherein the first magnet is fixed to a sidewall of the heat receiving case.

15. The electronic device according to claim 13, further comprising:
   a sealing material provided between the heat receiving case and the substrate.

16. The electronic device according to claim 15, wherein the sealing material is provided inside the fastening structure.

17. The electronic device according to claim 15, wherein the sealing material deforms when the first magnet and the second magnetic material are magnetically coupled with each other and seals the heat receiving case with respect to the substrate.

18. The electronic device according to claim 1, wherein the cooling system includes a cooling fin fixed to a surface of the electronic component opposite to a mounting face thereof to be connected to the substrate.

* * * * *